(12) United States Patent
Ishikawa et al.

(10) Patent No.: US 7,015,488 B2
(45) Date of Patent: Mar. 21, 2006

(54) EXPOSURE HEAD, EXPOSURE APPARATUS, AND APPLICATION THEREOF

(75) Inventors: Hiromi Ishikawa, Kanagawa (JP); Kazuhiko Nagano, Kanagawa (JP); Yoji Okazaki, Kanagawa (JP); Takeshi Fujii, Kanagawa (JP); Hiromitsu Yamakawa, Saitama-ken (JP)

(73) Assignees: Fuji Photo Film Co., Ltd., Kanagawa (JP); Fuji Photo Optical Co., Ltd., Saitama-ken (JP)

( * ) Notice: Subject to any disclaimer, the term of this patent is extended or adjusted under 35 U.S.C. 154(b) by 7 days.

(21) Appl. No.: 11/104,561

(22) Filed: Apr. 13, 2005

(65) Prior Publication Data

US 2005/0180692 A1    Aug. 18, 2005

Related U.S. Application Data

(62) Division of application No. 10/409,686, filed on Apr. 9, 2003, now Pat. No. 6,894,712.

(30) Foreign Application Priority Data

| Apr. 10, 2002 | (JP) | ............................ 2002-108554 |
| May 23, 2002 | (JP) | ............................ 2002-149884 |
| May 23, 2002 | (JP) | ............................ 2002-149885 |
| May 23, 2002 | (JP) | ............................ 2002-149886 |
| Jul. 8, 2002 | (JP) | ............................ 2002-199091 |
| Jul. 8, 2002 | (JP) | ............................ 2002-199092 |

(51) Int. Cl.
  *D06L 3/04* (2006.01)
  *D06L 3/12* (2006.01)
(52) U.S. Cl. ............................ 250/492.1; 250/494.1; 8/103
(58) Field of Classification Search ................ 347/224, 347/233, 238
   See application file for complete search history.

(56) References Cited

U.S. PATENT DOCUMENTS

| 4,575,330 A | | 3/1986 | Hull |
| 5,699,589 A | * | 12/1997 | Ripley et al. ................. 19/200 |
| 5,766,266 A | * | 6/1998 | Ripley et al. ................. 8/103 |
| 6,832,045 B1 | | 12/2004 | Nakaya et al. |

FOREIGN PATENT DOCUMENTS

| JP | 59-214734 A | 12/1984 |
| JP | 61-117552 A | 6/1986 |
| JP | 62-2617 A | 1/1987 |

(Continued)

*Primary Examiner*—Huan Tran
(74) *Attorney, Agent, or Firm*—Sughrue Mion, PLLC

(57) ABSTRACT

In an exposure apparatus of the invention, for a spatial light modulator, each of a plurality of pixel portions fewer than the total number of the pixel portions is controlled with a control signal generated according to exposure information. Namely, a part of the pixel portions is controlled without controlling a whole of the pixel portions on the substrate. Thus, the number of pixels in the pixel portions is decreased, and transfer time of the control signal becomes short. This enables modulation speed of the laser beam to be increased and the high-speed exposure to be performed. An incorporated laser light source, in which the laser beams are incorporated and struck on the optical fiber, is preferable to the laser device. By adopting the incorporated laser light source, high brightness and high output can be obtained, and it is preferable to the exposure of the spatial light modulator. Since the fiber array is obtained with few optical fibers, it is low cost. Since the number of optical fibers is few, the light-emitting region is further decreased when the optical fibers are arrayed.

4 Claims, 44 Drawing Sheets

FOREIGN PATENT DOCUMENTS

| | | |
|---|---|---|
| JP | 62-35966 A | 2/1987 |
| JP | 4-99618 A | 3/1992 |
| JP | 4-306606 A | 10/1992 |
| JP | 7-282463 A | 10/1995 |
| JP | 8-43207 A | 2/1996 |
| JP | 8-108481 A | 4/1996 |
| JP | 8-300490 A | 11/1996 |
| JP | 9-179309 A | 7/1997 |
| JP | 11-43861 | 2/1999 |
| JP | 11-43861 A | 2/1999 |
| JP | 11-138645 | 5/1999 |
| JP | 11-282172 A | 10/1999 |
| JP | 2000-155377 | 6/2000 |
| JP | 2001-252897 A | 9/2001 |

* cited by examiner

N COLUMNS

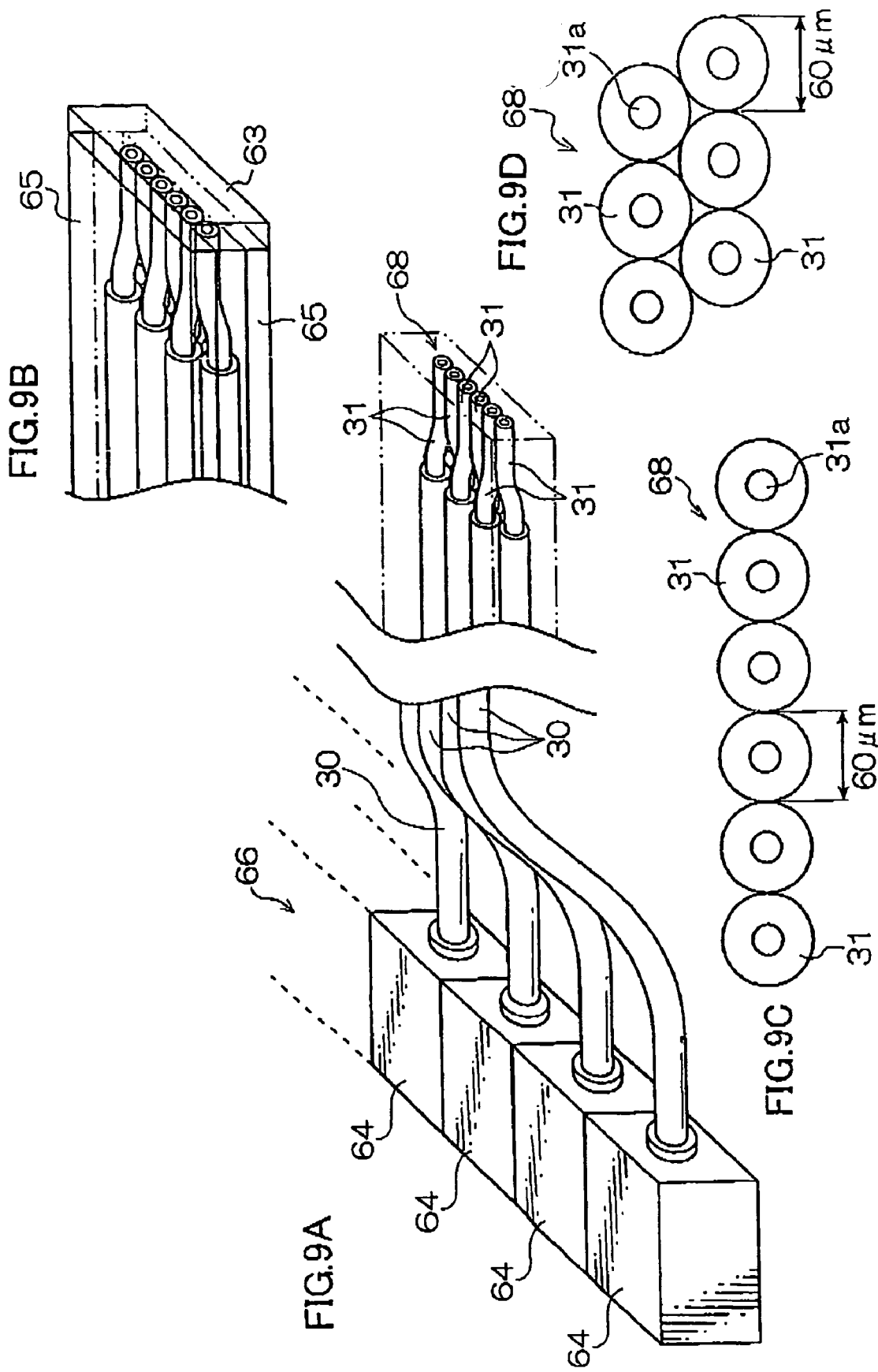

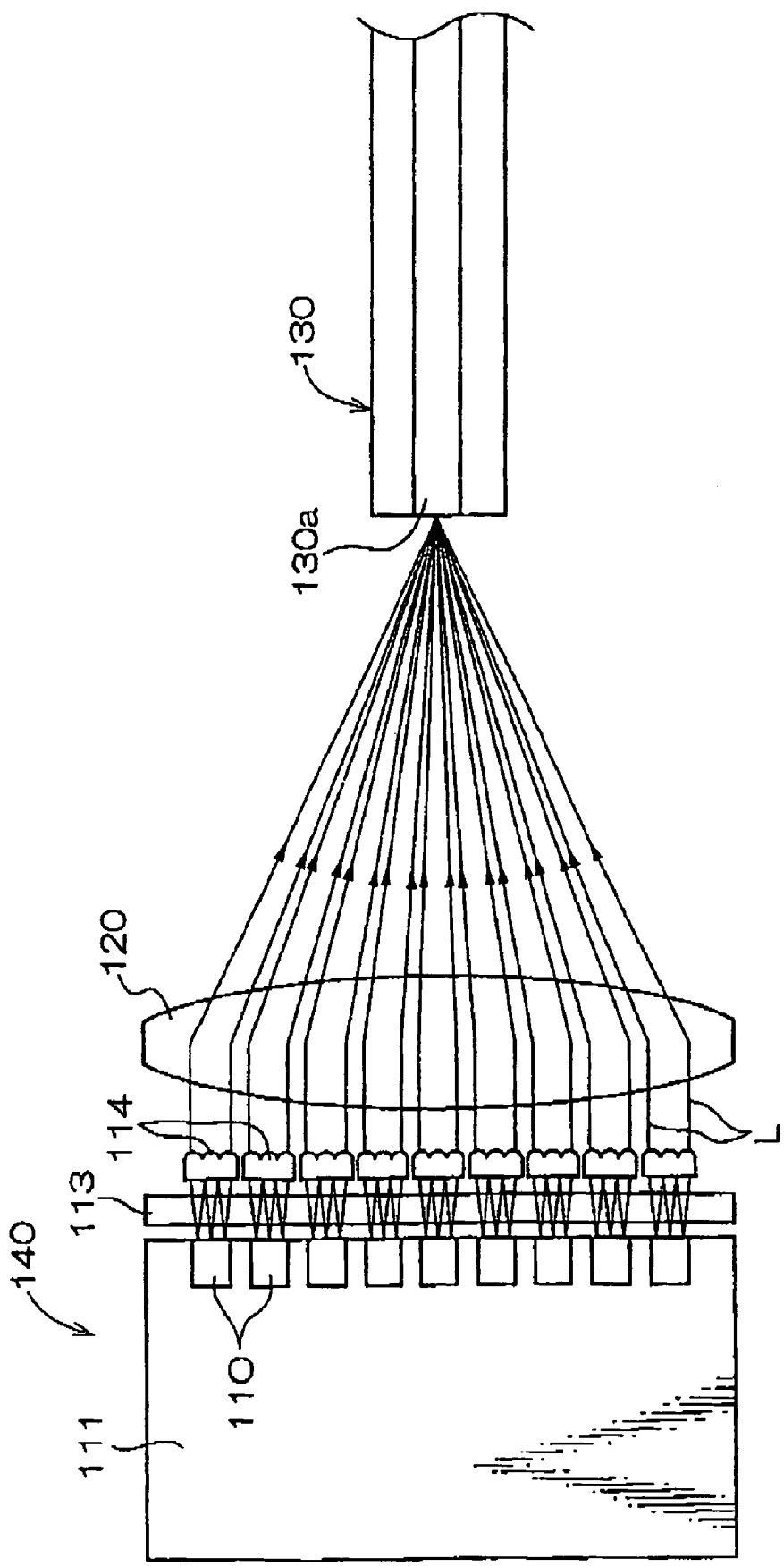

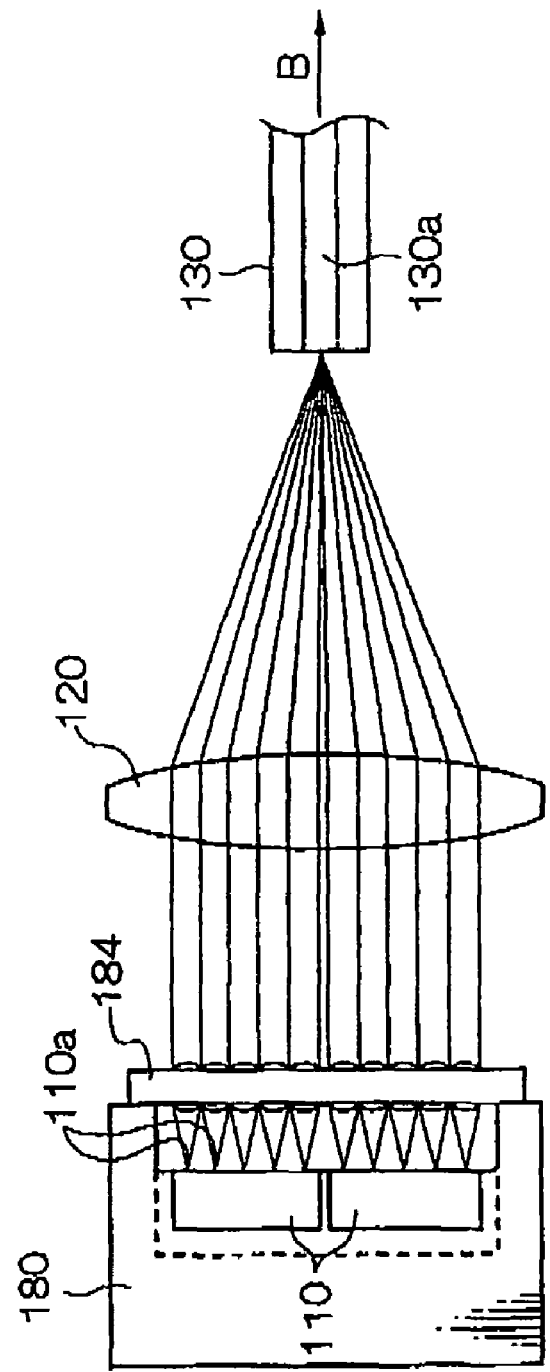
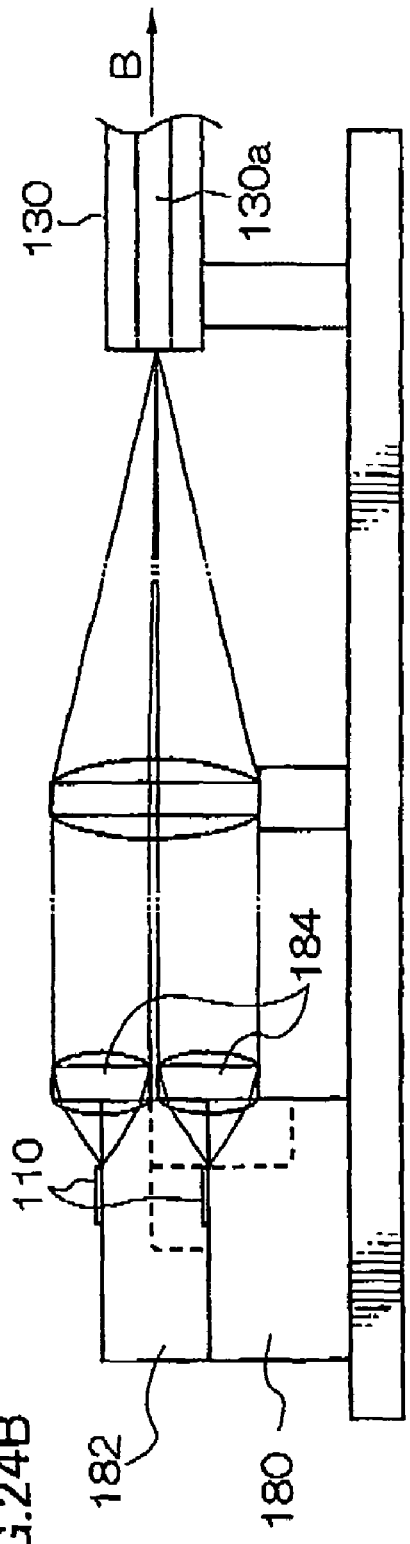
FIG.24A
FIG.24B

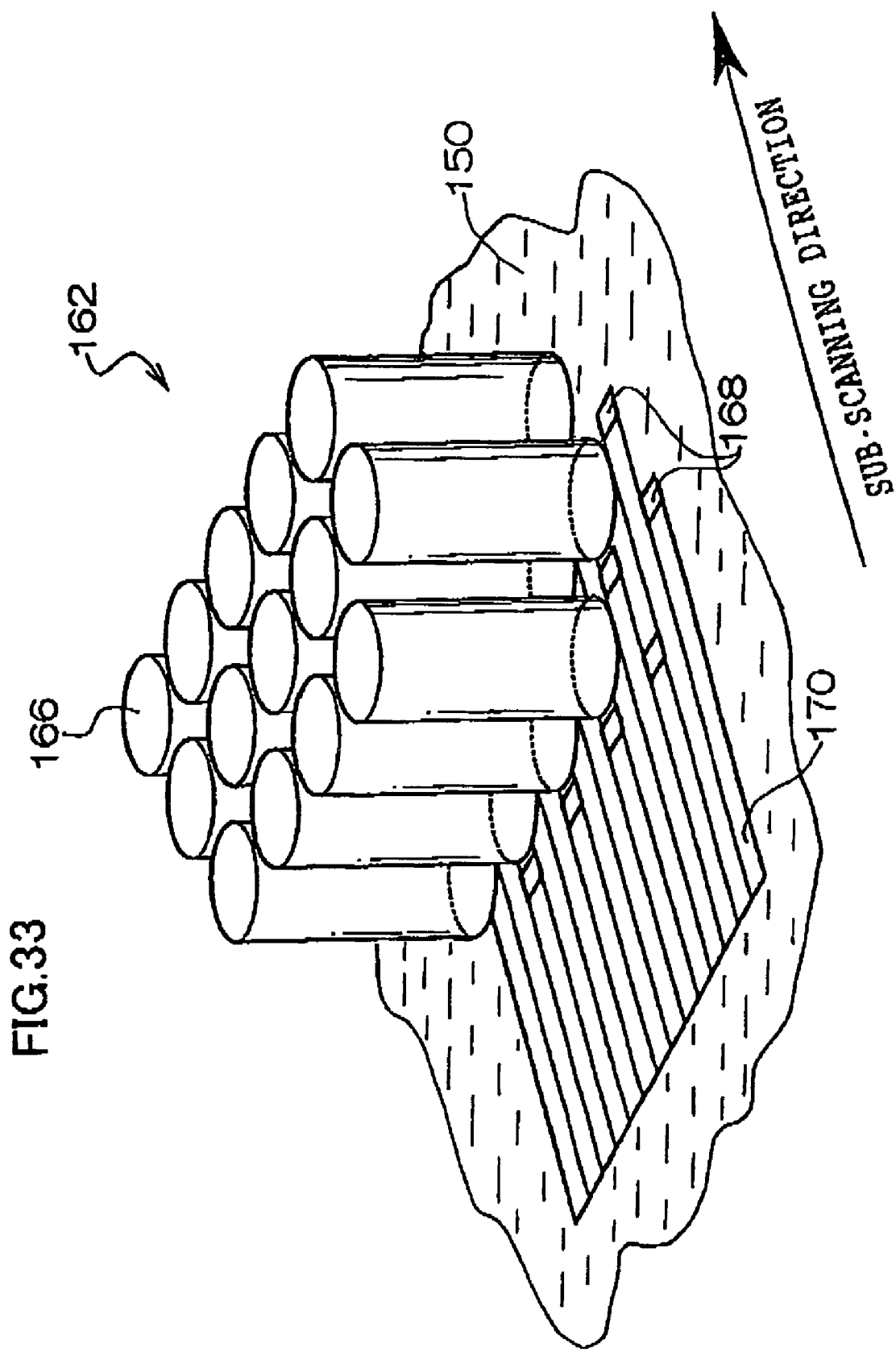

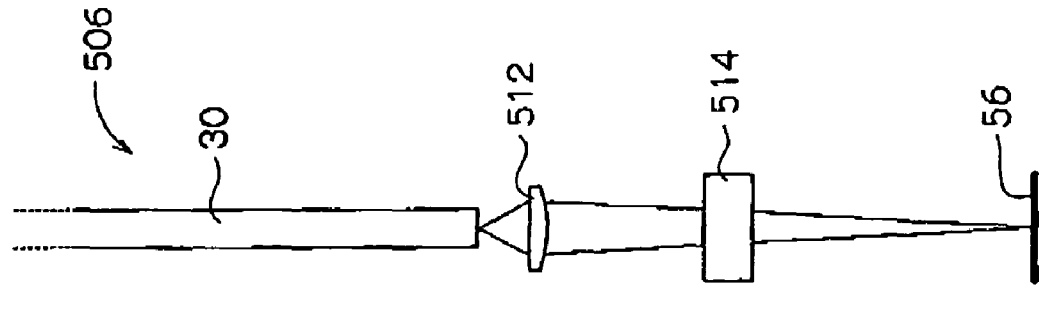
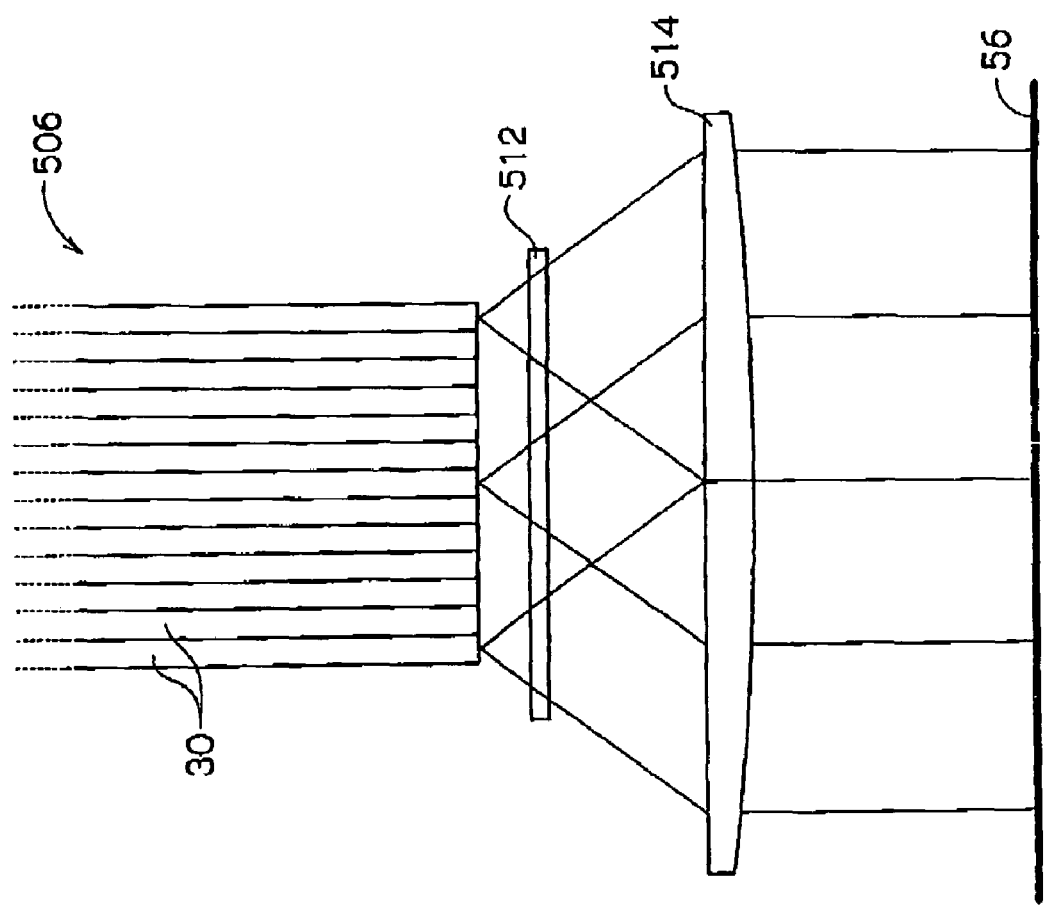

EXPOSURE HEAD, EXPOSURE APPARATUS, AND APPLICATION THEREOF

This is a divisional of application Ser. No. 10/409,686 filed Apr. 9, 2003, now U.S. Pat. No. 6,894,712.

BACKGROUND OF THE INVENTION

1. Field of the Invention

The present invention relates to an exposure head, an exposure apparatus, and application thereof, particularly relates to the exposure head which exposes a photosensitive material with a light beam modulated by a spatial light modulator according to image information, the exposure apparatus which inludes the exposure head, and a rapid prototyping apparatus, a stacking rapid prototyping apparatus, and a bleaching apparatus to which the exposure apparatus is applied, and a forming method of a micro channel which utilizes the exposure apparatus.

2. Description of the Related Art

Conventionally, there has been proposed various kinds of the exposure apparatus which performs an image exposure with the light beam modulated according to the image data, utilizing the spatial light modulator such as a digital micromirror device (DMD).

For example, DMD is a mirror device in which many micro-mirrors whose reflection plane angle is changeable according to a control signal are two-dimensionally arranged on a semiconductor substrate such as silicon, as shown in FIG. 15A, the exposure apparatus using DMD includes a light source 1 which applies a laser beam, a lens system 2 which collimates the laser beam emitted from the light source 1, DMD 3 which is arranged at an almost focal point of the lens system 2, and lens systems 4 and 6 which focuses the laser beam reflected with DMD 3 on a scanning surface 5.

In the above-described exposure apparatus, each of micro-mirrors in DMD 3 is on and off-controlled to modulate the laser beam by a control device which is not shown with a control signal generated according to the image data or the like, the image exposure is performed with the modulated laser beam.

However, DMD which is usually used is formed in such a manner that about 800 micro-mirrors in a main direction and about 600 micro-mirrors in a sub-scanning direction are two-dimensionally arranged on the substrate, it takes 10 to 200 μsec to modulate the laser beam by one micro-mirror corresponding to one pixel.

Therefore, for example, in the case that plural exposure heads arranged in the main direction is continuously moved in the sub-scanning direction, the modulation is performed at 200 μsec per one main scanning line, while the exposure head is moved by 2 μm in the sub-scanning direction, it takes about 50 seconds to expose an area of 50 mm². That is to say, there is a problem that modulation speed of DMD is slow, so that it is difficult to perform the high-speed exposure in the exposure head using DMD as the spatial light modulator.

The invention has been done in order to solve the above-described problem, it is a first object of the invention to provide the exposure head and the exposure apparatus, in which the modulation speed of the spatial light modulator is increased and the high-speed exposure can be performed.

In recent years, as three-dimensional CAD (Computer Aided Design) system is widely spread, the rapid prototyping system is being utilized. The rapid prototyping system shapes a three-dimensional model in such a manner that a three-dimensional shape is formed in a virtual space on a computer with the three-dimensional CAD and the three-dimensional model is shaped on the basis of CAD data by exposing a photo-curable resin with the light beam. In the rapid prototyping system, on the computer, CAD data is sliced at a given interval to generate a plurality of section data, a surface of the liquid photo-curable resin is scanned on the basis of each section data with the laser beam and cured in laminar, the cured resin layer is stacked in order to shape the three-dimensional model. In the rapid prototyping method, a free liquid surface method is widely known, in which the photo-curable resin is reserved in an open-top type of tank, while a shaping table arranged near the liquid surface of the photo-curable resin is sequential descended from a free liquid surface, the cured resin layer is stacked.

Conventionally, in the rapid prototyping apparatus used for this rapid prototyping system, as described in "HIKARI-ZOUKEI SISUTEMU NO KISO, GENJOU, MONDAITEN, KATAGIJUTU" MARUYA, Yoji, Vol. 7, No. 10, pp. 18–23 (1992), there are the rapid prototyping apparatus adopting a laser plotter method scanning and the rapid prototyping apparatus adopting movable mirror method scanning.

FIG. 30 shows the rapid prototyping apparatus adopting the laser plotter method. In the apparatus, the laser beam oscillated from a laser light source 250 passes an optical fiber 254 including a shutter 252 and reaches an XY plotter 256, and the laser beam is applied from the XY plotter 256 to a liquid surface 266 of a photo-curable resin 262 in a vessel 260. Positions in an X-direction and a Y-direction of the XY plotter 256 are controlled with an XY positioning mechanism 258 including an X-positioning mechanism 258a and a Y-positioning mechanism 258b. Accordingly, while the XY plotter 256 is moved in the X-direction and Y-direction, the laser beam applied from the XY plotter 256 with the shutter 252 is on and off-controlled according to the section data, which allows the photo-curable resin 262 in a given portion of the liquid surface 266 to be cured.

However, in the rapid prototyping apparatus adopting the laser plotter method, there is the problem that shutter speed and moving speed of the plotter are limited and plenty time is required for the shaping.

FIG. 31 shows the rapid prototyping apparatus of the movable mirror method using a conventional galvanometer mirror. In the apparatus, the laser beam 270 is reflected with an X-axis rotating mirror 272 and a Y-axis rotating mirror 274 to be applied to the photo-curable resin 262. The X-axis rotating mirror 272 controls an irradiating position in the X-direction by rotating about a Z-axis, and the Y-axis rotating mirror 274 controls the irradiating position in the Y-direction by rotating about the X-axis. In the movable mirror method, the scanning speed can be increased compared with the laser plotter method.

However, in the rapid prototyping apparatus adopting the movable mirror method, since the scanning is performed with a micro laser spot, the shaping requires for long hours, for example, even in the case that the fast scanning of 2 to 12 m/s is peformed, it takes 8 to 24 hours to shape the three-dimensional model of about 10 centimeter cubic. The irradiation area of the laser beam 270 is limited, because the laser beam 270 is only reflected when the laser beam 270 is incident to the Y-axis rotating mirror 274 at a given range of the incident angle. In order to extend the irradiation range, when the Y-axis rotating mirror 274 is arranged at a higher position where the Y-axis rotating mirror 274 is far away from the photo-curable resin 262, there is the problem that a diameter of the laser spot is increased, positioning accuracy is worsened, and shaping accuracy is decreased. When rotating angle of the Y-axis rotating mirror 274 is increased, though the irradiation area is enlarged, the positioning accuracy is worsened in similar way, and a pin cushion error is increased. Furthermore, in the rapid prototyping apparatus using the galvanometer mirror, there is the problem that adjustment of the optical system is complicated and upsizing of the apparatus occurs because of the complicated optical system.

In rapid prototyping apparatuses of both methods, an ultraviolet laser beam having high output is used as the laser beam. In the related art, a gas laser such as an argon gas laser or a solid state laser generated by THG (Third Harmonic Wave) is usually used. However, in the gas laser, maintenance such as tube exchange is troublesome, incidental facilities such as cooling chiller which is expensive and raises the price of the rapid prototyping apparatus are required, and the apparatus is upsized. THG solid state gas laser is pulse operation of Q switch, repeating speed is slow and it is improper for the high-speed exposure. Since THG light is used, wavelength transformation efficiency is bad and high output is impossible. In addition, high output laser must be used as the exciting laser diode, it is very high cost.

In order to solve the problem, in Japanese Patent Application Laid-Open (JP-A) No. 11-138645, there is proposed the rapid prototyping apparatus in which a plurality of light sources which can irradiates the exposure region with larger spot size than single pixel are provided and the pixel is multi-exposed with the plurality of light sources. In the apparatus, since the pixel is exposed in multiple with the plurality of light sources, the output of each light source may be small, which enables cheap light emitting diode (LED) to use as the light source.

However, in the rapid prototyping apparatus described in JP-A No. 11-138645, there is the problem that, since the spot size of each light source is larger than the single pixel, the apparatus can not be used for the fine shaping, and, since the pixel is exposed in multiple with the plurality of light sources, there are many needless operations and the shaping requires long hours. Also, there is the problem that the exposure portion is upsized by increasing the number of light sources. Further, there is a fear that sufficient resolution is not obtained even if the multiple exposures are performed by the output light intensity (quantity of LED.

The invention has been done in order to solve the above-described problem, and it is a second object of the invention to provide the rapid prototyping apparatus which can perform the high-speed shaping. It is a third object of the invention to provide the rapid prototyping apparatus which can perform the fine shaping.

A powder sintering-stacking rapid prototyping apparatus is known as the rapid prototyping system which is developed after the stacking rapid prototyping apparatus using the photo-curable resin and widely used currently. In the powder sintering-stacking rapid prototyping apparatus, the surface of the powder body is scanned with the laser beam on the basis of the section data of the three-dimensional model which is generated on the computer. The powder body is cured in such a manner that the powder body is sequentially melted and sintered with the scanning of the laser beam, and the curing process is repeated. The three-dimensional model including the stacked sintered body is shaped by repeating the process.

In the stacking rapid prototyping apparatus adopting the sintering, there is an advantage that various kinds of materials can be selected, not only a ductile functional evaluation model or a precise casting pattern and a matrix but also a metal mold or a metallic part can be directly produced, and application field is wide. Further, in the stacking rapid prototyping apparatus, the apparatus price is moderate compared with the rapid prototyping apparatus, and forming speed is relatively fast, so that the application is fixing for confirmation of a design model.

However, even in the stacking rapid prototyping apparatus adopting the sintering, the movable mirror method such as the galvanometer mirror is adopted, and the gas laser such as $CO_2$ laser (wavelength is 10.6 $\mu$m) and the solid state laser such as YAG laser (wavelength is 1.06 $\mu$m), which output the infrared having the high output power, are used as the light source. Therefore, the same problem as that of the above-desribed rapid prototyping apparatus occurs when these units is used. Since the beam spot is large, the resolution is low. Further, since the light source is long wavelength, a spread angle of the beam is large, so that sufficient focal depth can not be obtained.

The invention has been done in order to solve the above-described problem, and it is a fourth object of the invention to provide the rapid prototyping apparatus which can perform the high-speed shaping. It is a fifth object of the invention to provide the rapid prototyping apparatus which can perform the fine shaping.

Recently, a device technology called "lob on chip" (Laboratory on Chip), in which a system performing mixing, reaction, separation, and detection of a solution is integrated on a glass plate of several centimeters square, is actively investigated by adopting a micromachining technology. The lob on chip is also called as micro TAS (Micro Total Analysis System), micro reactor, or the like according to the integrated system.

Usually the lob on chip includes the micro channel whose channel width ranges from several tens $\mu$m to several hundreds $\mu$m, which is formed in the substrate having a thickness of about 1 mm. The mixing of the solution and the like is performed in the micro channel. Since relative area is enlarged in the micro channel, the mixing or reaction of the solution can be efficiently performed such that the solutions which hardly react with each other can react by a size effect and the solutions which are hardly mixed with each other can be mixed. By setting the channel width of the micro channel to the range form 10 $\mu$m to 50 $\mu$m, channel resistance can be relatively decreased and the good size effect can be obtained. Since the shape of the micro channel influences solution delivery characteristics, it is preferable that the micro channel has smooth wall surface and is produced finely.

Conventionally, the micro channel of the lob on chip is formed with a semiconductor processing technique such that the surface of the substrate is coated with a resist film, the resist film is patterned by photolithography with ultraviolet ray or electron beam, and then the substrate is etched by using the patterned resist film as a mask. The photolithography is performed with a contact aligner which is used in the semiconductor manufacturing process. Its exposure method is an analog exposure method which uses a mask aligner, for example, it is difficult to perform the fast exposure of a large area of 1 square meter.

In the forming method of the micro channel of the related art, since the patterning is performed with the mask exposure, there is the problem that the thickness of the photoresist film is limited, and it is difficult to finely form the micro channel. That is to say, when the photoresist film is thin, the photoresist film is easily side-etched in etching the substrate, preparation accuracy of the channel width is decreased, and sufficient channel depth can not be achieved.

In the mask exposure, since a precise glass mask or the like is required in each pattern, there is the product that cost is increased, it is difficult to enlarge the area, and it is not prefer to limited production of a wide variety of products.

On the other hand, though it is thought that the photolithography process is performed with a digital exposure method, the conventional digital exposure apparatus using the ultraviolet ray performs scanning exposure with the single beam, so that the exposure time is too long. In particular, in the case of the fine exposure in which the beam diameter is not more than 10 μm and addressability is about 1 μm, there is the problem that the exposure time is too long.

The invention has been done in order to solve the above-described problem, and it is a sixth object of the invention to provide the forming method of the micro channel which can finely form the micro channel at high speed. It is a seventh object of the invention to provide the forming method of the micro channel which can form the micro channel having an arbitrary pattern at low cost.

In dyeing of cloth product, bleaching in which color substance included in the cloth is dissolved and removed with oxidation or reduction treatment is performed prior to the dyeing. Though the color substance includes a conjugated double bond involving coloring in its structure, the conjugated system of the color substance is broken by the oxidation or reduction treatment, as a result, the cloth is bleached. A chlorine bleaching agent such as sodium hypochlorite, hydrogen peroxide, and the like are used as an oxidation bleaching agent. Hydrosulfite and the like are used as a reduction bleaching agent.

Conventionally, the above-described bleaching is usually performed by boiling the cloth product for long time in a water solution containing the dense bleaching agent, however, there is the problem that it is necessary that the water having large heat capacity is heated to near the boiling point, the energy efficiency is bad, embrittlement and hardening of the cloth, which are caused by interaction between the heat and the chemicals, are generated.

In recent years, research on the bleaching technique which does not use the chlorine bleaching agent having a large load to the environment is actively being done. For example, in JP-A No. 11-43861, there is disclosed a technique in which cotton cloth impregnated with sodium boron hydroxide is pulse-irradiated with the ultraviolet laser to bleach. Though reduction power of the sodium boron hydroxide, which is used as the bleaching agent, is weak, the color substance is activated with the laser irradiation to react easily with the bleaching agent. According to this technique, not only the bleaching can be performed without using the chlorine bleaching agent, but also the bleaching can be performed at lower temperature, so that the processing time can be reduced. Due to the bleaching at lower temperature, damage of the cloth is also reduced.

In the bleaching method, the laser device having the high energy density is required, and excimer laser which can obtain the high output in the ultraviolet region is used. Since the output of the laser diode which oscillates in the ultraviolet wave range is generaly small, when the laser diode is used, the plurality of laser diodes are integrated and used.

However, the energy efficiency of the excimer laser is as low as only 3%, and energy consumption is increased in the bleaching method using the excimer laser, so that the bleaching method is not environment-friendly. In the excimer laser, since repeating frequency of the pulse driving is as low as 300 Hz, the productivity is low. Further, there is also the problem that life of the laser tube or the laser gas is as low as about $1 \times 10^7$ shots, the maintenance cost is high, the apparatus is upsized, high-bright laser beam is not obtained, and pulse driving is difficult for the excimer laser.

Conventionally, the laser diode which oscillates in the ultraviolet wave range has not been realized, the specific construction of the laser diode is not described in JP-A No. 11-43861. In addition, though it is difficult to manufacture the laser diode having the short wavelength with high yield, in JP-A No. 11-43861, there is no description about the specific construction in which the plurality of laser diodes which oscillates in ultraviolet wave range are integrated and the light density of 10000 mJ/cm$^2$ is realized and actually it is difficult to obtain the high output light source in which the laser diode oscillating in the ultraviolet wave range is used.

The invention has been done in order to solve the above-described problem of the related art, and it is an eighth object of the invention to provide the bleaching apparatus in which the bleaching can be performed with high energy density by applying the laser beam having the short pulse. It is a tenth object of the invention to provide the bleaching apparatus in which the energy efficiency is high and the fast and low-cost bleaching can be performed.

SUMMARY OF THE INVENTION

In order to achieve the above described first object of the present invention, there is provided an exposure head, wherein the exposure head which is relatively moved in a direction crossed at right angles with a predetermined direction for an exposure surface, which comprises a laser device which radiates a laser beam, a spatial light modulator in which many pixel portions, in which a light modulation state is changed according to each control signal, are arranged two dimensionally on a substrate and which modulates the laser beam irradiated om the laser device, control means which controls each of the plurality of pixel portions fewer than the total number of the pixel portions arranged on the substrate with the control signal generated according to exposure information, and an optical system which focuses the laser beam modulated with each pixel portion on the exposure surface.

An exposure apparatus of the invention is characterized by comprising the exposure head of the invention and moving means which relatively moves the exposure head in a direction crossed with a predetermined direction for the exposure surface. The exposure apparatus can be also formed as a multi-head type of exposure apparatus including the plurality of exposure heads.

In the exposure head and the exposure apparatus of the invention, for the spatial light modulator, each of the plurality of pixel portions fewer than the total number of the pixel portions is controlled with the control signal generated according to exposure information. That is to say, a part of the pixel portions is controlled without controlling a whole of the pixel portions arranged on the substrate. Consequently the number of pixels in the pixel portions is decreased, and transfer time of the control signal becomes short compared with the case that the control signals of the whole of the pixel portions are transferred. This enables the modulation speed of the laser beam to be increased and the high-speed exposure to be performed.

The exposure head moving is relatively moved in a direction crossed at right angles with a predetermined direction for the exposure surface, and it is preferable that the pixel portion controlled with the control means is the pixel portion which is included in a region in which a length in a direction corresponding to the predetermined direction is longer than length in a direction crossed with the predetermined direction. The number of using exposure heads can be decreased by using the pixel portion having the long region in the direction crossed with the moving direction (sub-scanning direction of the head.

In the exposure head, the laser device may include a plurality of fiber light sources which irradiates the laser beam incident from an incident end of the optical fiber from an outgoing end of the optical fiber, and includes a fiber array light source in which each light-emitting point at the outgoing end of the plurality of fiber light source is arranged in the shape of an array or a bundle light source in which each light-emitting point at the outgoing end is arranged in the shape of a bundle. For the above-described optical fiber, it is preferable to use the optical fiber, in which the core diameter is uniform and the clad diameter of the outgoing end is smaller that that of the incident end.

The incorporated laser light source, in which the laser beams are incorporated and struck on the optical fiber, is preferable to each fiber light source constituting the fiber array light source or the fiber bundle light source. By adopting the incorporated laser light source, high brightness and high output can be obtained, and it is preferable to the exposure of the spatial light modulator. Particularly, in the laser diode having the oscillating wavelength of 350 nm to 450 nm, though it is difficult to obtain the high output with singe element, incorporation can realize the high output.

Since the optical fiber array is obtained with few optical fibers compared with the related art, it is low cost. Furthermore, since the number of optical fibers is few, the light-emitting region is further decreased when the optical fibers are arrayed (or the brightness is further increased).

For example, the fiber light source can be include a plurality of laser diodes, one optical fiber, and a condensing optical system which condenses the laser beam emitted from each of the plurality of laser diodes and couples the condensed beam on the incident end of the optical fiber.

The fiber light source may include a multi-cavity laser having a plurality of light-emitting points arranged in a predetermined direction, one optical fiber, and a condensing optical system which condenses the laser beam emitted from each of the plurality of light-emitting points and focuses the condensed beam on the incident end of the optical fiber. Further, the laser beam emitted from each of the light-emitting points of the plurality of multi-cavity lasers may be condensed and coupled to one optical fiber.

A micro-mirror device in which many micro-mirrors whose angle of a reflection plane is changeable according to each control signal are formed to be arranged two-dimensionally or a liquid crystal shutter array in which many liquid crystal cells which can shut transmitted light according to each control signal are formed to be arranged two-dimensionally may be used as the spatial light modulator.

It is preferable that a collimator lens which parallels the laser beam (light flux) from the laser device and an optical system for correcting light intensity (quantity) distribution are arranged, the optical system for correcting light intensity distribution changes a light flux width at each outgoing position so that a ratio of the light flux width of a peripheral portion to the light flux width of a central portion near an optical axis is decreased on an outgoing side compared with an incident side, and corrects the light intensity distribution of the laser beam paralleled with the collimator lens so as to be substantially uniformed at an irradiated surface of the spatial light modulator are arranged between the laser device and the spatial light modulator.

According to the optical system for correcting light intensity distribution, for example, though the light has the same light flux width on the incident side, the light flux width of the central portion is increased on the outgoing side compared with the peripheral portion, on the contrary, the light flux width of the peripheral portion is decreased compared with the central portion. Thus, the light flux in the central portion can be irradiated to the peripheral portion, so that the spatial light modulator can be irradiated with the light whose light intensity distribution is substantially uniformed without reducing the light utilization efficiency as a whole. Consequently, the uneven exposure never occurs and the high-quality exposure can be performed.

In the related art, a gas laser such as an argon gas laser or a solid state laser generated by THG (Third Harmonic Wave) is usually used as the exposure apparatus (ultraviolet exposure apparatus) which exposes the photosensitive material with the laser beam of the ultraviolet wave range, however, there is the problem that the apparatus is large and the exposure speed is slow. In the exposure apparatus of the invention can be used as the ultraviolet exposure apparatus by using a GaN (gallium nitride) laser diode having the wavelength of 350 nm to 450 nm. According to the ultraviolet exposure apparatus, miniaturization of the apparatus and the cost reduction can be achieved and the high-speed exposure can be performed, compared with the apparatus of the related art.

In order to achieve the above-described second object of the invention, there is provided a rapid prototyping apparatus, wherein the rapid prototyping apparatus comprises an exposure head including a shaping tank which stores a photo curable resin, a support which is provided elevatably in the shaping tank and supports a shaped article, a laser device which irradiates a laser beam, a spatial light modulator in which many pixel portions, in which a light modulation state is changed according to each control signal, are arranged two-dimensionally on a substrate and which modulates the laser beam irradiated from the laser device, control means which controls each of the plural pixel portions fewer than the total number of the pixel portions arranged on the substrate with the control signal generated according to exposure information, and an optical system which focuses the laser beam modulated in each pixel portion on a liquid surface of the photo-curable resin stored in the shaping tank, and moving means which relatively moves the exposure head for the liquid surface of the photo-curable resin.

In the rapid prototyping apparatus of the invention, the liquid surface of the photo-curable resin stored in the shaping tank is scanned and exposed in such a manner that the exposure head is relatively moved for the liquid surface of the photo-curable resin with the moving means, while the laser beam modulated with each pixel portion of the spatial light modulation in the exposure head is focused on the liquid surface of the photo-curable resin stored in the shaping tank. The exposed resin is cured to form the cured resin layer. After one layer of the cured resin layer is formed, the support which is provided in the shaping tank and supports the shaped article is descended to form the new resin surface, and then the next cured resin layer is formed in the same way. Thus, the curing of the resin and the descent of the support are repeated, the cured resin layer is stacked in order, and the three-dimensional model is shaped.

In the rapid prototyping apparatus of the invention, for the spatial light modulator of the exposure head, each of the plurality of pixel portions fewer than the total number of the pixel portions is controlled with the control signal generated according to exposure information. That is to say, a part of the pixel portions is controlled without controlling a whole of the pixel portions arranged on the substrate. Consequently, the number of pixels in the pixel portions is decreased, and transfer time of the control signal becomes short compared with the case that the control signals of the whole of the pixel portions are transferred. This enables the modulation speed of the laser beam to be increased and the high-speed shaping to be performed.

In the rapid prototyping apparatus, it is preferable that the pixel portion controlled with the control means is the pixel portion which is included in a region in which a length in a direction corresponding to the predetermined direction is longer than length in a direction crossed with the predetermined direction. The number of using exposure heads can be decreased by using the pixel portion having the long region in the array direction of the light-emitting points of the exposure device.

In the rapid prototyping apparatus, the laser device may include a plurality of fiber light sources which irradiates the laser beam incident from an incident end of the optical fiber from an outgoing end of the optical fiber, and includes a fiber array light source in which each light-emitting point at the outgoing end of the plurality of fiber light source is arranged in the shape of a one-dimensional or two-dimensional array. The laser device may also include a fiber bundle light source in which each light-emitting point at the outgoing end of the plurality of fiber light sources is arranged in the shape of a bundle. The arraying or the bundling can increase the output. For the above-described optical fiber, it is preferable to use the optical fiber, in which the core diameter is uniform and the clad diameter of the outgoing end is smaller that that of the incident end.

The incorporated laser light source, in which the laser beams are incorporated and struck on the optical fiber, is preferable to each fiber light source constituting the fiber array light source or the like. By adopting the incorporated laser light source, high brightness and high output can be obtained, and it is preferable to the exposure of the spatial light modulator. Since the optical fiber array is obtained with few optical fibers compared with the related art, it is low cost. Furthermore, since the number of optical fibers is few, the light-emitting region is further decreased when the optical fibers are arrayed (or the brightness is further increased). By using the fiber having the smaller clad diameter, the light-emitting area is further decreased when the optical fibers are arrayed, so that brightness can be further increased. Even in the case that the spatial light modulator is partially used, by using the high-bright fiber array light source or fiber bundle light source, the focal depth of the focusing beam which has passed through the spatial light modulator can be taken deeply because irradiation NA of the spatial light modulator is decreased, and the used portion can be efficiently irradiated with the laser beam and the laser beam can be irradiated with high light density. Consequently, the fine exposure and shaping can be performed at high speed. For example, the shaping having the fine shape of 1 μm order can be performed.

For example, the fiber light source can be include a plurality of laser diodes, one optical fiber, and a condensing optical system which condenses the laser beam emitted from each of the plurality of laser diodes and couples the condensed beam on the incident end of the optical fiber. The fiber light source may include a multi-cavity laser having a pluality of light-emitting points arranged in a predetermined direction, one optical fiber, and a condensing optical system which condenses the laser beam emitted from each of the plurality of light-emitting points and focuses the condensed beam on the incident end of the optical fiber. Further, the laser beam emitted from each of the light-emitting points of the plurality of multi-cavity lasers may be condensed and coupled to one optical fiber.

A digital micromirror device (DMD) in which many micro-mirrors whose angle of a reflection plane is changeable according to each control signal are formed to be arranged two-dimensionally or a liquid crystal shutter array in which many liquid crystal cells which can shut transmitted light according to each control signal are formed to be arranged two-dimensionally may be used as the spatial light modulator used for the above-described rapid prototyping apparatus. Power is dispersed and heat deformation can be prevented in such a manner that the exposure is performed with multi-channel by using the spatial light modulator including the many pixel portions like DMD.

It is preferable that the laser device used for the rapid prototyping apparatus irradiates the shaped article with the laser beam whose wavelength ranges from 350 to 450 nm. By using of GaN laser diode as a laser diode, the laser device can irradiate a laser beam whose wavelength ranges from 350 to 450 nm. Using of the laser beam whose wavelength ranges from 350 to 450 nm causes the light absorption factor of the photo-curable resin to largely increase, compared with the case in which the laser beam having the infrared wave range. Since the laser beam of the wavelength of 350 to 450 nm is short, photon energy is large and it is easy to transform the laser beam into the thermal energy. The laser beam of the wavelength of 350 to 450 nm has large light absorption factor, and the transformation into the thermal energy is easy, so that the curing of the photo-curable resin, i.e., the shaping can be performed at high speed. It is preferable that the wave range of the laser beam ranges from 350 to 420 nm. The wavelength of 405 nm is particularly preferable, considering that the low-cost GaN laser diode is used.

The rapid prototyping apparatus can be formed as a multi-head type of rapid prototyping apparatus, which includes the plurality of exposure heads. The multi-head can achieve further high-speed shaping.

In order to achieve the above-described fourth object of the invention, there is provided a stacking rapid prototyping apparatus, wherein the rapid prototyping apparatus comprises an exposure head including a shaping tank which stores a powder sintered with light irradiation, a support which is provided elevatably in the shaping tank and supports a shaped article, a laser device which irradiates a laser beam, a spatial light modulator in which many pixel portions, in which a light modulation state is changed according to each control signal, are arranged two-dimensionally on a substrate and which modulates the laser beam irradiated from the laser device, control means which controls each of the plural pixel portions fewer than the total number of the pixel portions arranged on the substrate with the control signal generated according to exposure information, and an optical system which focuses the laser beam modulated in each pixel portion on a surface of the powder stored in the shaping tank; and moving means which relatively moves the exposure head for the surface of the powder.

In the stacking rapid prototyping apparatus of the invention, the surface of the powder stored in the shaping tank is scanned and exposed in such a manner that the exposure head is relatively moved for the surface of the powder with the moving means, while the laser beam modulated with each pixel portion of the spatial light modulation in the exposure head is focused on the surface of the powder stored in the shaping tank. The exposed powder is sintered and cured to form the sintered layer. After one layer of the sintered layer is formed, the support which is provided in the shaping tank and supports the shaped article is descended to form the new powder surface, and then the next sintered layer is formed in the same way. Thus, the sintering and the descent of the support are related, the sintered layer is stacked in order, and the three-dimensional model is shaped.

In the stacking rapid prototyping apparatus of the invention, for the spatial light modulator of the exposure head, each of the plurality of pixel portions fewer than the total number of the pixel portions is controlled with the control signal generated according to exposure information. That is to say, a part of the pixel portions is controlled without controlling a whole of the pixel portions arranged on the substrate. Consequently, the number of pixels in the pixel portions is decreased, and transfer time of the control signal becomes short compared with the case that the control signals of the whole of the pixel portions are transferred. This enables the modulation speed of the laser beam to be increased and the high-speed shaping to be performed.

In the stacking rapid prototyping apparatus, it is preferable that the pixel portion controlled with the control means is the pixel portion which is included in a region in which a length in a direction corresponding to the predetermined direction is longer than length in a direction crossed with the predetermined direction. The number of using exposure heads can be decreased by using the pixel portion having the long region in the array direction of the light-emitting points of the exposure device.

In the stacking rapid prototyping apparatus, the laser device may include a plurality of fiber light sources which irradiates the laser beam incident from an incident end of the optical fiber from an outgoing end of the optical fiber, and includes a fiber array light source in which each light-emitting point at the outgoing end of the plurality of fiber light source is arranged in the shape of a one-dimensional or two-dimensional array. The laser device may also include a fiber bundle light source in which each light-emitting point at the outgoing end is arranged in the shape of a bundle. The arraying or the bundling can increase the output. For the above-described optical fiber, it is preferable to use the optical fiber, in which the core diameter is uniform and the clad diameter of the outgoing end is smaller than that of the incident end.

The incorporated laser light source, in which the laser beams are incorporated and struck on the optical fiber, is preferable to each fiber light source constituting the fiber array light source or the like. By adopting the incorporated laser light source, high brightness and high output can be obtained, and it is preferable to the exposure of the spatial light modulator. Since light output is obtained with few optical fibers compared with the related art, it is low cost. Furthermore, since the number of optical fibers is few, the light-emitting region is further decreased when the optical fibers are arrayed (or the brightness is further increased). By using the fiber having the smaller clad diameter, the light-emitting area is further decreased when the optical fibers are arrayed, so that brightness can be further increased. Even in the case that the spatial light modulator is partially used, by using the high-bright fiber array light source or fiber bundle light source, the focal depth of the focusing beam which has passed through the spatial light modulator can be taken deeply because irradiation NA of the spatial light modulator is decreased, the used portion can be efficiently irradiated with the laser beam and the laser beam can be irradiated with high light density. Consequently, the fine exposure and shaping can be performed at high speed. For example, the shaping having the fine shape of 1 $\mu$m order can be performed.

For example, the fiber light source can be include a plurality of laser diodes, one optical fiber, and a condensing optical system which condenses the laser beam emitted from each of the plurality of laser diodes and couples the condensed beam on the incident end of the optical fiber. The fiber light source may include a multi-cavity laser having a plurality of light-emitting points arranged in a predetermined direction, one optical fiber, and a condensing optical system which condenses the laser beam emitted from each of the plurality of light-emitting points and focuses the condensed beam on the incident end of the optical fiber. Further, the laser beam emitted from each of the light-emitting points of the plurality of multi-cavity lasers may be condensed and coupled to one optical fiber.

The digital micro-mirror device (DMD) in which many micro-mirrors whose angle of a reflection plane is changeable according to each control signal are formed to be arranged two-dimensionally on a substrate or a liquid crystal shutter array in which many liquid crystal cells which can shut transmitted light according to each control signal are formed to be arranged two-dimensionally on a substrate may be used as the spatial light modulator used for the above-described stacking rapid prototyping apparatus. Power is dispersed and heat deformation can be prevented in such a manner that the exposure is performed with multi-channel by using the spatial light modulator including the many pixel portions like DMD.

It is preferable that the laser device used for the rapid prototyping apparatus irradiates the shaped article with the laser beam whose wavelength ranges from 350 to 450 nm. By using of GaN laser diode as a laser diode, the laser device can irradiate a laser beam whose wavelength ranges from 350 to 450 nm. Using of the laser beam whose wavelength ranges from 350 to 450 nm causes the light absorption factor of the photo-curable resin to largely increase, compared with the case in which the laser beam having the infrared wave range. Particularly, in the case of metal power, light absorption factor is increased significantly. Since the laser beam of the wavelength of 350 to 450 nm is short, photon energy is large and it is easy to transform the laser beam into the thermal energy. The laser beam of the wavelength of 350 to 450 nm has large light absorption factor, and the transformation into the thermal energy is easy, so that the curing of the photo-curable resin, i.e., the shaping can be performed at high speed. It is preferable that the wave range of the laser beam ranges from 350 to 420 nm. The wavelength of 405 nm is particularly preferable, considering that the low-cost GaN laser diode is used.

It is preferable that the laser device is pulse-driven. Since the thermal diffusion generated by the irradiating light is prevented by exposing the powder with the pulse-driven laser beam, light energy is efficiently utilized to the sintering of the light energy and the high-speed shaping can be performed. Since the thermal diffusion is prevented, the powder is sintered in the almost same size as the incident beam shape, so that the fine shaping can be performed with smooth surface. Accordingly, shorter pulse width of the laser beam is preferable, it is more preferable that the pulse width ranges from 1 psec to 100 nsec, and it is further preferable that the pulse width ranges from 1 psec to 300 nsec.

The stacking rapid prototyping apparatus can be formed as a multi-head type of rapid prototyping apparatus, which includes the plurality of exposure heads. The multi-head can achieve further high-speed shaping.

In order to achieve the above-described sixth and seventh objects of the invention, there is provided a forming method of a micro channel, wherein the forming method of the micro channel comprises the steps of an exposing step which exposes a resist film formed on a substrate with a laser beam having a wavelength of 350 nm to 450 nm, which is spatially modulated according to a forming pattern data of the micro channel, a patterning step which removes partially the resist film according to an exposure pattern and forms the resist film of a predetermined pattern, and an etching step which etches and removes the substrate from a surface to form the micro channel, by using the resist pattern of the predetermined pattern.

Since the laser beam whose wavelength ranges from 350 nm to 450 nm is used in the forming method of the micro channel, unlike the excimer laser, it is not necessary to use the optical system made of a spacial material for the ultraviolet ray, like the laser exposure apparatus of the visible range, the spatial light modulator such as DMD can be used. Consequently, the resist film can be exposed with the laser beam which is modulated spatially according to forming pattern data of the micro channel. That is to say, the digital exposure of the resist film can be finely performed at high speed in an arbitrary pattern.

As described above, in the exposure process, the exposure of the resist film can be finely performed at high speed in an arbitrary pattern, so that the micro channel having the arbitrary pattern can be finely formed at high speed through the following patterning process and etching process. Also, because of the digital exposure, it is not necessry to use a mask in each pattern and the micro channel can be formed at low cost.

The exposure head including the laser light source which irradiates a laser beam, the spatial light modulator in which many pixel portions, in which the light modulation state is changed according to each control signal, are arranged on the substrate and which modulates the laser beam irradiated from the laser device, and the optical system which focuses the laser beam modulated with each pixel portion on the exposure surface can be used in the exposure process. The resist film formed on the substrate can be scanned and exposed by relatively moving the exposure head in the direction crossed with the given surface for the exposure surface.

In order to expose the resist film more finely, it is preferable that the spatial light modulator is arranged to be slightly slanted so that the array direction of each pixel portion of the spatial light modulator makes a given angle θ with the direction crossed at right angles with the sub-scanning direction and performed multiple exposure. Consequently, the fine exposure can be performed with addressability of 1 μm by using the beam diameter of 10 μm. It is preferable that the oblique angle ranges from 1° to 5°.

It is more preferable that a micro-lens array including micro-lenses, which are provided corresponding to each pixel portion of the spatial light modulator and condense the laser beam in each pixel, is arranged on the outgoing side of the spatial light modulator. When the micro-lens array is arranged, since the laser beam modulated with each pixel portion of the spatial light modulator is condensed corresponding to each pixel with each micro-lens in the micro-lens array, even if the exposure area in the exposed surface is enlarged, the size of each beam spot can be contracted and the fine exposure can be performed. By using this contracting optical system, the fine exposure can be performed with addressability of 0.1 μm at the beam diameter of 1 μm.

Thus, by finely exposing the resist film, very smooth wall of the micro channel can be formed and the channel resistance can be decreased to obtain good size effect.

In order to form finely the micro channel, it is preferable that the thickness of the resist film is thick. When the micro channel whose channel width ranges from 10 μm to 50 μm is formed, it is preferable that the thickness of the resist film ranges from 10 μm to 50 μm, and it is more preferable that the thickness of the resist film ranges from 10 μm to 100 μm. In particular, it is more preferable to expose the resist film while the resist film is laminated in the multi-layers such as two layers or three layers. Since the resist film is digitally exposed, the correction such as elongation in the exposure, development and the like can be precisely performed with a function of digital scaling, and the positioning of the exposure position in the first layer and that in the second layer or the multi-layers can be finely realized. As a result, the resist film having the thickness two times that of related art can be finely patterned with a high aspect ratio, the fine and deep micro channel can be formed in etching process. The aspect ratio means ration of the channel depth b to the channel width a in the channel formed in the resist film.

In the exposure process of the forming method, the resist film can be exposed with higher accuracy in such a manner that the exposure is performed at deep focal depth with the high-bright light source. An incorporated laser light source which incorporates a plurality laser beams and causes the laser beams to impinge to each optical fiber is preferable to the high-bright light source. The laser light source having the high output is required for the exposure of the thickened resist film. In the laser diode having the oscillating wavelength of 350 nm to 450 nm, though it is difficult to obtain the high output with single element, incorporation can realize the high output.

The incorporated laser light source may be formed with, e.g., the following constructions: (1) Construction including a plurality of laser diodes, one optical fiber, and a condensing optical system which condenses the laser beam emitted from each of the plurality of laser diodes and couples the condensed beam to an incident end of the optical fiber, (2) Construction including a multi-cavity laser having a plurality of light-emitting points, one optical fiber, and a condensing optical system which condenses the laser beam emitted from each of the plurality of light-emitting points and couples the condensed beam to an incident end of the optical fiber, or (3) Construction including a plurality of multi-cavity lasers, one optical fiber, and a condensing optical system which condenses the laser beam emitted from each of the plurality of light-emitting points of the plurality of multi-cavity laser and couples the condensed beam to an incident end of the optical fiber.

The fiber array light source can be formed by arranging each of the light-emitting points at the outgoing end of the optical fiber in the incorporated laser light source in the shape of the array, or the fiber array light source can be formed by arranging each of the light-emitting points in the shape of the bundle. The bundling or the arraying can further increase the output. In view of high brightness, it is preferable to use the optical fiber, in which the core diameter is uniform and the clad diameter of the outgoing end is smaller than that of the incident end.

It is preferable that the clad diameter of the outgoing end of the optical fiber is less than 125 μm, in view of the smaller diameter of the light-emitting point, it is more preferable that the clad diameter of the outgoing end is not more than 80 μm, and it is particularly preferable that the clad diameter of the outgoing end is not more than 60 μm. The optical fiber in which the core diameter is uniform and the clad diameter of the outgoing end is smaller than that of the incident end can be formed, e.g., by coupling the plurality of optical fiber in which the core diameters are the same and the clad diameters are different. This enables the light-emitting area to be further decreased when the optical fibers are arrayed, and brightness can be further increased. When the light source module is partially broken, it is easy to change light source modules, by forming the plurality of optical fibers with the optical fibers connected detachably with the connector.

When the spatial light modulator is arranged obliquely and the super-fine exposure is performed with the contracting optical system or the same nagnification optical system, by using the high-bright fiber array light source or the fiber bundle light source, the focal depth of the focusing beam which has passed through the spatial light modulator can be taken deeply because irradiation NA of the spatial light modulator is decreased, the deep focal depth can be obtained, there is no fattening of the beam on the surface of the resist and in the resist, and the patterning of the high aspect ratio can be performed more finely. When the oblique channel whose wall surface is slanted is formed, the smooth patterning can be performed.

In the exposure process, for example, the laser beam is irradiated to the spatial light modulator, in which many pixel portions whose light modulation state is changed according to each control signal are arranged on the substrate, and modulated with each pixel portion of the spatial light modulator.

A micro-mirror device (DMD; Digital Micro-mirror Device), in which many micro-mirrors whose angle of the reflection plane is changeable according to each control signal are arranged two-dimensionally on the substrate (for example, silicon substrate), can used as the spatial light modulator. The spatial light modulator may be include an one-dimensional grating light valve (GLV) in which many movable gratings which are provided with a ribbon-shaped reflection plane and movable according to the control signal and many fixed gratings which are provided with the ribbon-shaped reflection plane are alternately arranged in parallel. A liquid crystal shutter, in which many liquid crystal cells which can be shut the transmitted light according to each control signal are two-dimensionally arranged on the substrate, array may be used.

It is preferable that the micro-lens array including micro-lenses, which are provided corresponding to each pixel portion of the spatial light modulator and condense the laser beam in each pixel, is arranged on the outgoing side of the spatial light modulator. When the micro-lens array is arranged, since the laser beam modulated with each pixel portion of the spatial light modulator is condensed correspondingly to each pixel with each micro-lens in the micro-lens array, even if the exposure area in the exposed surface is enlarged, the size of each beam spot can be contracted and the fine exposure can be performed.

In order to achieve the above-described eighth and ninth objects of the invention, there is provided a bleaching apparatus, wherein the bleaching apparatus comprising chemical solution impregnating means for impregnating fiber prior to dyeing with a chemical solution containing a oxidizing agent or a reducing agent, and laser irradiating means which includes an incorporated laser light source including a plurality of laser diodes, one optical fiber, and a condensing optical system which condenses the laser beam emitted from each of the plurality of laser diodes and couples the condensed beam to an incident end of the optical fiber, and pulse-irradiates cloth impregnated with the chemical solution with the laser beam whose wavelength ranges from 200 nm to 450 nm.

In the bleaching apparatus of the invention, the fiber prior to the dyeing is impregnated with the chemical solution containing the oxidizing agent or the reducing agent by the chemical solution impregnating means. The cloth impregnated with the chemical solution is pulse-irradiated with the laser beam whose wavelength ranges from 200 nm to 450 nm from the laser irradiating means.

The incorporated laser light source includes the plurality of laser diodes, one optical fiber, and the condensing optical system which condenses the laser beam emitted from each of the plurality of laser diodes and couples the condensed beam to an incident end of the optical fiber. Since the plurality of laser beams are incorporated by utilizing the optical fiber in the incorporated laser light source, the incorporated laser light source is the high output and the high brightness. Since the laser irradiating means includes the incorporated laser light source having the high output and high brightness, high energy density necessary for the bleaching can be easily obtained in the bleaching apparatus of the invention. Since the incorporated laser light source is formed with the laser diode which provides continuous operation and excellent output stability, the short-pulsed laser beam can be irradiated, energy efficiency is high, the bleaching can be performed at high speed, and maintenance is easy and the bleaching apparatus is low-cost, compared with an apparatus using an excimer laser.

In the bleaching apparatus, from the viewpoint of promoting the bleaching and increasing the processing, it is preferable that the wavelength of the laser beam irradiated from the laser irradiating means ranges from 350 nm to 450 nm. In particular, it is preferable that the wavelength ranges from 400 nm to 415 nm, which is easy to increase output in the GaN diode. From the viewpoint of reduction of damage of the fiber and increase of bleaching performance, it is preferable that the wavelength ranges from 200 nm to 350 nm. Furthermore, considering that cost-reduction of the apparatus is achieved and high-speed processing is performed without using the optical system for a special material, the wavelength is preferably more than 400 nm.

Since the GaN laser diode is covalent bond, mobility of dislocation is extremely small compared with a GaAs system or an AlGaInP system, and thermal conductivity is much larger than that of the GaAs system or the AlGaInP system, so that the GaN laser diode has high COD (Catastrophic Optical Damage) level. Consequently, when the GaN laser diode is pulse-driven, the high output can be achieved. As a result, the output can be obtained as high as several hundreds mW to several tens W at a peak power by the shortening the pulse. Consequently, duty can be decreased as small as about 0.1% to about 10%, so that the high energy density can be obtained and the heat damage to the fiber can be decreased.

The incorporated laser light source may include the laser diodes having the plurality of light emitting points, one optical fiber, and the condensing optical system which condenses the laser beam emitted from each of the plurality of light-emitting points of the laser diodes having the plurality of light-emitting points and couples the condensed beam to an incident end of the optical fiber. For example, the multi-cavity laser can be used as the laser diode having the plurality of light-emitting points.

For the incorporated laser light source, it is preferable to use the optical fiber, in which the core diameter is uniform and the clad diameter of the outgoing end is smaller at that of the incident end. The high brightness of the light source can be achieved by decreasing the clad diameter of the outgoing end. Considering that the diameter of the light-emitting point is decreased, it is preferable that the clad diameter of the outgoing end of the optical fiber is less than 125 μm, in view of the smaller diameter of the light-emitting point, it is more preferable that the clad diameter of the outgoing end is not more than 80 μm, and it is particularly preferable that the clad diameter of the outgoing end is not more than 60 μm. The optical fiber in which the core diameter is uniform and the clad diameter of the outgoing end is smaller that that of the incident end can be formed, e.g., by coupling the plurality of optical fiber in which the core diameters are the same and the clad diameters are different. This enables the light-emitting area to be further decreased when the optical fibers are arrayed, and the brightness can be further increased. When the light source module is partially broken, it is easy to change light source modules, by forming the plurality of optical fibers with the optical fibers connected detachably with the connector.

The laser irradiating means may include the plurality of incorporated laser light sources. For example, the laser irradiating means may include the fiber array light source in which the plurality of light-emitting points (outgoing end of the optical fiber) of the incorporated laser light source are arranged in the shape of the array, or the fiber array light source in which the light-emitting points of the incorporated laser light source are formed in the shape of the bundle. In the fiber array light source or the fiber array light source, since the plurality of optical fibers is bundled to form the light source, the further high output can be achieved. Consequently, the high-bright light source can be obtained at low cost, the focusing beam having the deep focal depth and high brightness can be obtained, and the laser bleaching can be performed at high speed.

BRIEF DESCRIPTION OF THE DRAWINGS

FIG. 9A is a perspective view showing the construction of a fiber array light source, FIG. 9B is a partially enlarged view of the fiber array light source shown in FIG. 9A, FIG. 9C is a plan view showing an array of emitting points at a laser outgoing portion, and FIG. 9D is a plan view showing another array of the emitting points at the laser outgoing portion.

FIG. 23 is a plan view showing another construction of the incorporated laser light source.

FIG. 24A is a plan view showing another construction of the incorporated laser light source, and FIG. 24B is a sectional view along the optical axis of FIG. 24A.

FIG. 33 is a perspective view showing the construction of the scanner in the rapid prototyping apparatus according to the second embodiment.

FIG. 45A is a sectional view in the fiber array direction along the optical axis, which shows another constuction of an irradiating head, and FIG. 45B is a sectional view in the sub-scanning direction, which shows the construction of the irradiating head.

DETAILED DESCRIPTION OF THE PREFERRED EMBODIMENT

Figure 1:
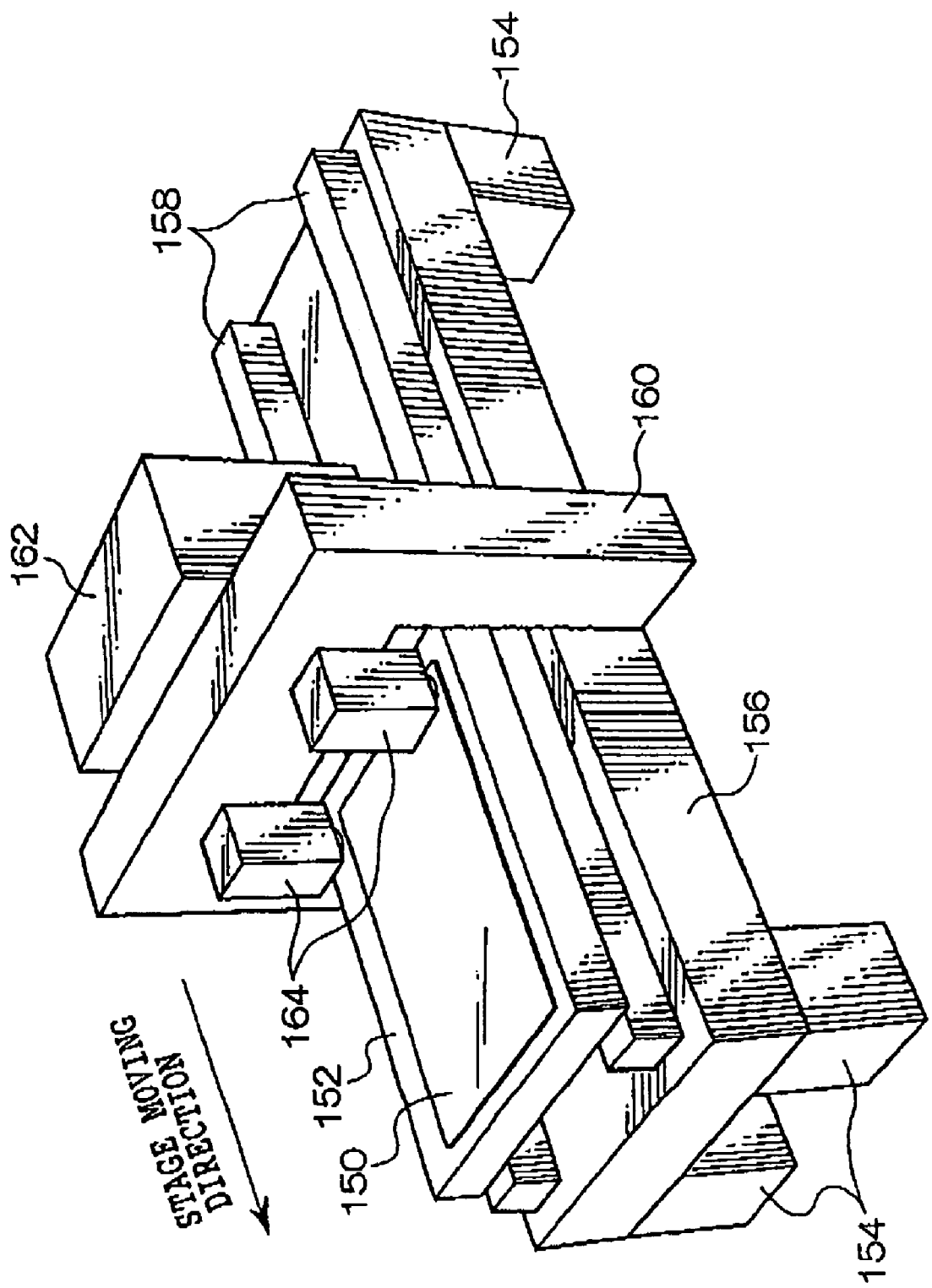
FIG. 1 is a perspective view showing an appearance of an exposure apparatus according to a first embodiment.

Preferred embodiments of the invention will be described in detail below referring to the drawings.

[First Embodiment]

A first embodiment is the exposure apparatus including the exposure head exposing the photosensitive material with the light beam modulated by the spatial light modulator according to the image data.

(Construction of the Exposure Apparatus)

As shown in FIG. 1, the exposure apparatus according to the embodiment of the invention includes a flat plate-shaped stage 152 which absorbs a sheet-shaped photosensitive material 150 to a surface of the stage 152 and maintains the photosensitive material 150. Two guides 158 extending along a stage-moving direction are placed on an upper surface of a thick plate-shaped setting table 156 which is supported by four legs 154. While the stage 152 is arranged so that a longitudinal direction of the stage 152 faces the stage-moving direction, the stage 152 is supported by the guides 158 so as to be able to reciprocate. The exposure apparatus is provided with a driving device, which is not shown, for driving the stage 152 along the guides 158.

A U-shaped gate 160 is provided in a central portion of the setting table 156 so as to straddle a moving route of the stage 152. Each of end portions of the U-shaped gate 160 is fixed to both side faces of the setting table 156. A scanner 162 is provided on one side across the gate 160, plural detecting sensors 164 (for example, two sensors) which detect a leading end and a rear end of the photosensitive material 150 are provided on the other side. The gate 160 is equipped with the scanner 162 and the detecting sensors 164, the scanner 162 and the detecting sensors 164 is arranged above the stage-moving direction of the stage 152. The scanner 162 and the detecting sensors 164 are connected to a controller, which is not shown, for controlling them.

Figure 2:
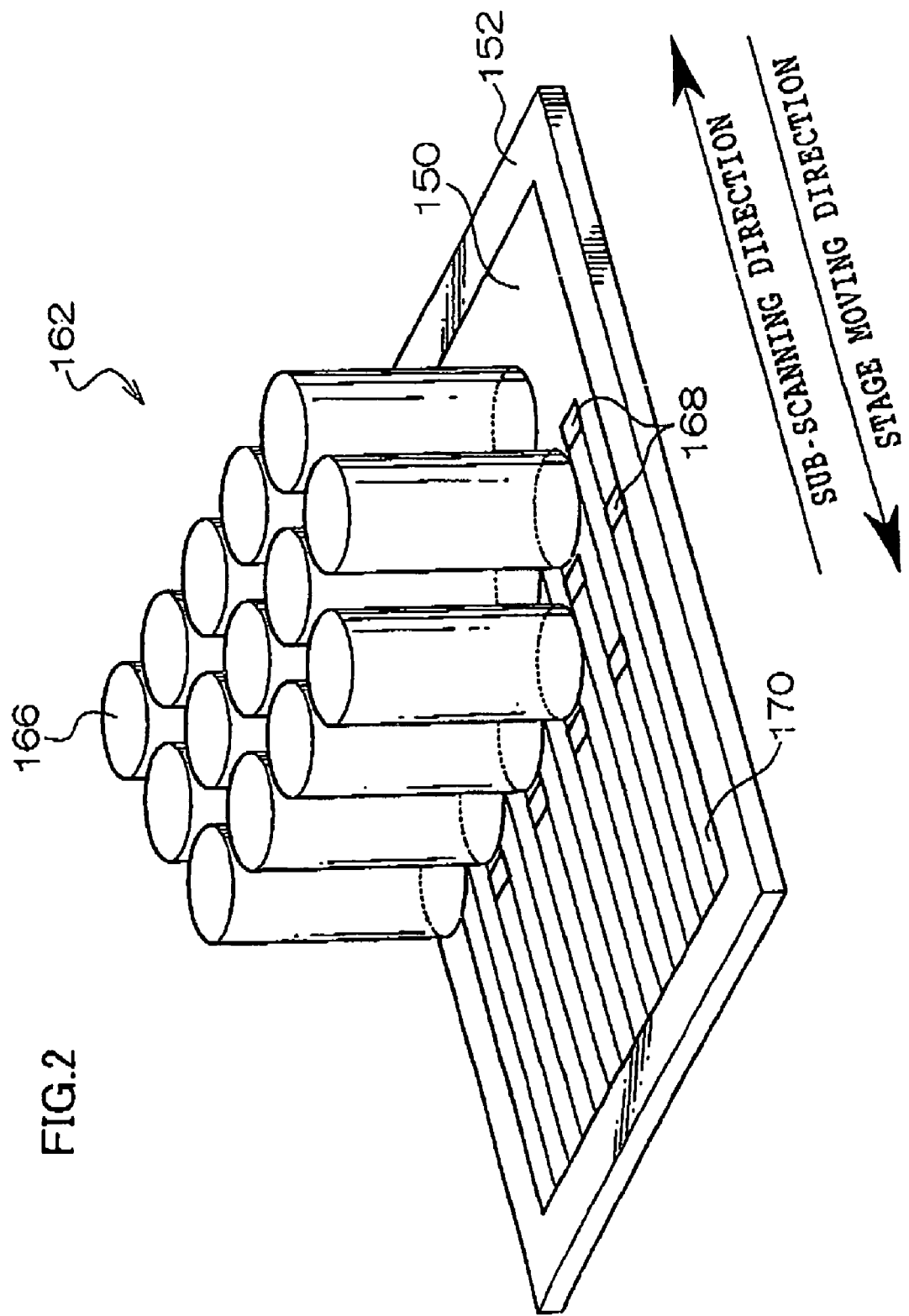
FIG. 2 is a perspective view showing a construction of a scanner in the exposure apparatus according to the first embodiment.
Figure 3A:
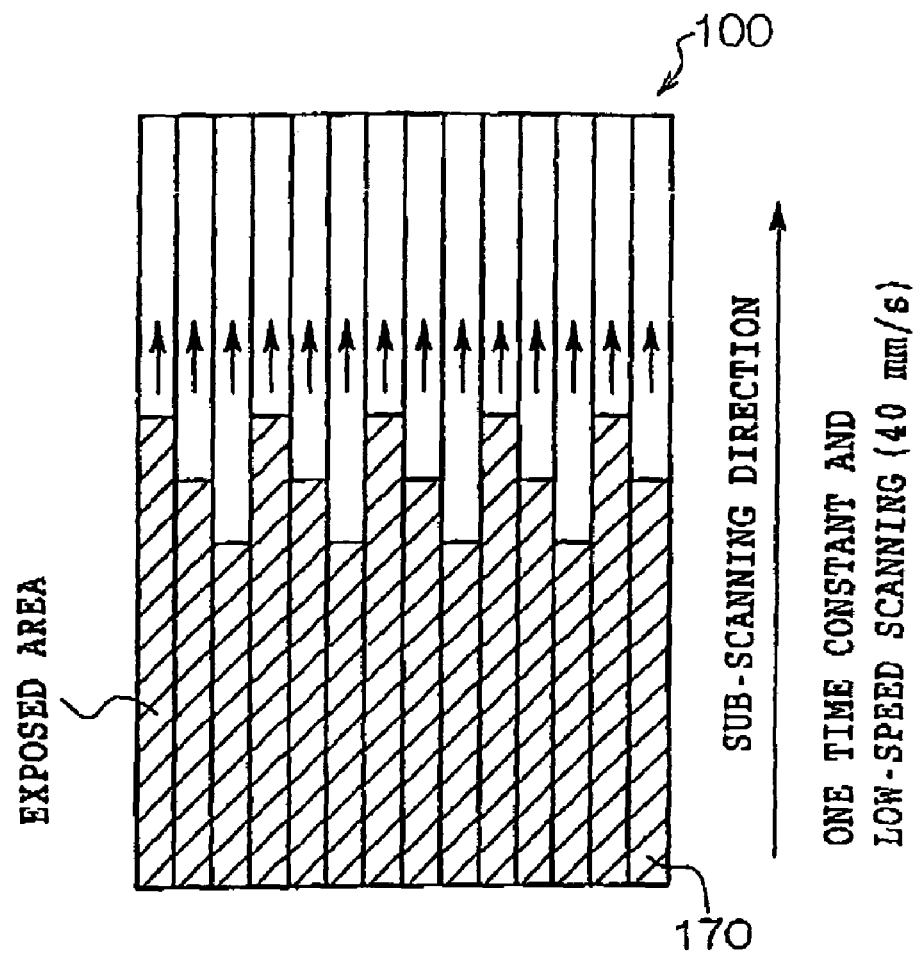
FIG. 3A is a plan view showing an area formed in the photosensitive material where exposure has been performed.
Figure 3B:
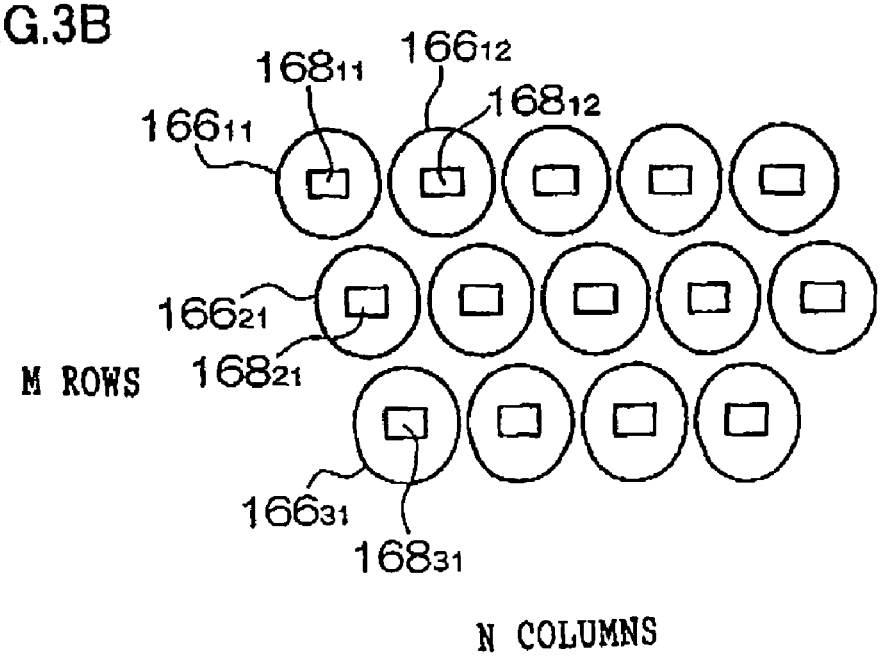
FIG. 3B shows an arrangement of an exposure area which is exposed with each exposure head.

As shown in FIGS. 2 and 3B, the scanner 162 includes plural exposure heads 166 (for example, fourteen heads) which are arrayed in a substantially m-row and n-column matrix (for example, three rows and five columns). In this example, four exposure head 166 are arranged in the third row according to a width of the photosensitive material 150. When the specific exposure head arranged in the mth row and the nth column is shown, it is indicated as "exposure head $166_{mn}$".

An exposure area 168 exposed by the exposure head 166 is a rectangle shape having a short side in the sub-scanning direction. Accordingly, with moving stage 152, a band-shaped exposed region 170 is formed with each exposure head 166 in the photosensitive material 150. When the exposure area exposed with the exposure head arranged in the mth row and the nth column is shown, it is indicated as "exposure area $168_{mn}$".

As shown in FIGS. 3A and 3B, each of exposure heads in each row, which is arranged in the shape of a line, is arranged with a predetermined interval (natural number times of a long side of the exposure area, twice in the embodiment) in an array direction so that the band-shaped exposed region 170 is arranged in a direction crossed with the sub-scanning direction without a gap. Therefore, a portion between the exposure area $168_{11}$ and the exposure area $168_{12}$, where can not be exposed, can be exposed by the exposure area $168_{21}$ and the exposure area $168_{31}$.

Figure 4:
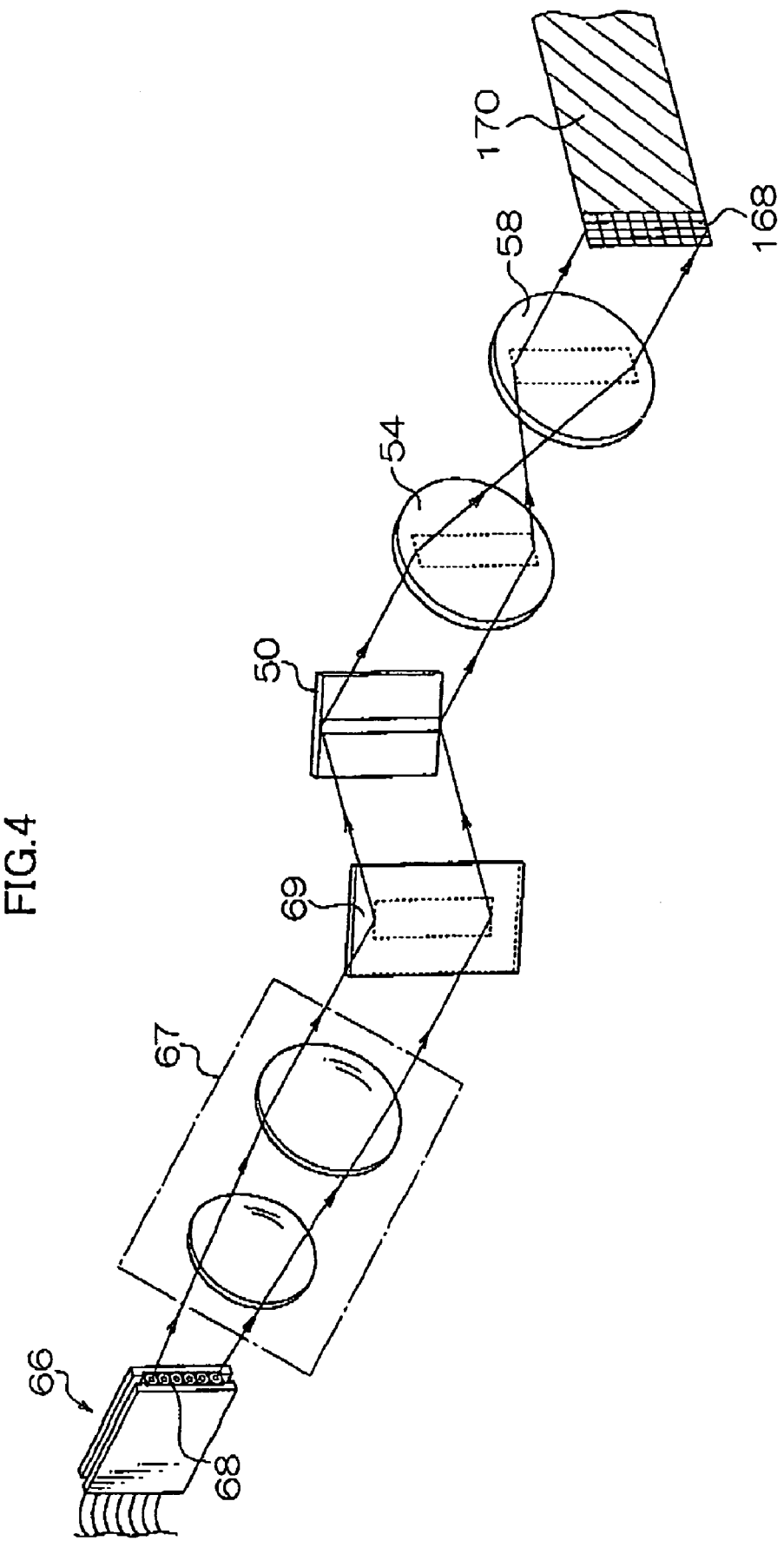
FIG. 4 is a perspective view showing a schematic construction of the exposure head in the exposure apparatus according to the first embodiment.
Figure 5A:
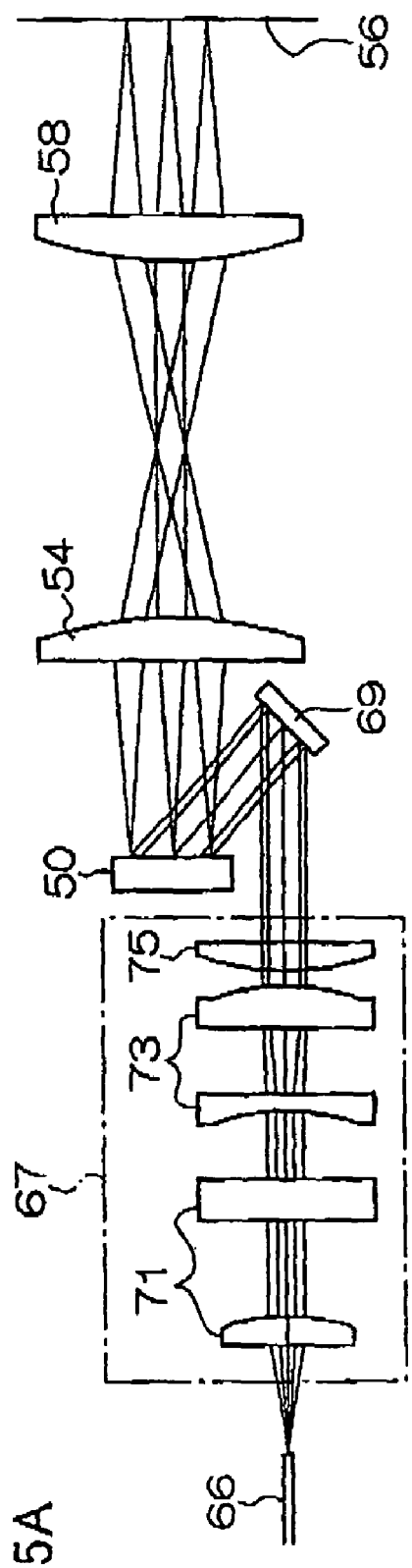
FIG. 5A is a sectional view in a sub-scanning direction along an optical axis, which shows the construction of the exposure head shown in FIG. 4.
Figure 5B:
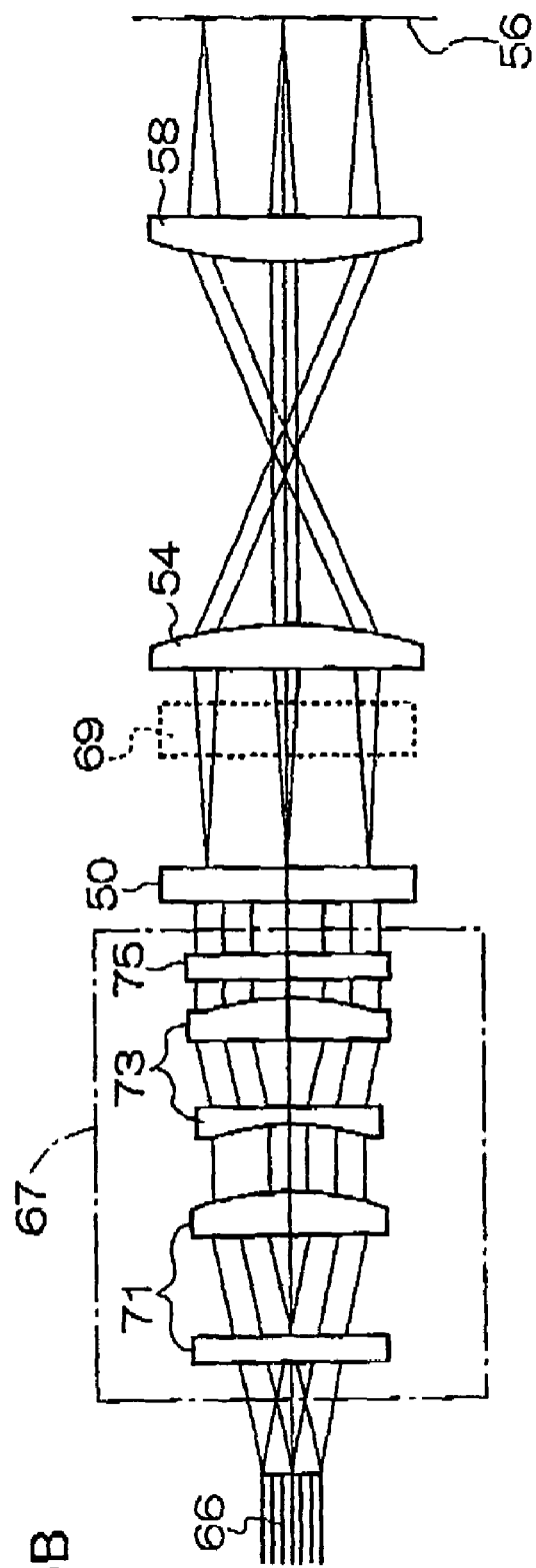
FIG. 5B is a side view showing the construction of the exposure head shown in FIG. 4.

As shown in FIGS. 4, 5A, and 5B, each of the exposure heads $166_{11}$ to $166_{mn}$ includes a digital micro-mirror device (DMD) 50 as the spatial light modulator which modulates the incident light beam in each pixel according to the image data. DMD 50 is connected to the controller which is provided with a data processing portion and a mirror-driving control portion and not shown. In the data processing portion of the controller, a control signal which drives and controls each micro-mirror in the region of DMD 50, which should be controlled, is generated in each exposure head 166 on the basis of the inputted image data. The region which should be controlled is described later. In the motor-driving control portion, an angle of a reflection plane of each micro-mirror of DMD 50 is controlled in each exposure head 166 on the basis of the control signal generated with the image data processing portion. The control of the angle of the reflection plane is described later.

On a light incident side of DMD 50, a fiber array light source 66 including a laser outgoing portion in which an outgoing end portions of the optical fibers (light-emitting point are arranged in line along the direction corresponding to the long side direction of the exposure area 168, a lens system 67 which corrects the laser beam emitted from the fiber array light source 66 to condense the laser beam on DMD 50, a mirror 69 which reflects the laser beam transmitted by the lens system 67 to DMD 50 are arranged in order.

The lens system 67 includes a pair of combination lenses 71 which parallels the laser beam emitted from the fiber array light source 66, a pair of combination lenses 73 which corrects the paralleled laser beam so that the light intensity distribution of the paralleled laser beam is uniformed, condenser lens 75 which condenses the laser beam in which the light intensity distribution is corrected on DMD. The combination lenses 73 have function of widening the light flux in the portion close to the optical axis of the lens and compressing the light flux in the portion far away from the optical axis for the array direction of the laser outgoing end, and also have the function of just passing the light for the direction crossed at right angles with the array direction. The Combination lenses 73 correct the laser light so that the light intensity distribution is formed to be uniform.

Lens systems 54 and 58 which focus the laser beam reflected by DMD 50 on a scanning surface (exposed surface) 56 of the photosensitive material 150 are arranged on a light reflecting side of DMD 50. The lens systems 54 and 58 are arranged so that DMD 50 and the exposed surface 56 become a conjugate relation.

Figure 6:
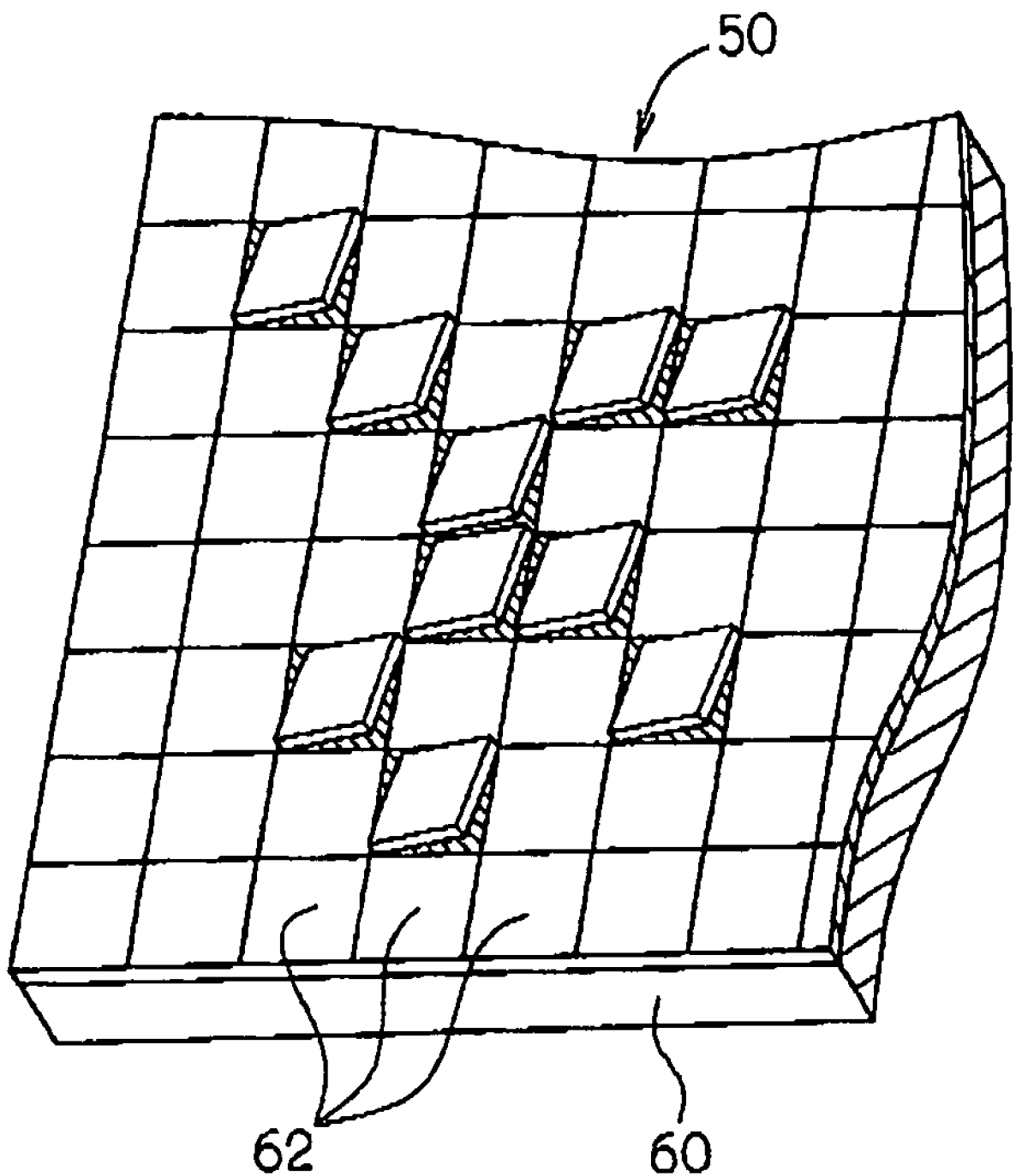
FIG. 6 is a partially enlarged view showing the construction of a digital micro-mirror device (DMD).

As shown in FIG. 6, DMD 50 is one in which micro mirrors (micro-mirrors) 62 are arranged on SRAM (memory cell) 60 while the mirror is supported by a support rod, and DMD is a mirror device in which plural (for example, 600 by 800 pieces) micro mirrors constituting the pixel are arranged in the shape of a grating. The micro-mirror 62 supported by the support rod is provided on the uppermost portion in each pixel, a material having high reflectivity such as aluminum is evaporated on the surface of the micro-mirror 62. The reflectivity of the micro-mirror 62 is not lower than 90%. Silicon gate CMOS-SRAM cell 60, which is manufactured in a normal manufacturing line of a semiconductor memory, is arranged through the support rod including a hinge and a yoke immediately below the micro-mirror 62, and DMD 50 is formed to be monolithic (integral) as a whole.

Figure 7A:
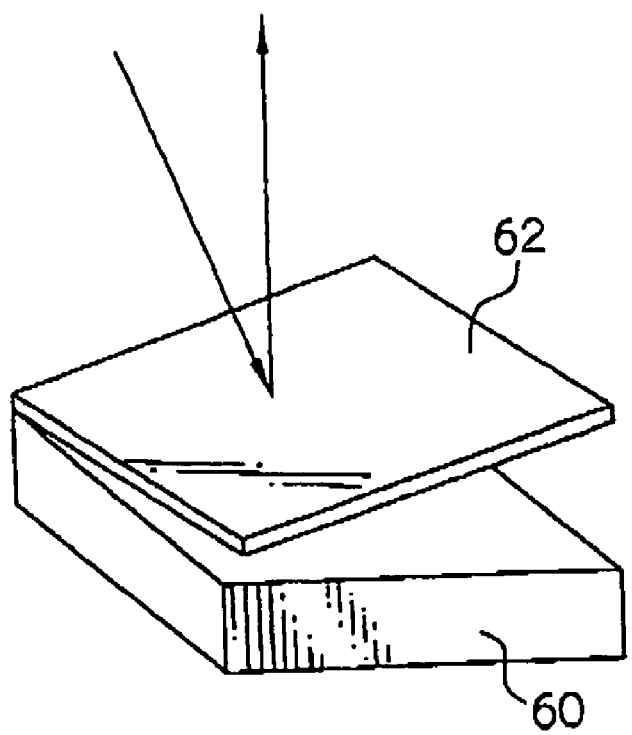
FIGS. 7A and 7B are explanatory views showing for illustrating operation of DMD.
Figure 7B:
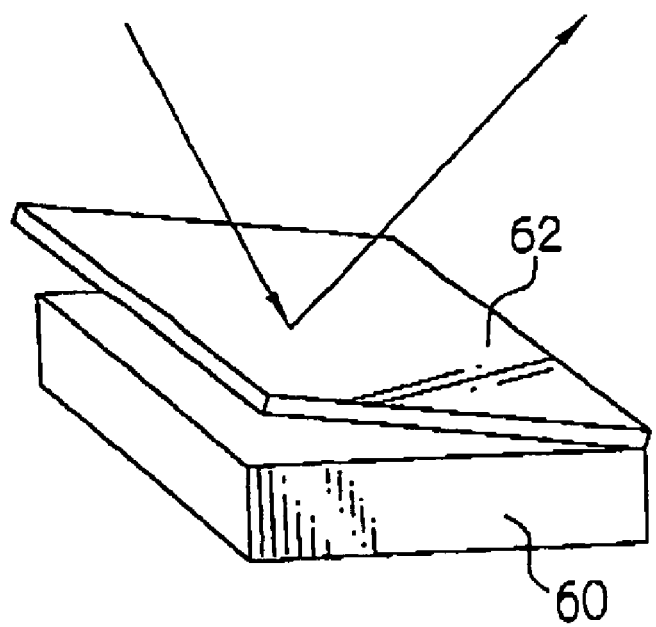

When a digital signal is written in SRAM cell 60 of DMD 50, the micro-mirror 62 supported by the support rod is slanted within the range of $\pm \alpha$ degrees (for example, $\pm 10$ degrees) from a diagonal as a center relative to a substrate side on which DMD 50 is arranged. FIG. 7A shows the $\pm \alpha$ degree-slanted state of the micro-mirror 62 which is an on-state, and FIG. 7B shows the $-\alpha$ degree-slanted state of the micro-mirror 62 which is an off-state. Accordingly, the incident light to DMD 50 is reflected toward the oblique direction of each micro-mirror 62 in such a manner that the slope of the micro-mirror 62 in each pixel of DMD 50 is controlled according to the image signal, as shown in FIG. 6.

FIG. 6 shows partially enlarged view of DMD 50 and an example in which the micro-mirror 62 is controlled by $+\alpha$ degrees or $-\alpha$ degrees. On-off control of each micro-mirror 62 is performed with the controller which is connected to DMD 50 and not shown. A light absorber (not shown) is arranged in the direction in which the light beam is reflected with the off-state micro-mirror 62.

Figure 8B:
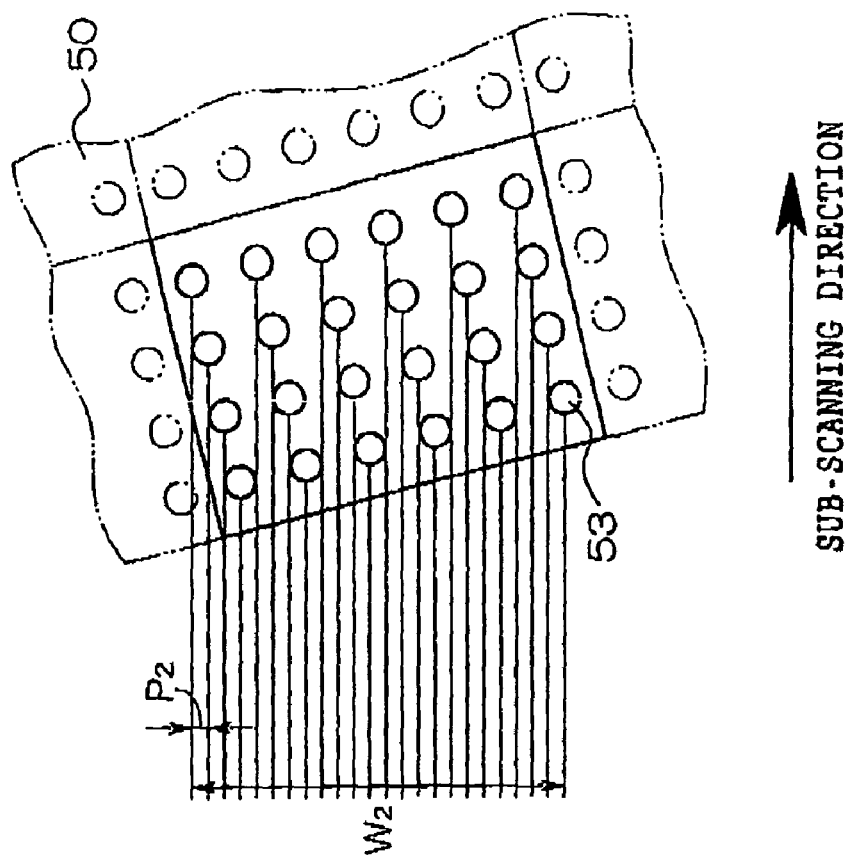
FIG. 8B is a plan view showing the arrangement and the scanning line of the exposure beam when DMD is obliquely arranged.
Figure 8A:
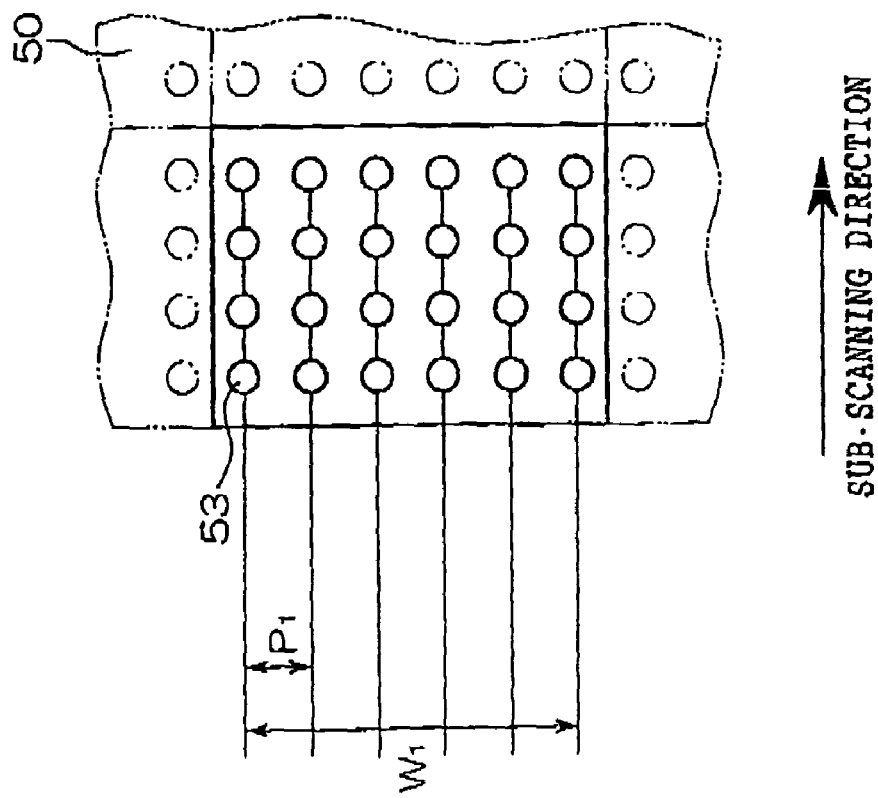
FIG. 8A is a plan view showing an arrangement and a scanning line of exposure beam when DMD is not obliquely arranged.

It is preferable that DMD 50 is arranged slightly obliquely so that the short side of DMD 50 makes a green angle $\theta$ (for example, 1° to 5°) with sub-scanning direction. FIG. 8A shows a scanning trajectory of reflected light (exposure beam) 53 reflected with each mirror when DMD 50 is not slanted, FIG. 8B shows the scanning tragectory of the exposure beam 53 when DMD 50 is slanted.

Plural sets of the micro-mirror column (for example, 600 sets) in which plural micro-mirrors (for example, 800 pieces) are arranged in the long side direction are arranged in the short direction in DMD 50. As shown in FIG. 8B, by slanting DMD 50, a pitch $P_2$ of the scanning trajectory of the exposure beam 53, which is formed by each micro-mirror, becomes narrower than a pitch $p_1$ of the scanning line in the case that DMD 50 is not slanted, so that the resolution is remarkably improved. On the other hand, since the slanted angle of DMD 50 is micro, a scanning width $W_2$ in the case that DMD 50 is slanted and a scanning width $W_1$ in the case that DMD 50 is not slanted are substantially the same.

The same scanning line is exposed in multiple (multiple exposures) with different micro-mirror columns. Thus, micro quantity of an exposure position can be controlled and the fine exposure can be realized by the multiple exposures. A joint portion between plural exposure heads arrayed in the main scanning direction can be connected without a step by the micro quantity of the exposure position control.

The same effect can be obtained in such a manner that each micro-mirror is staggered while the micro-mirror is shifted by a given interval in the direction crossed at right angles with the sub-scanning direction instead of the slanted DMD 50.

As shown in FIG. 9A, the fiber array light source 66 includes plural (for example, 6 pieces) laser modules 64, one end of a multimode optical fiber 30 is coupled to each laser module 64. The other end of the multimode optical fiber 30 is coupled to an optical fiber 31 in which a core diameter is the same as that of the multimode optical fiber 30 and a clad diameter is smaller than that of the multimode optical fiber 30, as shown in FIG. 9C, a laser outgoing portions 68 is formed in such a manner that the outgoing end portions (light-emitting point) of optical fibers 31 are arranged in one line along the main scanning direction crossed at right angles with the sub-scanning direction. As shown in FIG. 9D, the light-emitting points may be arranged in two lines along the main scanning direction.

As shown in FIG. 9B, the outgoing end portions of the optical fibers 31 are fixed while the outgoing end portions are sandwiched between two support plates 65 having a flat surface. A transparent protecting plate 63 such as glass is placed on the light outgoing side of the optical fiber 31 in order to protect the end face of the optical fiber 31. The protecting plate 63 may be placed bringing the protecting plate 63 close to the end face of the optical fiber 31, and placed so as to seal the end face of the optical fiber 31. However, light density is high, dust is easy to gather, and degradation easily occurs in the outgoing end portions of the optical fibers 31, the dust can be prevented from adhering to the end face and the degradation can be delayed by placing the protecting plate 63.

In this example, since the outgoing end portions of the optical fibers 31 having the smaller clad diameter are arranged in one line without the gap, the multimode optical fiber 30 is stacked between the two adjacent multimode optical fibers 30 in the larger clad diameter portion, the outgoing end portions of the optical fibers 31 coupled to the stacked multimode optical fibers 30 are arranged so as to be sandwiched between the two outgoing end portions of the optical fibers 31 coupled to the two adjacent multimode optical fibers 30 in the larger clad diameter portion.

Figure 10:
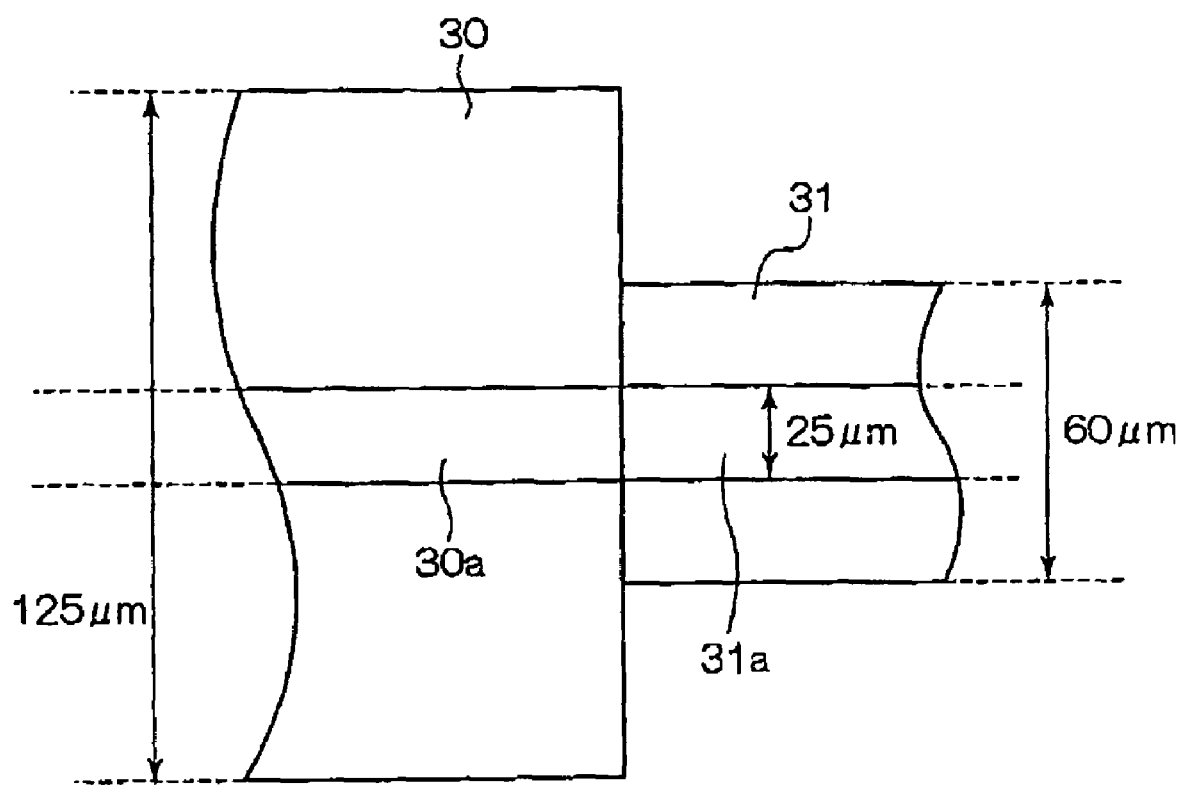
FIG. 10 shows the construction of a multimode type of optical fiber.

For example, as shown in FIG. 10, such optical fiber can be obtained by connecting coaxially the optical fiber 31 having the smaller clad diameter ranging from 1 to 30 cm to the leading end portion on the laser beam outgoing side of the multimode optical fiber 30, which has the larger clad diameter. In the two optical fibers, the incident end portion of the optical fiber 31 is melted and coupled to the outgoing end portion of the multimode optical fiber 30 so that central axes of both optical fibers are coincided. As described above, the diameter of a core 31a of the optical fiber 31 is the same as that of a core 30a of the multimode optical fiber 30.

A shorter optical fiber in which the optical fiber having the smaller clad diameter is fused to the optical fiber having the small length and the larger clad diameter may be coupled the outgoing end portion of the multimode optical fiber 30 through a ferule, an optical connector, or the like. By coupling detachably the optical fiber to the outgoing end portion of the multimode optical fiber 30 with the optical connector or the like, the leading end portion is easily changed when the optical fiber having the smaller clad diameter is broken, and maintenance cost for the exposure head can be reduced. Hereinafter, sometimes the optical fiber 31 is referred to as outgoing end portion of the multimode optical fiber 30.

Any of a step index type of optical fiber, a grated index type of optical fiber, and a multi-type of optical fiber can be used as the multimode optical fiber 30 and the optical fiber 31. For example, the step index type of optical fiber made by MITUBISHI CABLE INDUSTRIES, LTD. can be used. In the embodiment, the multimode optical fiber 30 and the optical fiber 31 are the step index type of optical fiber. In the multimode optical fiber 30, the clad diameter is 125 $\mu$m, the core diameter is 25 $\mu$m, NA is 0.2, and transmittance of the incident end face coating is not lower 99.5%. In the optical fiber 31, the clad diameter is 60 $\mu$m, the core diameter is 25 $\mu$m, and NA is 0.2.

Generally, in the laser beam of an infrared region, propagation loss is increased as the clad diameter of the optical fiber is decreased. Therefore, the preferable clad diameter is determined according to a wave range of the laser beam. However, the propagation loss is decreased with decreasing wavelength, in the laser beam having the wavelength of 405 nm which is emitted from GaN laser diode, even if a thickness of the clad ((clad diameter−core diameter/2) is decreased to about a half of the case that the infrared light having the wave range of 800 nm is propagated and the thickness of the clad is decreased to about a quarter of the case that the infrared light for communication having the wave range of 1.5 $\mu$m is propagated, the propagation is not substantially increased. Accordingly, the clad diameter can be reduced as small as 60 $\mu$m. The laser beam having the high brightness and high light density can be easily obtained by using the GaN laser diode.

However, the clad diameter of the optical fiber 31 is not limited to 60 $\mu$m. Though the clad diameter of the optical fiber used for the fiber light source of the related art is 125 $\mu$m, since the focal depth is deepened as the clad diameter is decreased, the clad diameter of the multimode optical fiber is preferably not more than 80 $\mu$m, more preferably not more than 60 $\mu$m, further more preferably not more than 40 $\mu$m. On the other hand, since it is necessary that the core diameter is at least 3 to 4 $\mu$m, the clad diameter of the optical fiber 31 is preferably not more than 10 $\mu$m.

Figure 11:
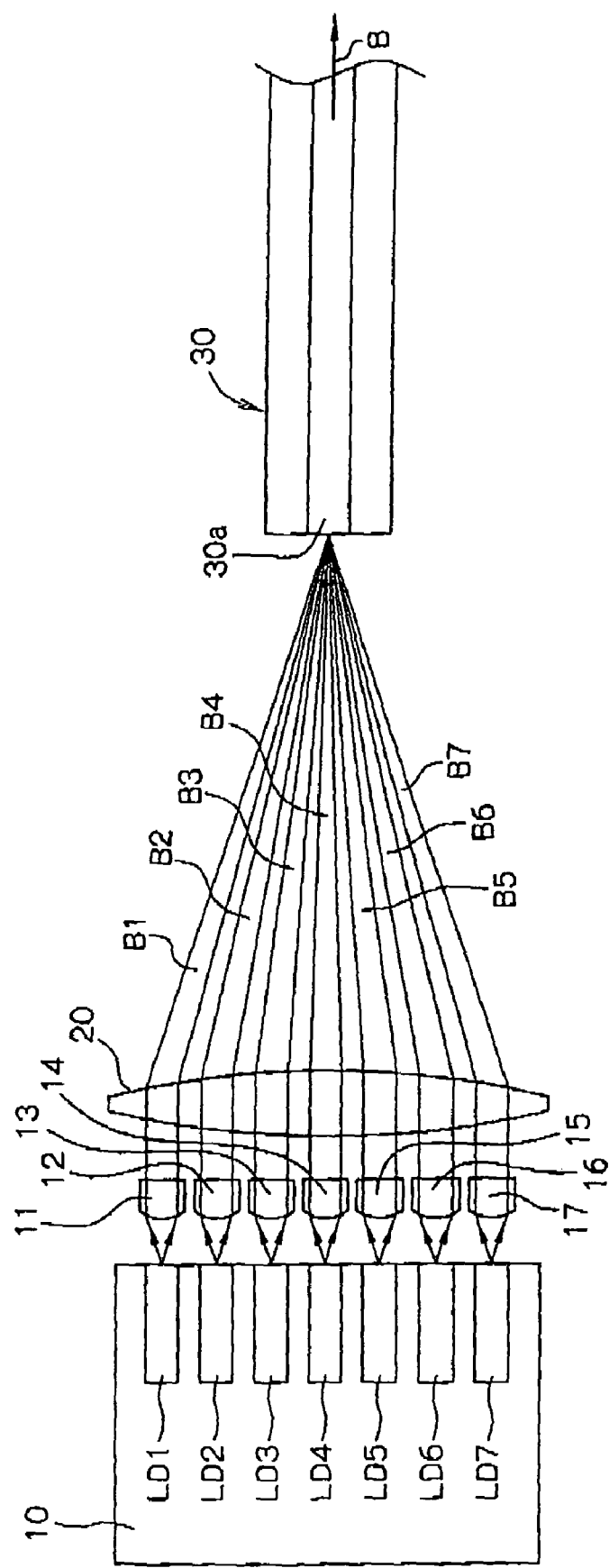
FIG. 11 is a plan view showing the construction of an incorporated laser light source.

The laser module 64 includes an incorporated laser light source (fiber light source) shown in FIG. 11. The incorporated laser light source includes plural (for example, 7 pieces) chip-shaped transverse multimode type or single mode type of GaN laser diodes LD1, LD2, LD3, LD4, LD5, LD6, and LD7 which are arranged and fixed on a heat block 10, collimator lenses 11, 12, 13, 14, 15, 16, and 17 which are provided corresponding to each of the GaN laser diodes LD1 to LD7, a condenser lens 20, and the one multimode optical fiber 30. The number of the laser diodes is not limited to 7. For example, 20 laser diode beams can be incident to the multimode optical fiber in which the clad diameter is 60 $\mu$m, the core diameter is 50 $\mu$m, and NA is 0.2, so that the necessary light intensity of the exposure head can be realized and the number of optical fibers can be reduced.

All oscillation wavelengths of the GaN laser diodes LD1 to LD7 are common (for example, 405 nm), and all maximum outputs are also common (for example, 100 mW in the multimode laser and 30 mW in the single mode laser). A laser having the wave range of 350 to 450 nm and the oscillation wavelength except 405 nm may be used as the GaN laser diodes LD1 to LD7.

Figure 12:
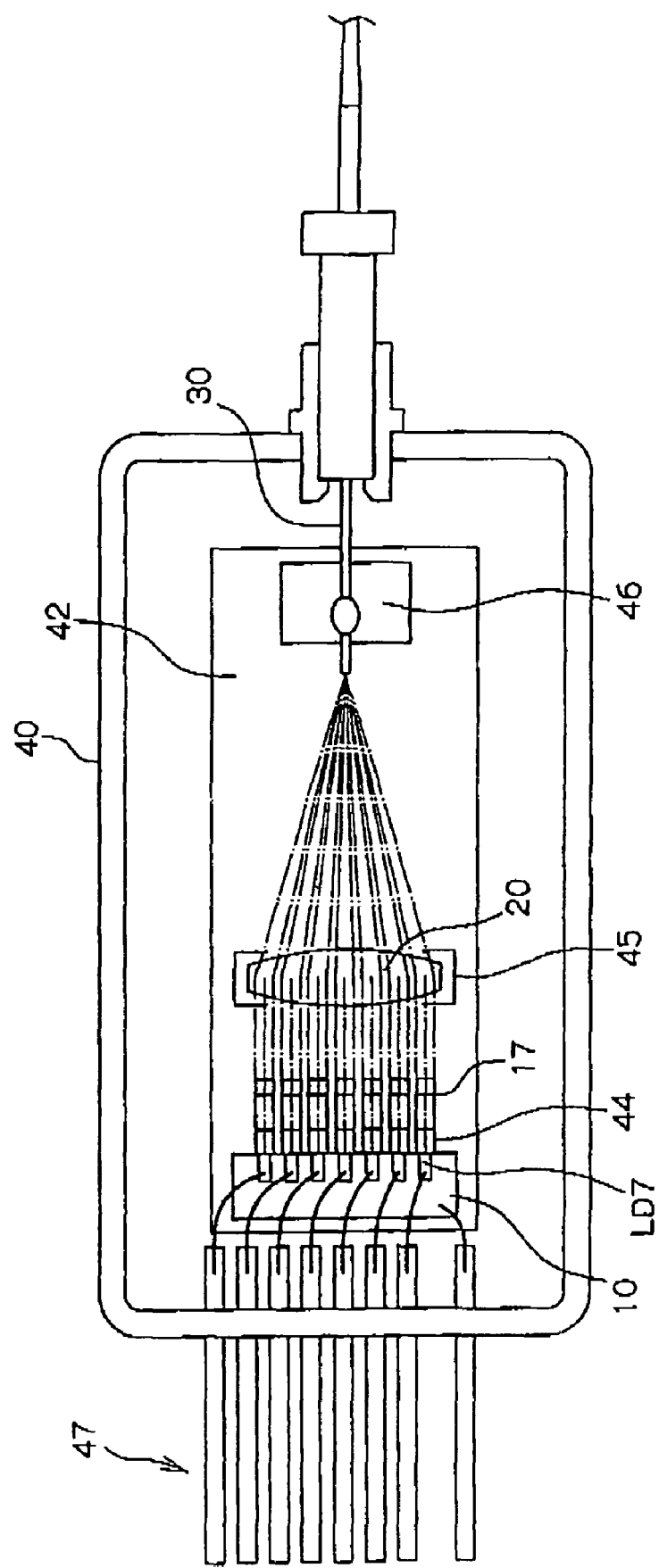
FIG. 12 is a plan view showing the construction of a laser module.
Figure 13:
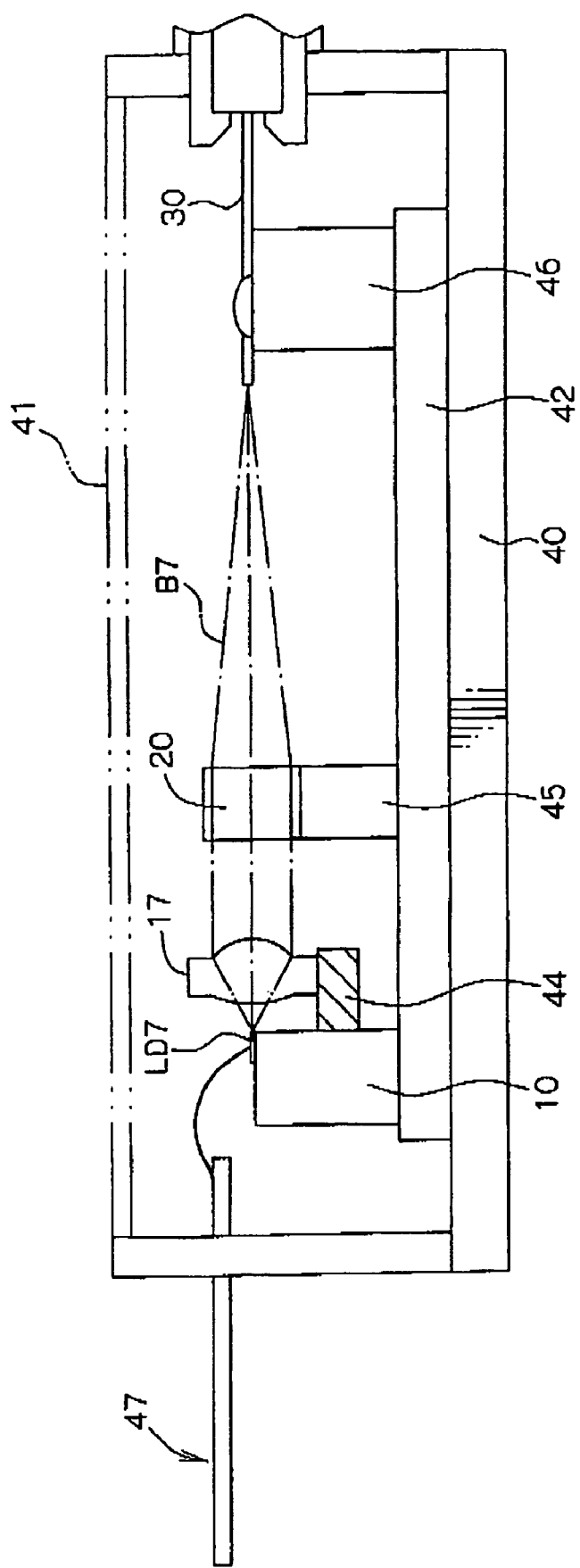
FIG. 13 is a side view showing the construction of the laser module shown in FIG. 12.

As described in FIGS. 12 and 13, the above-described incorporated laser light source and other optical elements are stored in a box-shaped package 40 whose upper portion is opened. The package 40 includes a package cover 41 so as to be formed to close the opening, the incorporated laser light source is hermetically sealed in the closed space (sealed space) formed with the package 40 and the package cover 41 in such a manner that sealing gas is introduced after degassing and the opening of the package 40 is closed with the package cover 41.

A base plate 42 is fixed to a bottom surface of the package 40, and an upper surface of the base plate 42 is equipped with the above-described heat block 10, a condenser lens holder 45 which holds the condenser lens 20, and a fiber holder 46 which holds the incident end portion of the multimode optical fiber 30. The outgoing end portions of the multimode optical fiber 30 are drawn from an aperture formed in a wall of the package 40 outward the package.

A side face of the heat block 10 is equipped with a collimator lens holder 44, the collimator lenses 11 to 17 are held with the collimator lens holder 44. An aperture is formed in a side wall of the package 40, a leads 47 which supply driving current to the GaN laser diodes LD1 to LD7 is drawn through the aperture to the outside of the package.

In FIG. 13, in order to avoid complication of the figure, only the GaN laser diode LD7 is indicated by the number in the plural GaN laser diodes and only the collimator lens 17 is indicated by the number in the plural collimator lenses.

Figure 14:
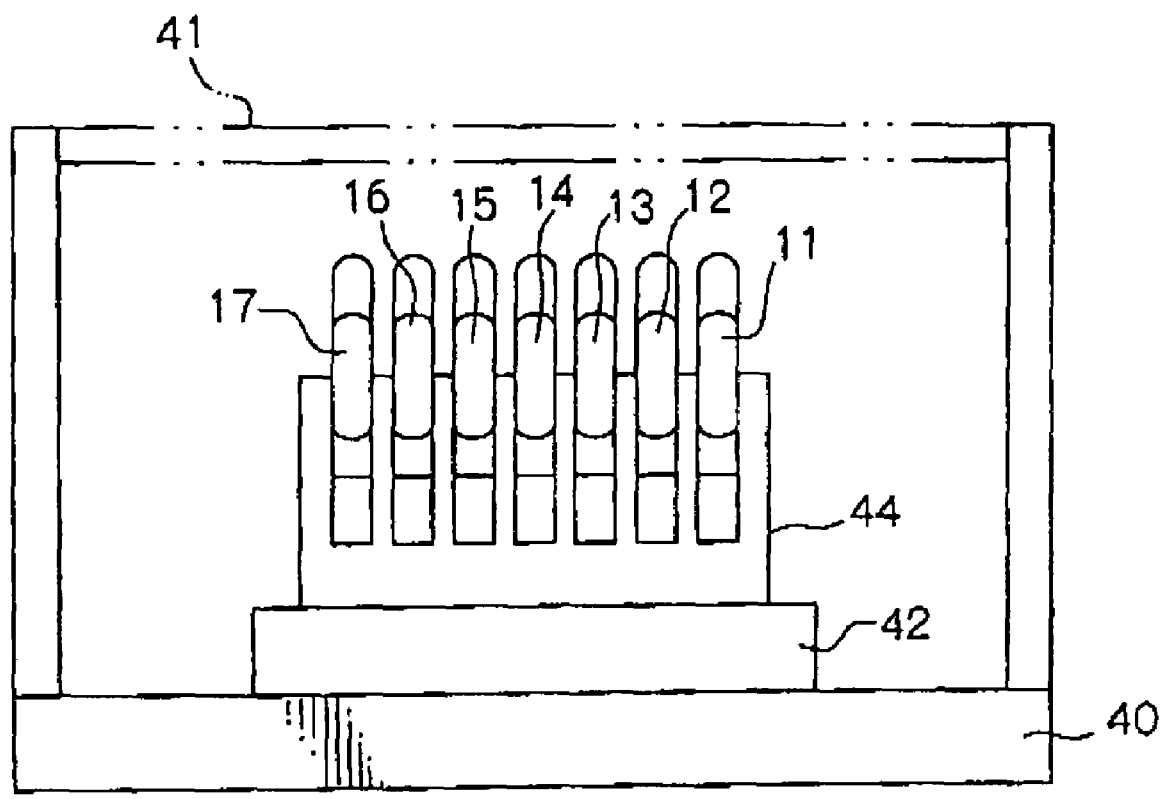
FIG. 14 is a partially side view showing the construction of the laser module shown in FIG. 12.

FIG. 14 shows a front shape of a mounting portion of the collimator lenses 11 to 17. Each of the collimator lenses 11 to 17 is formed in the long and thin shape in which a region including the optical axis of a circular lens having an aspheric surface is cut by a parallel plane. The long and thin-shaped collimator lens can be formed, e.g., by molding resin or optical glass. In the collimator lenses 11 to 17, the collimator lenses 11 to 17 are closely arranged in the array direction of the light emitting-point so that the length direction is crossed at right angles with the array direction (a lateral direction in FIG. 14) of the light-emittingg point of the GaN laser diodes LD1 to LD7.

On the other hand, the laser, in which a light-emitting width has an active layer of 2 $\mu$m and each of laser beams B1 to B7 are emitted in the state in which spreading angles of the parallel and perpendicular directions to the active layer are 10° and 30° respectively, is used as the GaN laser diodes LD1 to LD7. The GaN laser diodes LD1 to LD7 are arrayed so that the light emitting points are arranged in one line in the direction parallel to the active layer.

Accordingly, the laser beams B1 to B7 emitted from each light-emitting point is incident to the collimator lenses 11 to 17 in the state in which the direction of the larger spreading angle corresponds to the lengthwise direction and the direction of the smaller spreading angle corresponds to the width direction (direction crossed at right angles with the lengthwise direction). That is to say, the width of each collimator lenses 11 to 17 is 1.1 mm and the length of each collimator lenses 11 to 17 is 4.6 mm, beam diameters in horizontal and vertical directions of the laser beams B1 to B7 incident to the collimator lenses 11 to 17 are 0.9 mm and 2.6 mm respectively. In each of collimator lenses 11 to 17, a focal length $f_1$ is 3 mm, NA is 0.6, and a lens arranging pitch is 1.25 mm.

The condenser lens 20 is formed in the long and thin shape in which a region including the optical axis of a circular lens having an aspheric surface is cut by a parallel plane. The condenser lens 20 is long in the array direction of the collimator lenses 11 to 17, i.e., the horizontal direction, and short in the direction perpendicular to the array direction. In condenser lens 20, a focal length $f_2$ is 23 mm and NA is 0.2. The condenser lens 20 is also formed, e.g., by molding the resin and the optical glass.

(Operation of the Exposure Apparatus)

Operation of the above-described exposure apparatus will be described below.

In each exposure head 166 of the scanner 162, each of the laser beams B1, B2, B3, B4, B5, B6, and B7 emitted from each of the GaN laser diodes L1 to L7 constituting the incorporated laser light source of the fiber array light source 66 with a divergent state is paralleled with the corresponding collimator lenses 11 to 17. The paralleled laser beams B1 to B7 are condensed with the condenser lens 20 and converged on the incident end face of the core 30a of the multimode optical fiber 30.

In the embodiment, a beam-condensing optical system is formed with the collimator lenses 11 to 17 and the condenser lens 20, an incorporated optical system is formed with the beam-condensing optical system and the multimode optical fiber 30. That is to say, the laser beams B1 to B7 condensed with the condenser lens 20 are incident to the core 30a of the multimode optical fiber 30 to be propagated into the optical fiber, and incorporated into one laser beam B to be emitted from the optical fiber 31 coupled to the outgoing end portion of the multimode optical fiber 30.

In each laser module, coupling efficiency of the laser beams B1 to B7 to the multimode optical fiber 30 is 0.85, when each output of the GaN laser diodes L1 to L7 is 30 mW, the incorporated laser beam B having the output of 180 mW (=30 mW×0.85×7) can be obtained for each optical fiber 31 arranged in the shape of the array. Accordingly, the output is about 1 W (=180 mW×6) at the laser outgoing portion 68 where the six optical fibers 31 are in the shape of the array.

The light-emitting points having high brightness are arranged in one line along the main scanning direction at the laser outgoing portion 68 of the fiber array light source 66. Since the fiber light source of the related art, in which the laser beam from the single laser diode is coupled to one optical fiber, is the low output, the desired output can not be obtained unless many columns of the laser light source are arranged, however, since the incorporated laser light source used in the embodiment is the high output, the desired output can be obtained with few columns of the laser light source, e.g., only one column of the laser light source.

For example, in the fiber light source of the related art in which the laser diode is coupled to the optical fiber with 1:1, normally the laser having the output of about 30 mW is used as the laser diode and the multimode optical fiber in which the core diameter is 50 $\mu$m, the clad diameter is 125 $\mu$m, and NA (numerical aperture) is 0.2 is used as the optical fiber. When the output of about 1 W is obtained, it is necessary to bundle the 48 multimode optical fibers and the area of the light-emitting region is 0.62 mm$^2$ (0.675 mm×0.925 mm), so that the brightness at the laser outgoing portion 68 is $1.6 \times 10^5$ (W/m$^2$) and the brightness per one optical fiber is $3.2 \times 10^6$ (W/m$^2$).

On the other hand, as described above, the output of about 1 W can be obtained in the embodiment. Since the area of the light-emitting region is 0.0081 mm$^2$ (0.325 mm×0.025 mm) at the laser outgoing portion 68, the brightness at the laser outgoing portion 68 is $123 \times 10^6$ (W/m$^2$), so that the high brightness about 80 times the related art can be achieved. Since the brightness per one optical fiber is $90 \times 10^6$ (W/m$^2$), the high brightness about 28 times the related art can be achieved.

Figure 15A:
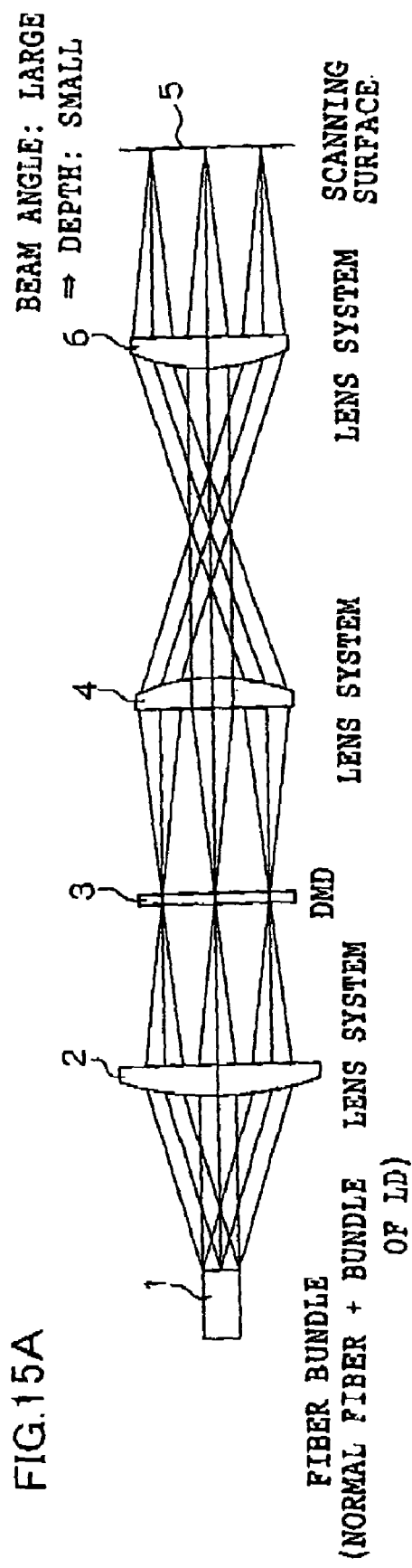
FIG. 15A is a sectional view along the optical axis, which shows a focal depth in the exposure apparatus of the related art.
Figure 15B:
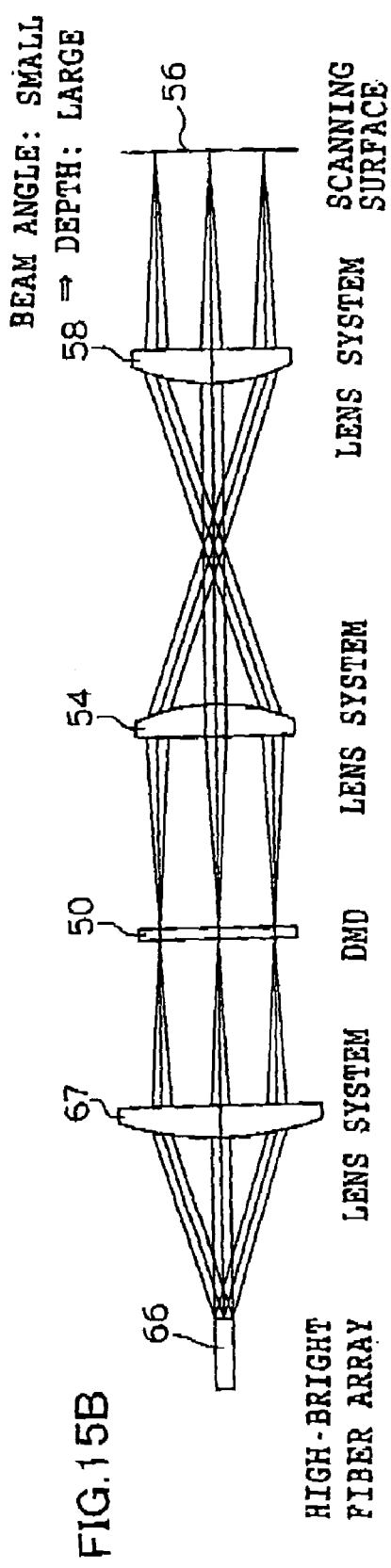
FIG. 15B is a sectional view along the optical axis, which shows the focal depth in the exposure apparatus according to the first embodiment.

Referring to FIGS. 15A and 15B, difference in the focal depth between the exposure heads of the related art and the embodiment will be described. The diameter in the sub-scanning direction of the light-emitting region is 0.675 mm in a bundle-shaped fiber light source in the exposure head of the related art, and the diameter in the sub-scanning direction of the light-emitting region is 0.025 mm in the fiber array light source in the exposure head of the embodiment. As shown in FIG. 15A, since the light-emitting region of a light source 1 (bundle-shaped fiber light source) is large in the exposure head of the related art, the angle of the light flux incident to DMD 3 becomes large, as a result, the angle of the light flux incident to a scanning surface 5 becomes large. Consequently, the beam diameter is easy to fatten for the beam-condensing direction (shift in the focusing direction).

On the other hand, as shown in FIG. 15B, since the diameter in the sub-scanning direction of the light-emitting region of the fiber array light source 66 is small in the exposure head of the embodiment, the angle of the light flux passing the lens system 67 and being incident to DMD 50 becomes small, as a result, the angle of the light flux incident to the scanning surface 56 becomes large. That is to say, the focal depth is deepened. In this embodiment, the diameter in the sub-scanning direction of the light-emitting region is about 30 times the related art, the focal depth corresponding to almost a diffraction limit can be obtained. Accordingly, it is preferable for the exposure of a micro spot. Effect on the focal depth is remarkable and effective as the necessary light intensity of the exposure head is enlarged. In the embodiment, the size of one pixel projected onto the exposure surface is 10 $\mu$m by 10 $\mu$m. Though DMD is a reflection type of spatial optical modulator, a development is used for explanation of optical relation in FIGS. 15A and 15B.

The image data according to an exposure pattern is inputted to the controller which is connected to DMD 50 and not shown, and temporarily stored in the frame memory in the controller. The image data is the data density of each pixel constituting the image is indicated by binary value (presence or absence of recording of a dot).

The stage 152, in which the photosensitive material 150 is absorbed on the surface, is moved at constant velocity from an upstream side of the gate 160 to a downstream side along the guide 158 with the driving device which is not shown. When the stage 152 passes below the gate 160, the leading end of the photosensitive material 150 is detected with the detecting sensor 164 attached to the gate 160, the plural lines of image data stored in the frame memory are sequentially read, and the control signal is generated in each exposure head 166 on the basis of the image data read with the data processing portion. Each of the micro-mirrors of DMD 50 is on-off controlled in each exposure head 166 on the basis of the generated control signal with the mirror driving control portion.

When the laser beam is irradiated from the fiber array light source 66 to DMD 50, the laser beam reflected in the case that the micro-mirror of the DMD 50 is on-state is focused on the exposed surface 56 of the photosensitive material 150 with the lens systems 54 and 58. In such way, the laser beam emitted from the fiber array light source 66 is turned on and off in each pixel and the photosensitive material 150 is exposed in the almost same pixel unit (exposure area 168) as the number of using pixels of DMD 50. The photosensitive material 150 is sub-scanned in the reverse direction of the stage moving direction with the scanner 162 in such a manner that the photosensitive material 150 is moved with the stage 152 at constnt speed, and a band-shaped exposed region 170 is formed in each exposure head 166.

Figure 16A:
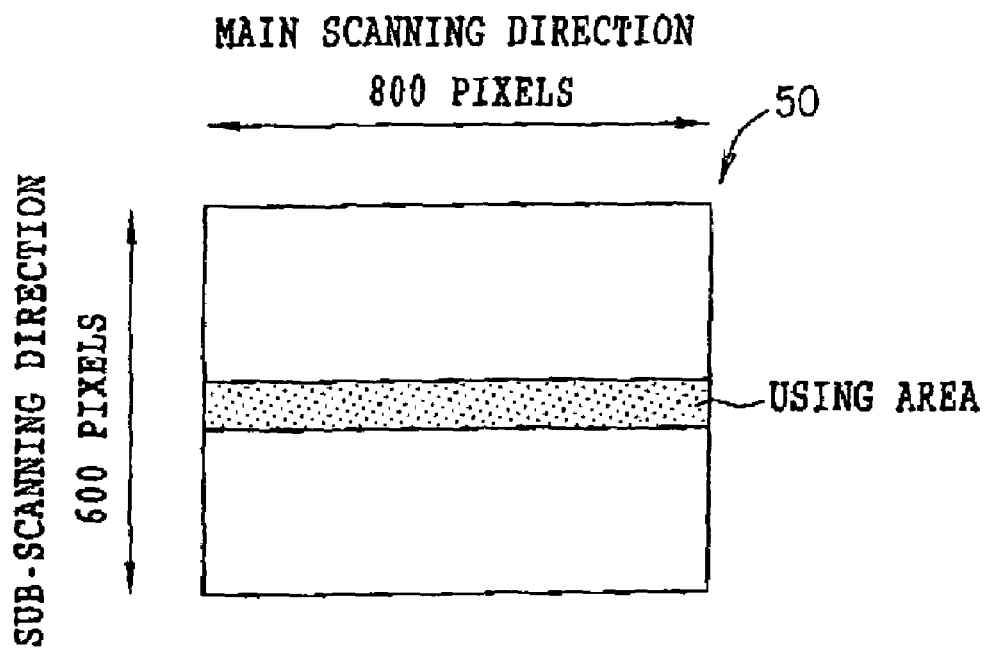
FIG. 16A shows an example of a usage area of DMD.
Figure 16B:
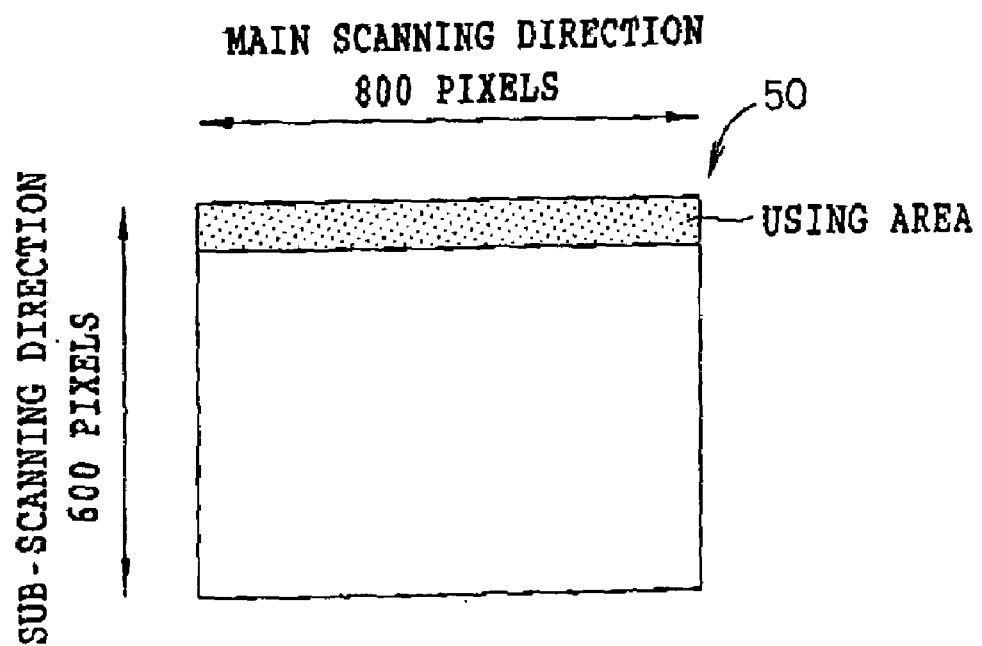
FIG. 16B shows another example of the usage area of DMD.

As shown in FIGS. 16A and 16B, in the embodiment, 600 sets of the micro-mirror column, in which the 800 pieces of the micro-mirror are arranged in the main scanning direction, are arranged in the sub-scanning direction in DMD 50, however, the control is performed so that only a part of the micro-mirror columns (for example, 800 pieces×100 columns) are driven with the controller.

As shown in FIG. 16A, the micro-mirror column arranged in the central portion of DMD 50 may be used, or, as shown in FIG. 16B, the micro-mirror column arranged in the end portion of DMD 50 may be used. When defect is generated in a part of the micro-mirrors, the micro-mirror column which is used may be appropriately changed according to conditions such that the micro-mirror column in which the defect is not generated is used.

Since there are limitations of the data processing speed of DMD 50 and decision of modulating speed per one line is proportional to the number of the using pixels, the modulating speed per one line is by using the part of the micro-mirror columns. On the other hand, it is not necessary to use all the pixels in the sub-scanning direction in the case of the exposure method in which the exposure head is continuously moved relative to the exposure surface.

When the 300 sets of the micro-mirror column in the 600 sets are used, the two times modulating speed can be achieved compared with the case that in which all the 600 sets are used. When the 200 sets of the micro-mirror column in the 600 sets are used, the three times modulating speed can be achieved compared with the case that in which all the 600 sets are used. That is to say, the region of 500 mm in the sub-scanning direction can be exposed in 17 seconds. Furthermore, when only the 100 sets of the micro-mirror column in the 600 sets are used, the six times modulating speed can be performed. That is to say, the region of 500 mm in the sub-scanning direction can be exposed in 9 seconds.

It is preferable that the number of using micro-mirror columns, i.e., the number of micro-mirrors arranged in the sub-scanning is not lower than 10 and not more than 200, more preferably not lower than 10 and not more than 100. Because the area per one micro-mirror corresponding to one pixel is 15 $\mu$m by 15 $\mu$m, converting the area into the occupying area of DMD 50, it is preferable that the area is not lower than 12 mm by 150 $\mu$m and not more than 12 mm by 3 mm, more preferably not lower than 12 mm by 150 $\mu$m and not more than 12 mm by 1.5 mm.

Figure 17A:
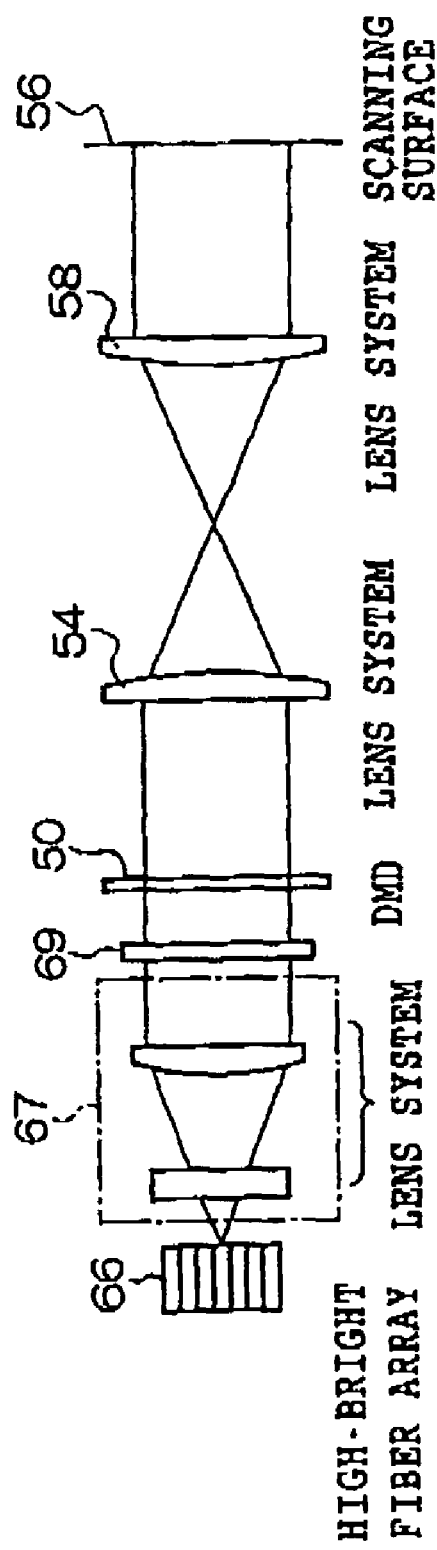
FIG. 17A is a side view when the usage area of DMD is appropriate.
Figure 17B:
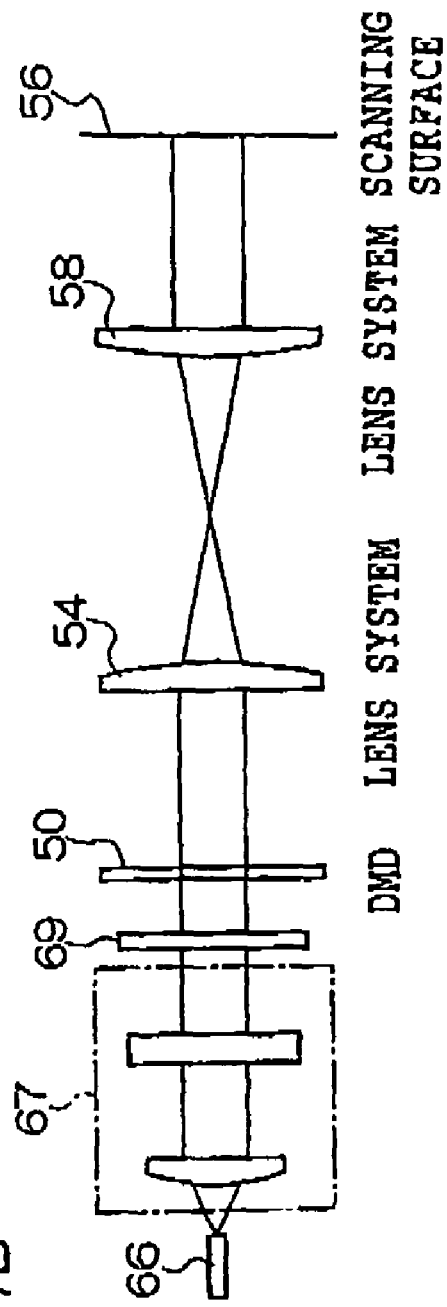
FIG. 17B is a sectional view in the sub-scanning direction along the optical axis of FIG. 17A.

When the number of using micro-mirror column is within the above-described range, as shown in FIGS. 17A and 17B, the laser beam emitted from the fiber array light source 66 can be substantially paralleled with the lens system 67 and irradiated to DMD 50. It is preferable that the irradiating area where the laser beam is irradiated with DMD 50 corresponds to the using area of DMD 50. When the irradiating area is wider than the using area, usable efficiency of the laser beam is decreased.

Though it is necessary that the diameter in the sub-scanning direction of the light beam condensed on DMD 50 is decreased according to the number of micro-mirrors arranged in the sub-scanning direction with the lens system 67, when the number of using micro-mirrors is less than 10, it is not preferable because the angle of the light flux incident to DMD 50 and the focal depth of the light beam shallows in the scanning surface 56. When the number of using micro-mirrors is not more than 200, it is preferable in view of the modulating speed. However DMD 50 is the reflection type of spatial optical modulator, the development is used for explanation of the optical relation in FIGS. 17A and 17B.

When the sub scanning of the photosensitive material 150 with the scanner 162 is finished and the rear end of the photosensitive material 150 is detected with the detecting sensor 164, the stage 152 is returned to a home position located on the upstream side of the gate 160 along the guide 158 with the driving device which is not shown, and then moved again from the upstream side to down stream side of the gate 160 along the guide 158 at constant speed.

As described above, though the exposure apparatus of the embodiment includes DMD in which 600 sets of the micro-mirror column, in which the 800 pieces of the micro-mirror are arranged in the main scanning direction, are arranged in the sub-scanning direction, the control is performed so that only a part of the micro-mirror columns are driven with the controller, the modulating speed per one line is increased compared with the case that all the micro-mirror columns are driven. Consequently, the exposure can be performed at high speed.

The fiber array light source having the high brightness, in which the outgoing end portions of the optical fiber of the incorporated laser light source are arranged in the shape of the array, is used as the light source irradiating DMD, so that the exposure apparatus having the high output and the deep focal depth can be realized. Furthermore, the number of fiber light sources necessary for obtaining the desired output is decreased by enlarging the output of each fiber light source, so that cost-reduction of the exposure apparatus can be achieved.

Particularly, in the embodiment, since the clad diameter of the outgoing end of the optical fiber is smaller than that of the incident end, the diameter of the light-emitting portion becomes smaller, so that the high brightness of the fiber array light source is achieved. Consequently, the exposure apparatus having the deeper focal depth can be realized. For example, even in the case of the exposure of the super-fine resolution in which the beam diameter is not more than 1 $\mu$m and the resolution is not more 0.1 $\mu$m, the deep focal depth can be obtained and the super-fine exposure can be performed at high speed. Accordingly, it is preferable to the exposure process for a thin film transistor (TFT) necessary for the high resolution.

Modification and the like of the above-described apparatus will be described below.

(Application of the Exposure Apparatus)

The above-described exposure apparatus can be preferably used for applications such as the exposure of a dry film resist (DFR) in the manufacturing process of a printed wiring board (PWB), the formation of a color filter in the manufacturing process of a liquid crystal device (LCD), the exposure of DFR in the manufacturing process of TFT, and the exposure of DFR in the manufacturing process of a plasma display panel (PDP).

Further, the exposure apparatus can be used for various kinds of laser machining such as laser abrasion in which part of the material is removed by evaporating and flying the material with the laser irradiation, sintering, and lithography. Since the exposure apparatus is the high output and the exposure can be performed at the high speed and the long focal depth, the exposure apparatus can be used for micromachining such as the laser abrasion. For example, the exposure apparatus can be used in order that the resist is removed according to the pattern with the laser abrasion instead of the development processing and PWB is formed, or the pattern of PWB is directly formed with the laser abrasion without using the resist. The exposure apparatus can be also used for the formation of a micro channel having a channel width of several tens $\mu$m in a lob-on chip in which mixture, reaction, separation, detection, and the like of many solutions are integrated on a glass or plastic chip.

In the exposure apparatus, since the GaN laser diode is used as the fiber array light source, the exposure apparatus can be preferably used for the laser machining. That is to say, the short pulse operation can be performed in the GaN laser diode, so that sufficient power for the laser abrasion can be obtained. Unlike a solid state laser whose operating speed is slow, the high speed operation can be performed at a repeating frequency of about 10 MHz because of the laser diode, so that the high speed exposure can be performed. Further, metal has large light absorption factor of the laser beam near the wavelength of 400 nm, and it is easy to transform the laser beam into thermal energy, so that the laser abrasion and the like can be performed at high speed.

When a liquid resist used for the patterning of TFT or the liquid resist used for the patterning of the color filter is exposed, in order to eliminate a decrease in sensitivity (desensitization) caused by oxygem inhibition, it is preferable to expose the material which is exposed in a nitrogen atmosphere. The oxygen inhibition of photo-induced polymerization reaction is suppressed by exposing the material in the nitrogen atmosphere, the sensitivity of the resist is increased, and the high speed exposure can be performed.

Both a photon mode photosensitive material in which information is directly recorded with the exposure and a heat mode photosensitive material in which the information is recorded with heat generated by the exposure are used for the exposure apparatus. When the photon mode photosensitive material is used, the GaN laser diode, a wavelength conversion type of solid state laser, or the like is used as the laser device, when the heat mode photosensitive material is used, an AlGaAs laser diode (infrared laser) or the solid state laser is used as the laser device.

(Other Spatial Light Modulator)

However, the case in which the micro-mirror of DMD is partially driven was described in the above-described embodiment, even if long and thin DMD, in which many micro-mirrors whose angle of the reflection plane is changeable according to each control signal are two-dimensionally arranged, is used on the substrate whose length of the direction corresponding to a predetermined direction is longer that that of the direction intersecting with the predetermined direction, the modulating speed can be also increased in the same way, because the number of micromirrors controlling the angle of the reflection plane is reduced.

Though the exposure head including DMD of the spatial light modulator was described in the above-described embodiment, for example, even in the case that a MEMS (Micro Electro Mechanical Systems) type of spatial light modulator (SLM), or the spatial light modulator except the MEMS type of spatial light modulator such as an optical device (PLZT device) modulating the transmitted light with electro-optic effect, and a liquid crystal shutter (FLC) is used, the modulating speed per one pixel and per one main scanning line can be increased by using a part of the pixel portions for the entire pixel portions arranged on the substrate, so that the same effect can be obtained.

A grating light valve (GLV) in which many movable gratings which is provided with a ribbon-shaped reflection plane and movable according to the control signal and many fixed gratings provided with the ribbon-shaped reflection plane are alternately arranged in parallel, or a light valve array in which the GLV devices are arranged in the shape of the array can be used as the MEMS type of spatial light modulator.

MEMS is a generic name of micro-system in which the sensor, actuator, and control circuit of a micro-size are integrated with the micromachining technology, the MEMS type of spatial light modulator means the spatial light modulator driven by the electromechanical operation utilizing electrostatic power.

(Other Exposure Method)

Figure 18:
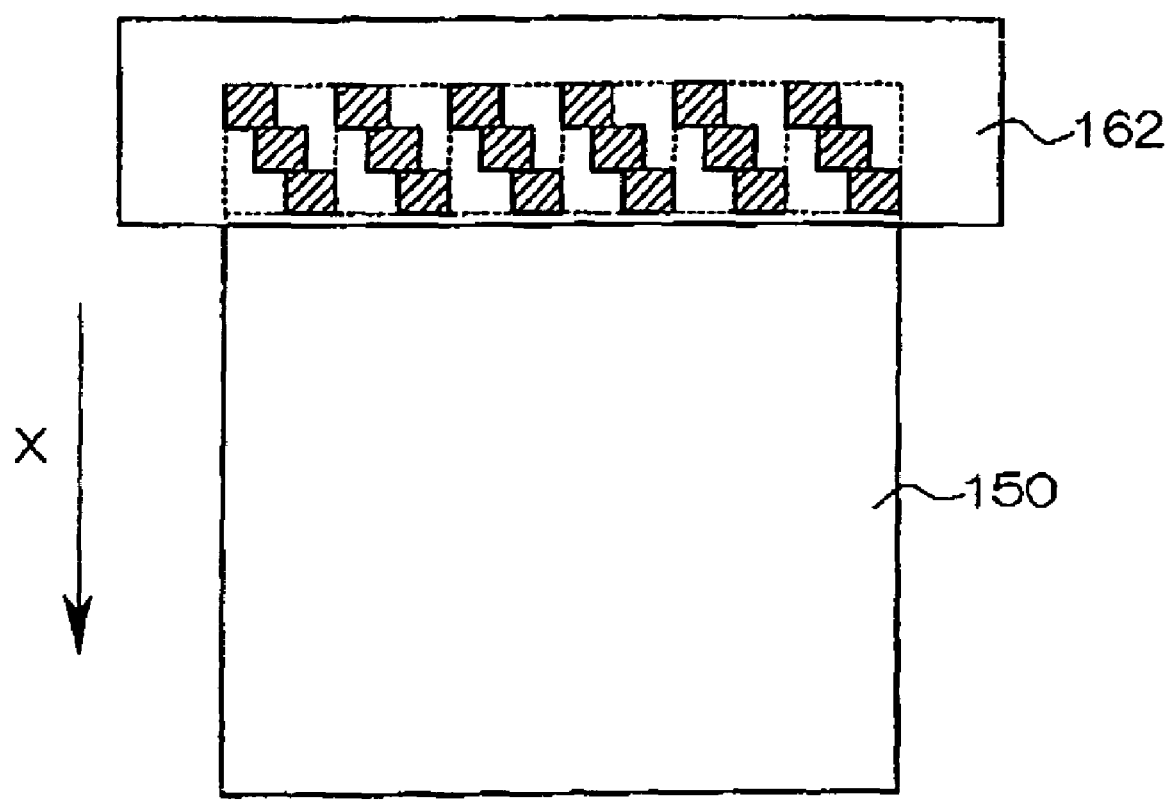
FIG. 18 is a plan view showing for illustrating an exposure method in which a photosensitive material is exposed in single scanning of the scanner.
Figure 19A:
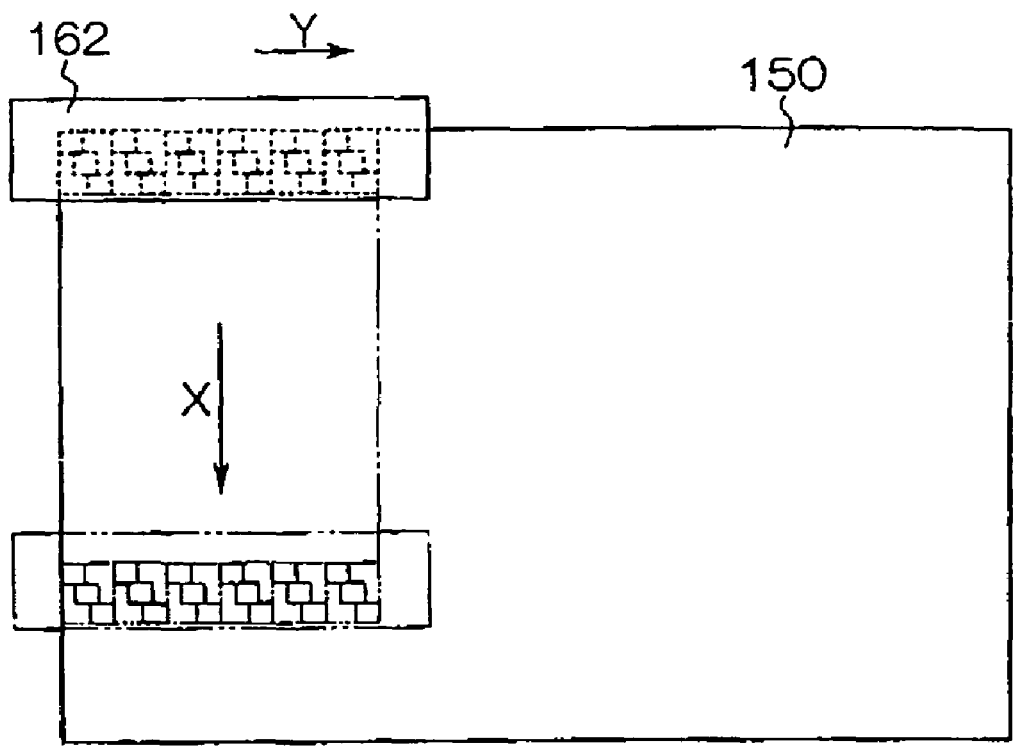
FIGS. 19A and 19B are plan views for illustrating the exposure method in which the photosensitive material is exposed in multiple scanning of the scanner.
Figure 19B:
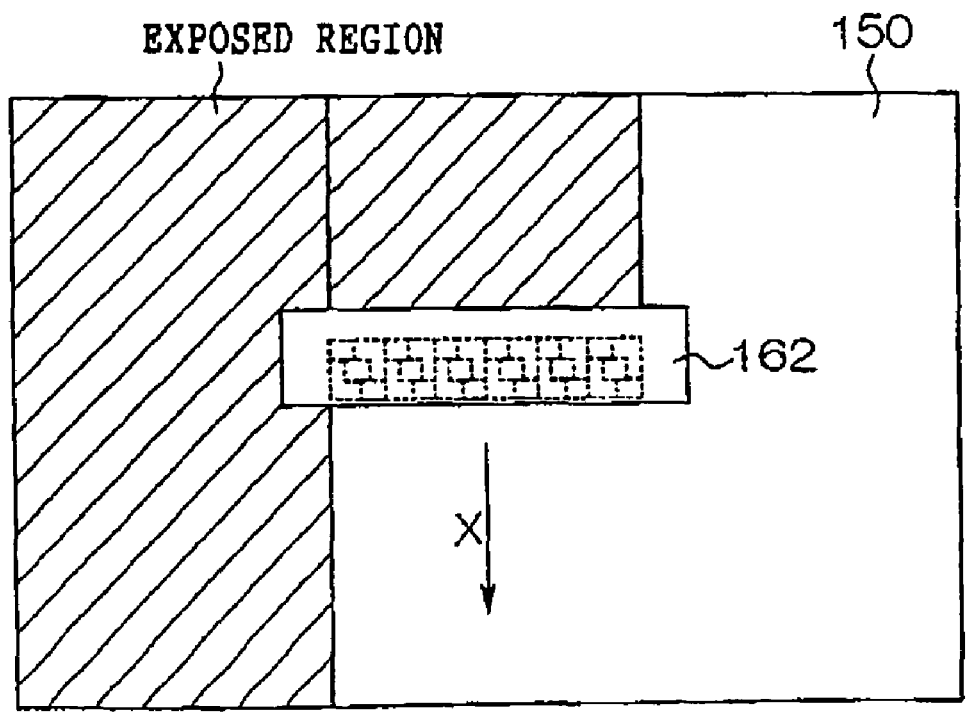

As shown in FIG. 18, similarly to the above-described embodiment, the entire surface of the photosensitive material 150 may be exposed in the one time scanning toward the X-direction with the scanner 162, as shown in FIGS. 19A and 19B, the entire surface of the photosensitive material 150 may be exposed in the plural times scanning by repeating the scanning and the movement such that the scanner 162 is moved by one step and the scanning toward the X-direction is performed after the photosensitive material 150 is scanned toward the X-direction with the scanner 162. In the embodiment, the scanner includes 18 exposure heads 166.

(Other Laser Devices (Light Sources))

Though the case in which the fiber array light source including the plural incorporated laser light source is used was described in the above-described embodiment, the laser device is not limited to the fiber array light source in which the incorporated laser light source is arrayed. For example, the fiber array light source in which the fiber light source including one optical fiber emitting the laser beam incident from the single laser diode having one light-emitting point is arrayed can be used. However, it is more preferable that the incorporated laser light source which can take the deep focal depth is used.

Figure 20:
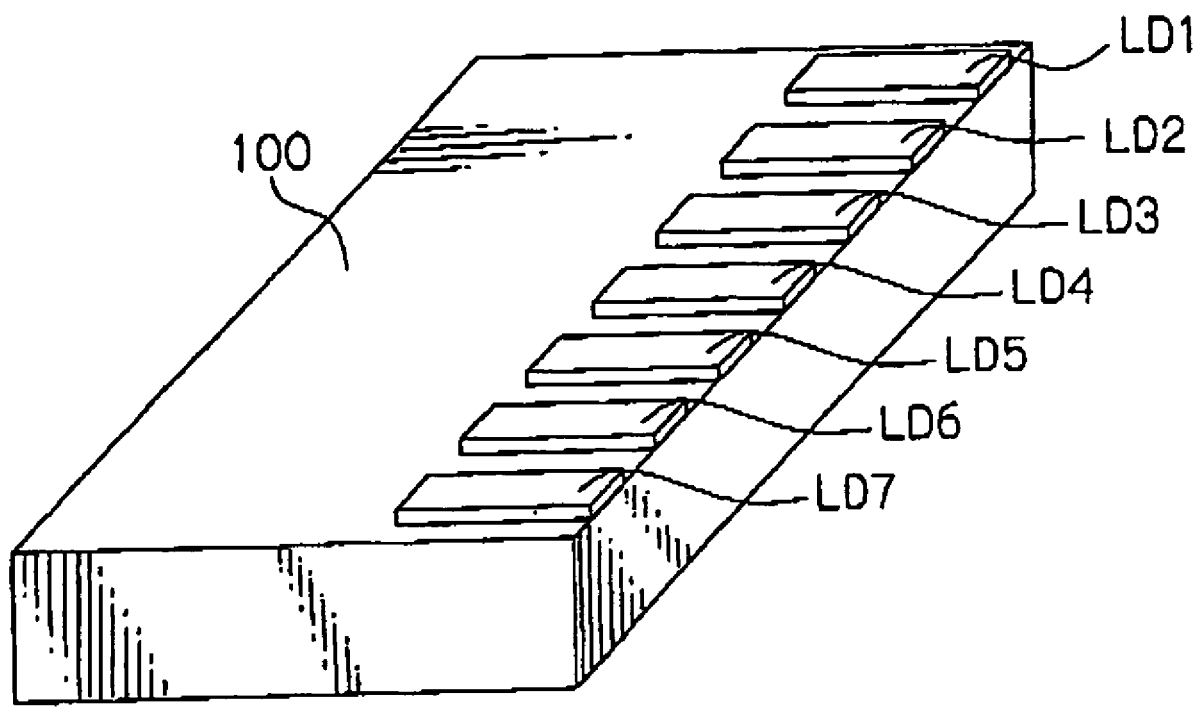
FIG. 20 is a perspective view showing the construction of a laser array.
Figure 21A:
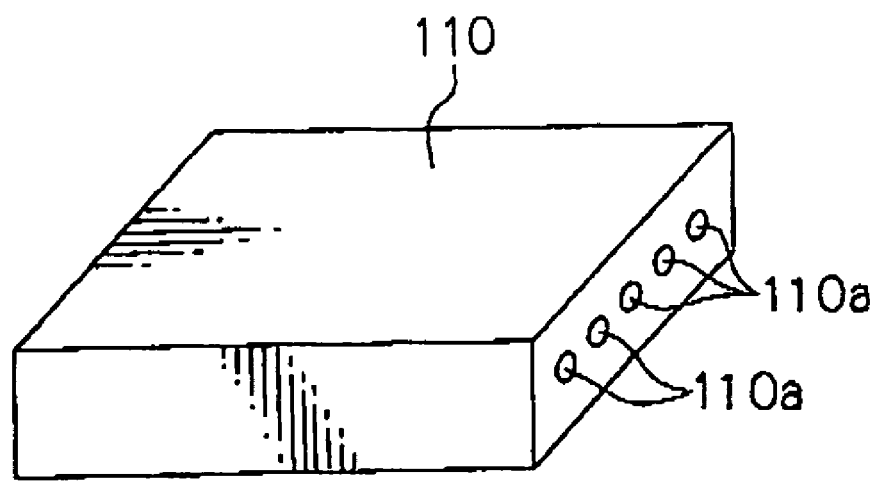
FIG. 21A is a perspective view showing the construction of a multi-cavity laser.

For example, as shown in FIG. 20, the laser array in which plural (for example, 7 laser diodes) chip-shaped laser diodes LD1 to LD7 are arranged on a heat block 100 can be used as the light source including the plural light-emitting points. Also, as shown in FIG. 21A, a chip-shaped multi-cavity laser 110 in which plural (for example, 5 points) light-emitting points 110a are arranged in a predetermined direction is known. Since the light-emitting points can be arranged with good accuracy of position in the multi-cavity laser 110 compared with the arrangement of the chip-shaped laser diode, it is easy to incorporate the laser beam emitted from each light-emitting point. However, it is easy to generate deformation in the multi-cavity laser 110 during the manufacture of the laser when the number of light-emitting points is increased, so that it is preferable that the number of light-emitting points 110a is not more than 5.

Figure 21B:
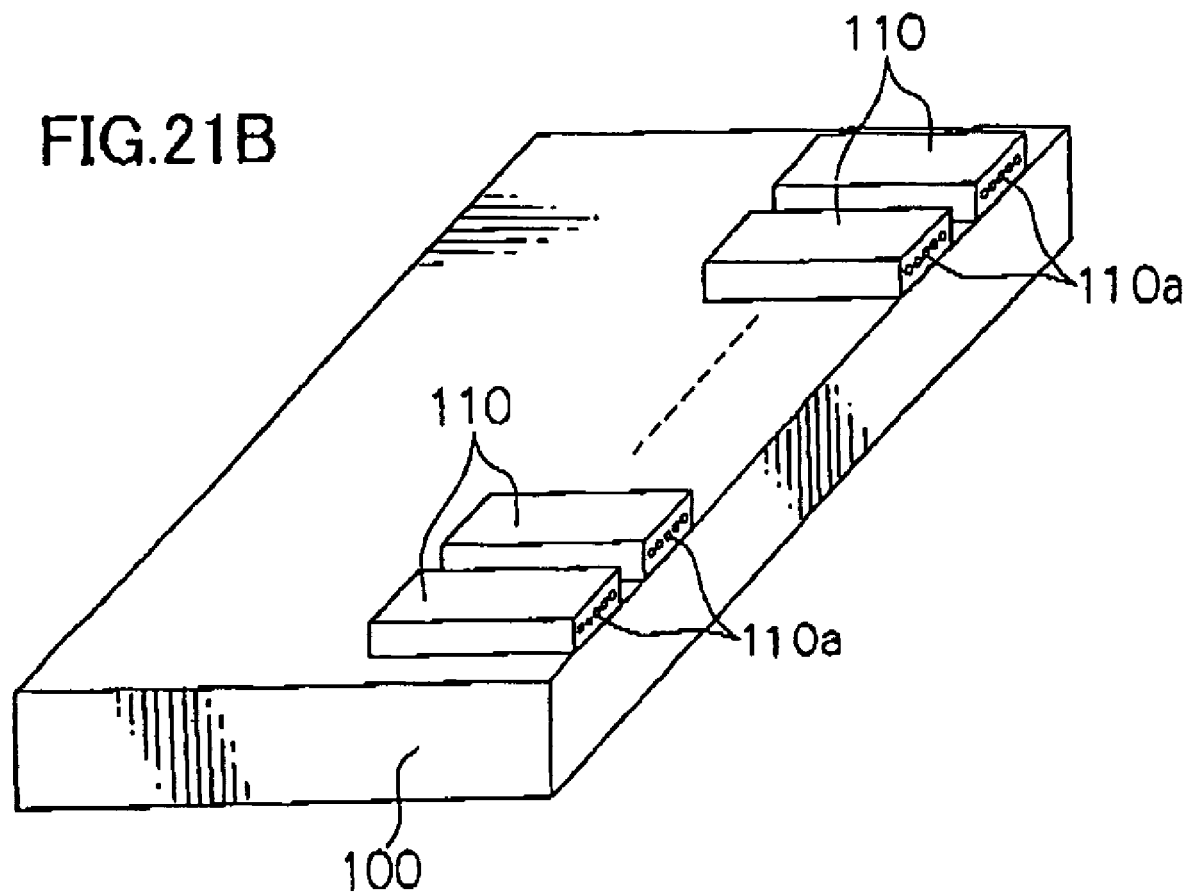
FIG. 21B is a perspective view of a multi-cavity laser array in which the multi-cavity lasers shown in FIG. 21A are arranged in the shape of an array.

In the exposure head of the invention, the multi-cavity laser 110 or, as shown in FIG. 21B, a multi-cavity laser array in which the plural multi-cavity lasers 110 are arranged on the heat block 100 in the same direction as the array direction of the light-emitting points 110a of each chip can be used as the laser device (light source).

Figure 22:
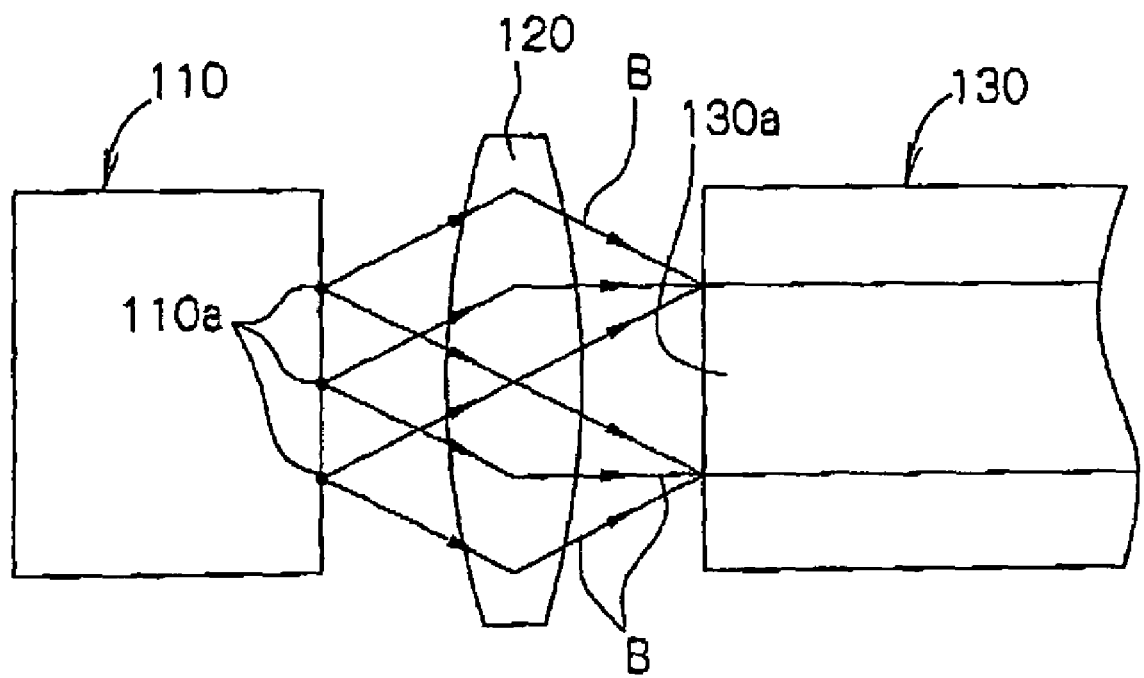
FIG. 22 is a plan view showing another construction of the incorporated laser light source.

The incorporated laser light source is not limited to one in which the laser beam emitted from the plural chip-shaped laser diodes are incorporated. For example, as shown in FIG. 22, the incorporated laser light source including the chip-shaped multi-cavity laser 110 having the plural (for example, 3 points) light-emitting points 110a can be used. This incorporated laser light source includes the multi-cavity laser 110, one multimode optical fiber 130, and a condenser lens 120. The multi-cavity laser 110 can include, e.g., the GaN laser diode having the oscillating wavelength of 405 nm.

In the above-described construction, each of laser beams B emitted from each of plural light emitting points 110a of the multi-cavity laser 110 is condensed with the condenser lens 120 and incident to a core 130a of the multimode optical fiber 130. The laser beams incident to the core 130a are propagated in the optical fiber, and incorporated into one laser beam to be emitted.

The coupling efficiency of the laser beam B to the multimode optical fiber 130 can be increased in such a manner that a convex lens having the focal length substantially equal to the core diameter of the multimode optical fiber 130 or a rod lens collimating the outgoing beam from the multi-cavity laser 110 only in a plane perpendicular to its active layer is used as the condenser lens, while the plural light-emitting points 110a of the multi-cavity laser 110 are provided together within the width substantially equal to the core diameter of the multimode optical fiber 130.

As shown in FIG. 23, the multi-cavity laser 110 including the plural (for example, 3 points) light emitting points can be used and the incorporated laser light source including a laser array 140 in which the plural (for example, 9 lasers) multi-cavity lasers 110 are arranged at the same interval on a heat block 111 can be used. The plural multi-cavity lasers 110 are arranged and fixed in the same direction as the array direction of the light-emitting point 110a of each chip.

The incorporated laser light source includes a laser array 140, plural lens arrays 114 arranged corresponding to each multi-cavity laser 110, one rod lens 113 arranged between the laser array 140 and the plural lens arrays 114, one multimode optical fiber 130, and the condenser lens 120. The lens array 114 includes the plural micro-lenses corresponding to the light-emitting point of the multi-cavity laser 110.

In the above-described construction, each of the laser beams B emitted from each of the plural light-emitting points 110a of the plural multi-cavity lasers 110 are condensed in a predetermined direction with the rod lens 113, and then paralleled with each micro-lens of the lens array 114. A paralleled laser beam L is condensed with the condenser lens 120 and incident to a core 130a of the multimode optical fiber 130. The laser beam which has been incident to the core 130a is propagated in the optical fiber and incorporated into one beam to be emitted.

Further, another embodiment of the incorporated laser light source will be shown. As shown in FIGS. 24A and 24B, in the incorporated laser light source, a heat block 182 whose cross section in the optical axis direction is L-shaped is mounted on a substantially rectangular heat block 180 and a housing space is formed between two heat blocks. The plural (for example, 2 lasers) multi-cavity lasers 110 in which the plural (for example, 5 points) light-emitting points are arranged in the shape of the array are fixed on the upper surface of the L-shaped heat block 182 while the multi-cavity lasers 110 are arranged at the same interval in the same direction as the array direction of the light-emitting point 110a of each chip.

A concave portion is formed in the substantially rectangular heat block 180, the plural (for example, 2 lasers) multi-cavity lasers 110 in which the plural (for example, 5 points) light-emitting points are arranged in the shape of the array are arranged so that its light-emitting point is placed on the same vertical plane as the light-emitting point arranged on the upper surface of the heat block 182.

A collimator lens array 184 in which the collimator lenses are arranged corresponding to the light-emitting point 110a of each chip on the outgoing side of the laser beam of the multi-cavity laser 110. The collimator lens array 184 is arranged so that the lengthwise direction of each collimator lens corresponds to the direction of the larger spread angle (fast axis direction) of the laser beam and the width direction of each collimator lens corresponds to the direction of the smaller spread angle (slow axis direction). Thus, by arraying and integrating the collimator lens, the number of parts is decreased and cost-reduction can be achieved, while space utilization efficiency of the laser beam is improved and output of the incorporated laser light source is increased.

Further, one multimode optical fiber 130 and the condenser lens 120 which condenses and couples the laser beam on the incident end of the multimode optical fiber 130 are arranged on the outgoing side of the laser beam of the collimator lens array 130.

In the above-described construction, each of the laser beams B emitted from each of the plural light-emitting points 110a of the plural multi-cavity lasers 110 are paralleled with the collimator lens array 184, condensed with the condenser lens 120, and incident to the core 130a of the multimode optical fiber 130. The laser beam which has been incident to the core 130a is propagated in the optical fiber and incorporated into one beam to be emitted.

As described above, in the incorporated laser light source, particularly the high output can be achieved with multi-step arrangement of the multi-cavity laser and the array of the collimator lenses. Since the brighter fiber array light source or bundle fiber light source can be formed by using the incorporated laser light source, it is particularly preferable for the fiber light source constituting the laser light source of the exposure apparatus of the invention.

Figure 29:
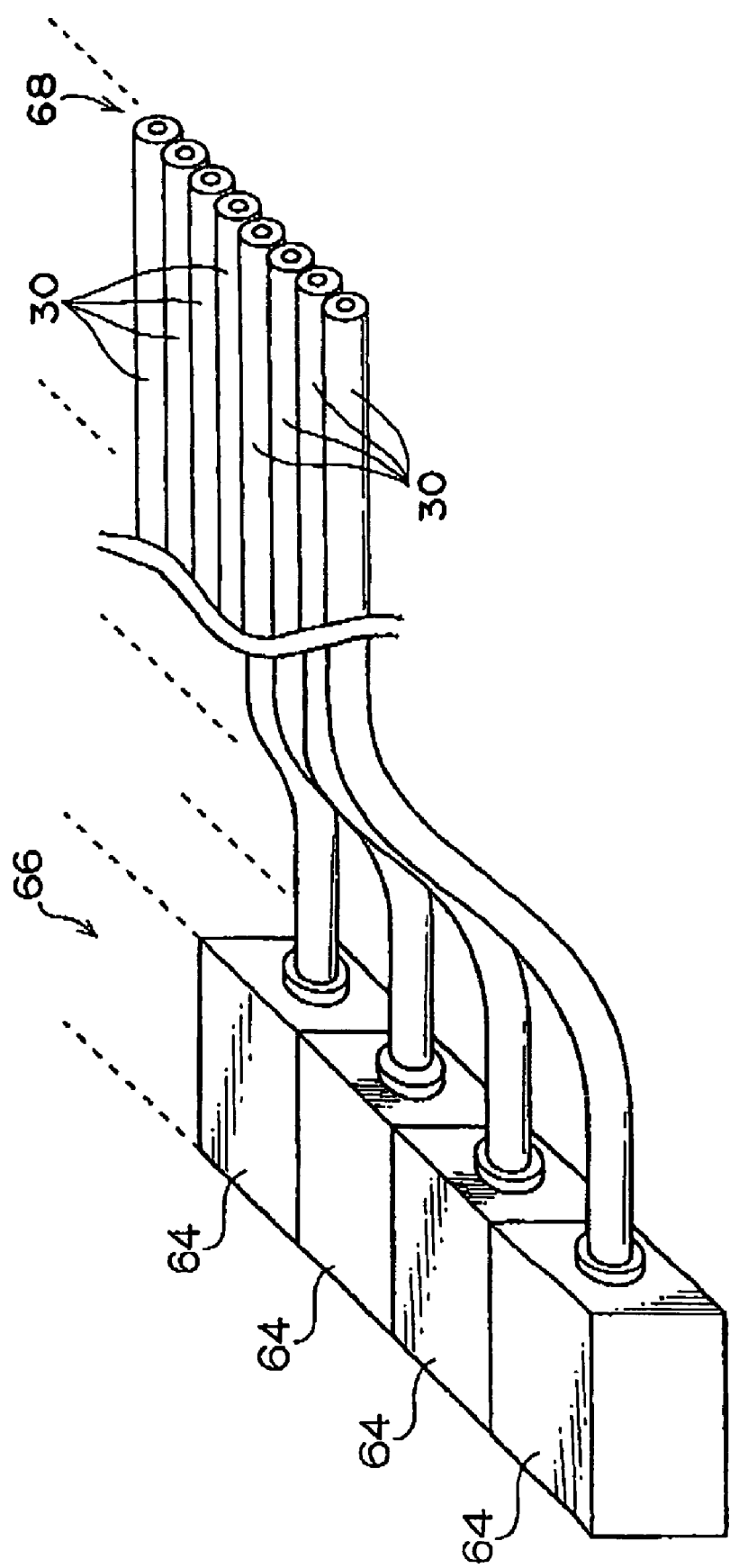
FIG. 29 is a perspective view showing another construction of the fiber array light source.
Figure 30:
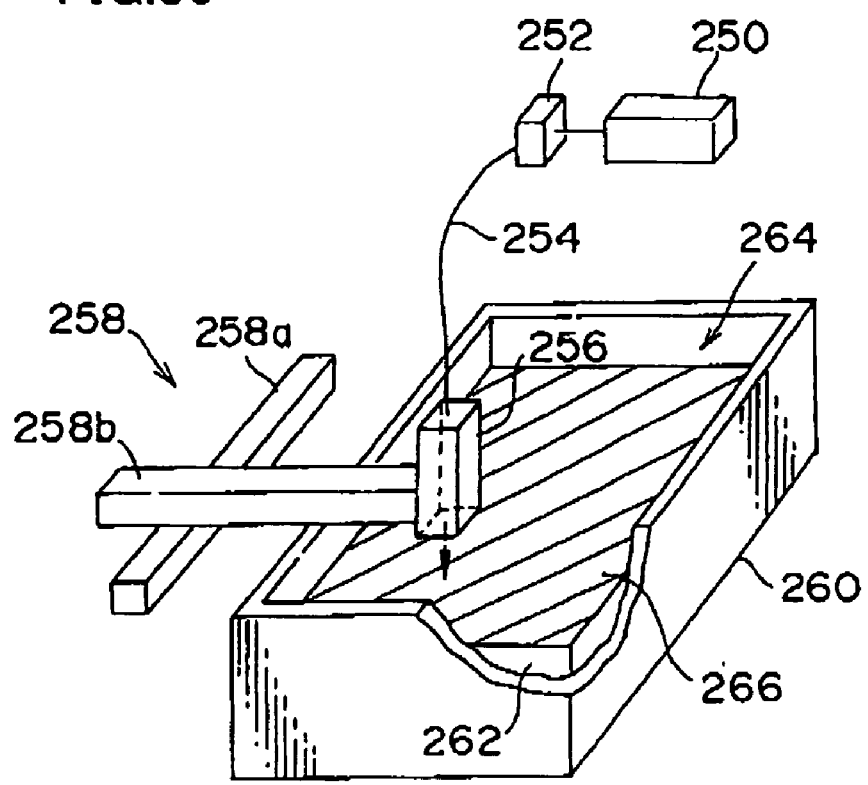
FIG. 30 is a perspective view showing the construction of a rapid prototyping apparatus adopting a laser method of the related art.
Figure 31:
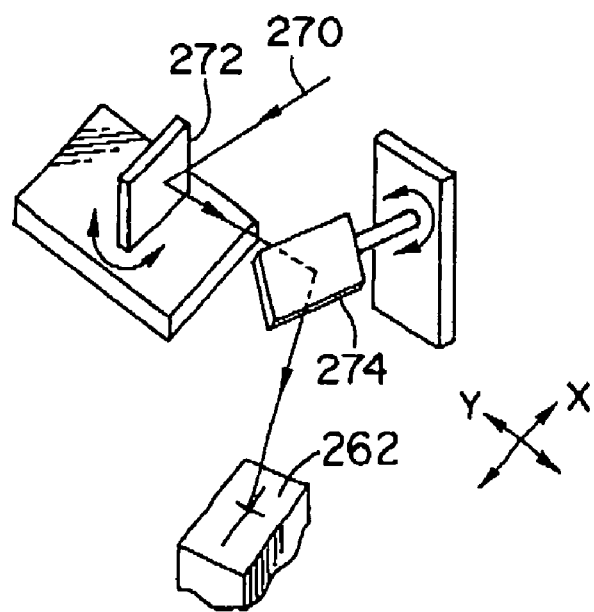
FIG. 31 is a perspective view showing the construction of the rapid prototyping apparatus adopting a movable mirror method of the related art.

The laser module in which each incorporated laser light source can be stored in a casing and the outgoing end portion of the multimode optical fiber 130 is drawn from the casing can be formed Though the case in which the high brightness of the fiber array light source is achieved by coupling other optical fiber, in which the core diameter is the same as that of the multimode optical fiber and the clad diameter is smaller than that of the multimode optical fiber, to the outgoing end of the multimode optical fiber of the incorporated laser light source in the embodiment, for example, as shown in FIG. 29, the multimode optical fiber 30 having the clad diameter of 125 $\mu$m, 80 $\mu$m, 60 $\mu$m, and the like may be used without coupling other optical fiber to the outgoing end.

(Optical System for Correcting Light Intensity Distribution)

In the embodiment, an optical system for correcting light intensity distribution including a pair of combination lenses is used in the exposure head. In the optical system for correcting light intensity distribution, the light flux width is changed at each outgoing position so that a ratio of the light flux width of a peripheral portion to the light flux width of the central portion near the optical axis is decreased on the outgoing side compared with the incident side, and the light intensity distribution is corrected so as to be substantially uniformed at the irradiated surface when the parallel light flux is irradiated from the light source to DMD. The operation of the optical system for correcting light intensity distribution will be described below.

Figure 25A:
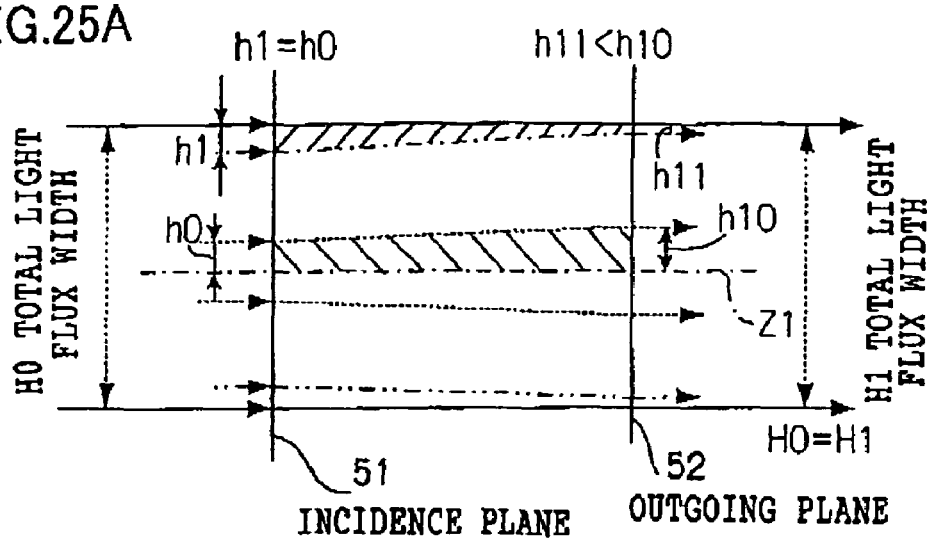
FIGS. 25A, 25B and 25C are explanatory views concerning concepts of correction performed with an optical system of light intensity distribution correction.

As shown in FIG. 25A, the case in which the total light flux widths H0 and H1 of the incident light flux and outgoing light flux are the same will be described at first. In FIG. 25A, portions indicated with reference numerals 51 and 52 virtually show the incident plane and the outgoing plane in the optical system for correcting light intensity distribution.

In the optimal system for correcting light intensity distribution, it is assumed that a light flux width h0 of the light flux incident to the central portion near an optical axis Z1 and a light flux width h1 of the light flux incident to the peripheral portion are the same (h0=h1). The optical system for correcting light intensity distribution provides the operation such that the light flux width h0 is extended in the incident light flux of the central portion and the light flux width h1 is contracted in the incident light flux of the peripheral portion for the light having the same light flux widths h0 and h1 on the incident side. That is to say, the optical system for correcting light intensity distribution acts on an outgoing light flux width of the central portion h10 and an outgoing light flux width of the peripheral portion h11 so as to become h11<h10. Indicating the ratio of the light flux width, the ratio of the light flux width of the peripheral portion to the light flux width of the central portion on the outgoing side "h11/h10" becomes smaller compared with the ratio (h1/h0=1) (h11/h10<1).

By changing the light flux width, the light flux in the central portion, in which normally the light intensity distribution is enlarged, can be utilized to the peripheral portion where the light intensity is lacked, and the light intensity distribution is substantially uniformed on the irradiated source without reducing the light utilization efficiency as a whole. A degree of uniformity is set so that nonuniformity of the light intensity is within 39% in the effective region, preferably within 20%.

Figure 25B:
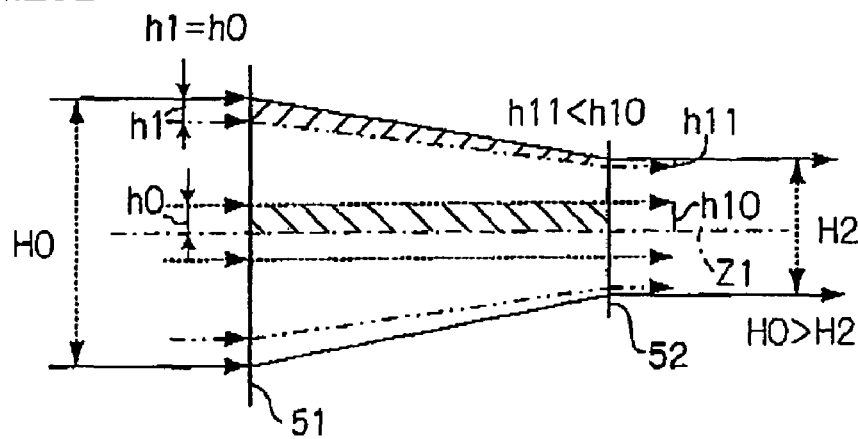
Figure 25C:
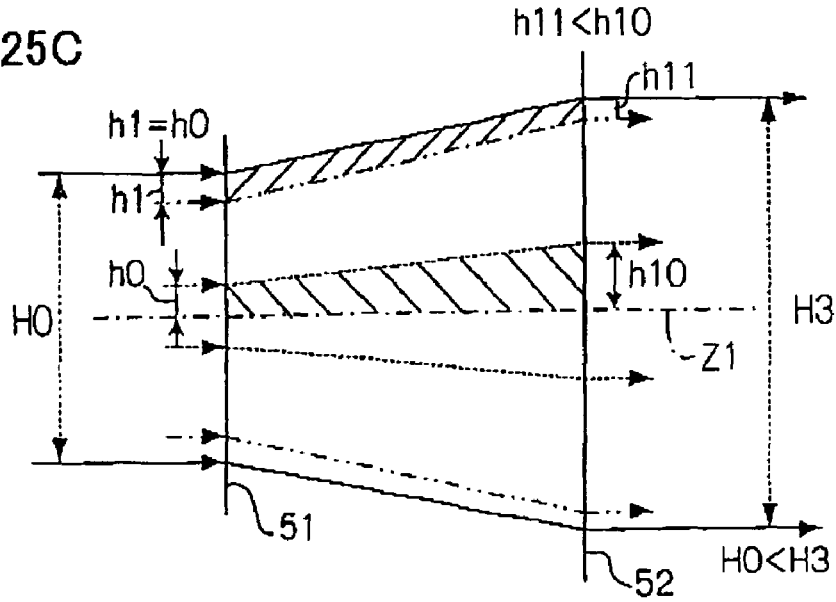

The operation and effect generated by the optical system for correcting light intensity distribution is also the same in the case that the total light flux width is changed on the incident side and the outgoing side (FIGS. 25B and 25C).

FIG. 25B shows the case in which the total light flux width H0 on the incident side is "contracted" to a width H2 and the light is emitted (H0>H2). Even in such case, the optical system for correcting light intensity distribution provides the operation such that the light flux width h10 of the central portion is increased compared with the peripheral portion or the light flux width h11 on the peripheral portion is decreased compared with the central portion on the outgoing side for the light having the same light flux widths h0 and h1 on the incident side. Considering a reduction ratio of the light flux, the optical system for correcting light intensity distribution provides the operation such that the reduction ratio for the incident light flux of the central portion is decreased compared with the peripheral portion, and the reduction ratio for the incident light flux of the peripheral portion is increased compared with the central portion. In this case, the ratio of the light flux width of the peripheral portion to the light flux width of the central portion "H11/H10" becomes smaller compared with the ratio (h1/h0=1) on the incident side (h11/h10<1).

FIG. 25C shows the case in which the total light flux width H0 on the incident side is magnified to a width H3 and the light is emitted (H0<H3). Even in such case, the optical system for correcting light intensity distribution provides the operation such that the light flux width h0 of the central portion is increased compared with the peripheral portion or the light flux width h11 on the peripheral portion is decreased compared with the central portion on the outgoing side for the light having the same light flux widths h0 and h1 on the incident side. Considering a magnification ratio of the light flux, the optical system for correcting light intensity distribution provides the operation such that the magnification ratio for the incident light flux of the central portion is increased compared with the central portion, and the magnification ratio for the incident light flux of the peripheral portion is decreased compared with the central portion. In this case, the ratio of the light flux width of the peripheral portion to the light width of the central portion "h11/h10" becomes smaller compared with the ratio (h1/h0=1) on the incident side (h11/h10<1).

As described above, in the optical system for correcting light intensity distribution, the light flux width in each outgoing position is changed, and the ratio of the light flux width of the peripheral portion to the light flux width of the central portion near the optical axis Z1 on the outgoing side is formed to be smaller than that on the incident side, so that, for the light having the same light flux width on the incident side, the light flux width of the central portion is increased compared with the peripheral portion and the light flux width of the peripheral portion is decreased compared with the central portion on the outgoing side. Consequently, the light flux in the central portion can be utilized to the peripheral portion and the light flux cross section in which the light intensity distribution is substantially uniformed can be formed without reducing the light utilization efficiency as a whole.

An example of specific lens data of the pair of combination lenses used as the optical system for correcting light intensity distribution is shown. In this embodiment, like the case in which the light source is the laser array light source, the lens data of the case in which the light intensity distribution at the cross section of the outgoing light flux is the Gaussian distribution is shown. When one laser diode is connected to the incident end of the single mode optical fiber, the light intensity distribution of the outgoing light flux from the optical fiber becomes the Gaussian distribution. The embodiment is applicable to such case. The embodiment is also applicable to the case in which the light intensity of the central portion is larger than that of the peripheral portion in such a manner that the core diameter of the multimode optical fiber is decreased to close to the construction of the single mode optical fiber.

Table 1 shows basic lens data.

TABLE 1

BASIC LENS DATA

| Si (SURFACE NUMBER) | Ri (CURVATURE RADIUS) | Di (DISTANCE BETWEEN SURFACES) | Ni (REFRACTIVE INDEX) |
|---|---|---|---|
| 01 | ASPHERIC SURFACE | 5.000 | 1.52811 |
| 02 | ∞ | 50.000 | |
| 03 | ∞ | 7.000 | 1.52811 |
| 04 | ASPHERIC SURFACE | | |

As can be seen fom Table 1, the pair of combination lenses includes two rotationally-symmetric aspherical lenses. Assuming that the surface on the light-incident side of a first lens which is placed on the light-incident side is a first surface and the surface on the light-outgoing side is a second surface, the first surface is the aspheric shape. Assuming that the surface on the light-incident side of a second lens which is placed on the light-incident side is a third surface and the surface on the light-outgoing side is a fourth surface, the fourth surface is the aspheric shape.

In Table 1, a surface number Si indicates the number of the ith (i=1 to 4) surface, a curvature radius ri indicates the curvature of the ith surface, and a distance between surfaces di indicates the distance between the ith surface and the i+1th surface on the optical axis. A unit of a value of the distance between the surfaces di is millimeter. The refractive index Ni indicates the value of the refractive index for the wavelength of 405 nm of an optical element including the ith surface.

Table 2 shows aspheric surface data of the first and fourth surfaces.

TABLE 2

ASPHERIC SURFACE DATA

|  | FIRST SURFACE | FOURTH SURFACE |
| --- | --- | --- |
| C | −1.4098E−02 | −9.8506E−03 |
| K | −4.2192E+00 | −3.6253E+01 |
| a3 | −1.0027E−04 | −8.9980E−05 |
| a4 | 3.0591E−05 | 2.3060E−05 |
| a5 | −4.5115E−07 | −2.2860E−06 |
| a6 | −8.2819E−09 | 8.7661E−08 |
| a7 | 4.1020E−12 | 4.4028E−10 |
| a8 | 1.2231−13 | 1.3624E−12 |
| a9 | 5.3753E−16 | 3.3965E−15 |
| a10 | 1.6315E−18 | 7.4823E−18 |

The aspheic surface data indicates with a coefficient in the following Equation A showing the aspherical shape.

[Equation 1] (A)

[数 1]

$$Z = \frac{C \cdot \rho^2}{1 + \sqrt{1 - K \cdot (C \cdot \rho)^2}} + \sum_{i=3}^{10} ai \cdot \rho^i$$

Each coefficient in Equation A is defined as follows.

Z: a length of a perpendicular dropped from a point on an aspheric surface, which is located at a position of a height ρ from the optical axis, to a tangent plane of an apex of the aspheric surface (plane perpendicular to the optical axis) (mm)

ρ: a distance from the optical axis (mm)

K: constant of the cone

C: a paraxial curvature (1/r, r: a paraxial curvature radius)

ai: an aspherical coefficient of ith order

In numerical values shown in Table 2, a sign "E" indicates that the numerical value following "E" is "power" having a base of 10, and that the numerical value shown by an exponential function whose base is 10 is multiplied by the numerical value antecedent to "E". For example, in the case of "1.0E-02", it shows "$1.0 \times 10^{-2}$".

Figure 26:
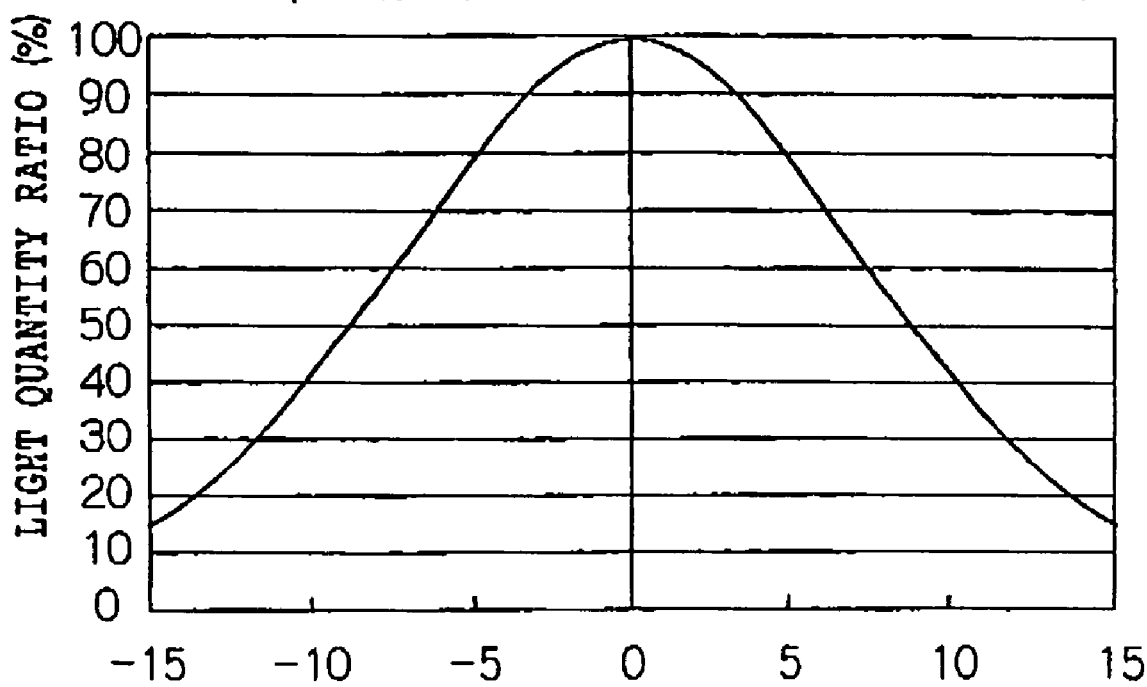
FIG. 26 is a graph showing a light intensity distribution when the light source has a Gaussian distribution and the light intensity distribution is not corrected.
Figure 27:
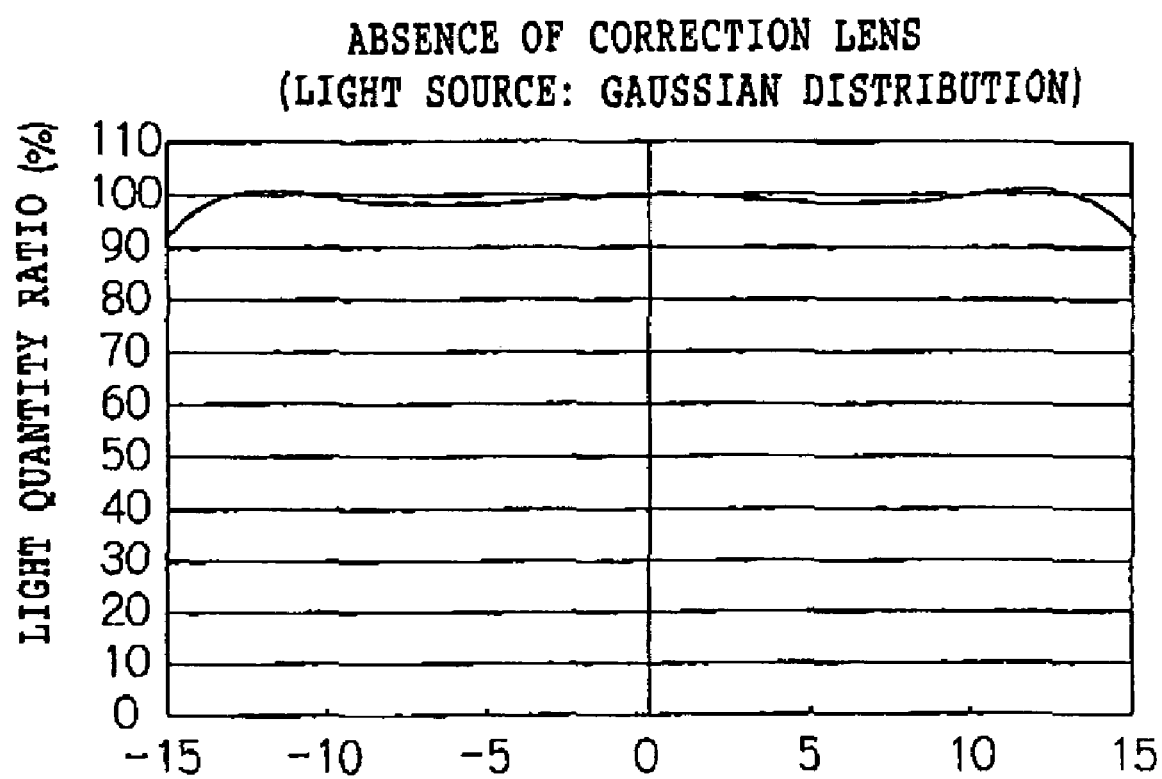
FIG. 27 is a graph showing the light intensity distribution after the correction performed with the optical system of light intensity distribution correction.

FIG. 27 shows the light intensity distribution of irradiating light, which is obtained with the pair of combination lenses shown in Table 1 and Table 2. A horizontal axis shows a coordinate from the optical axis, and a vertical axis shows a light intensity ratio (light quantity ratio) (%). For comparison, FIG. 26 shows the light intensity distribution (Gaussian distribution) of irradiating light when the correction has not been performed. As can be seen from FIGS. 27 and 28, by performing the connection with the optical system for correcting light intensity distribution, compared with the case in which the correction has not been performed, the substantial uniformity of the light intensity distribution can be obtained. Consequently, the uniform exposure can be performed with the uniform laser beam without reducing the light utilization efficiency in the exposure head. The rod integrator, the fry-eye lens, or the like, which is usually used, may be used.

(Other Focusing Optical System)

In the above described embodiment, though two pairs of combination lenses is arranged as a focusing optical system on the light-reflecting side of DMD used for the exposure head, the focusing optical system which enlarges and focuses the laser beam may be arranged. The exposure area (image region) on the exposed surface can be magnified to the desired size by magnifying the cross section of a light flux line reflected with DMD.

Figure 28A:
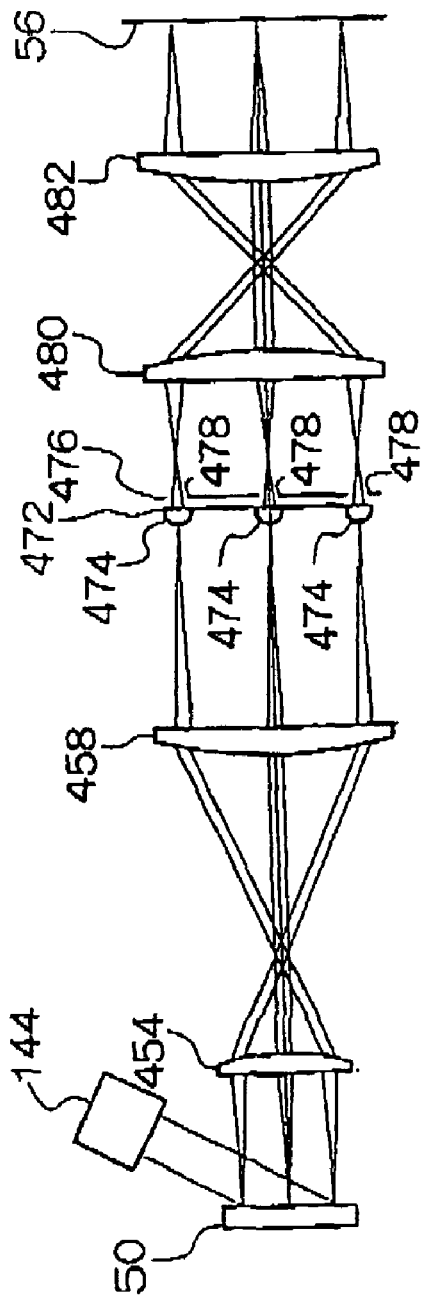
FIG. 28A is a sectional view along the optical axis, which shows the construction of another exposure head having a different focusing optical system.

For example, as shown in FIG. 28A, the exposure head can include DMD 50, a lighting device 144 which irradiates the laser beam to DMD 50, lens systems 454 and 458 which magnify and focus the laser beam reflected with DMD 50, a micro-lens array 472 in which many micro-lenses 474 are arranged corresponding to each pixel of DMD 50, an aperture array 476 in which many aperture 478 are provided corresponding to each micro-lens of the micro lens array 472, and lens systems 480 and 482 which focus the laser beam passing through the aperture on the exposed surface 56.

In the exposure head, when the laser beam is irradiated from the lighting device 144, the cross section of the light flux line reflected in the on-direction with DMD 50 is magnified to several times (for example, double) with the lens systems 454 and 458. The magnified laser beam is condensed with each micro-lens of the micro-lens array 472 corresponding to each pixel of DMD 50, and passes the corresponding aperture of the apperture array 476. The laser beam which has passed the aperture is focused on the exposed surface 56 with the lens systems 480 and 482.

Figure 28C:
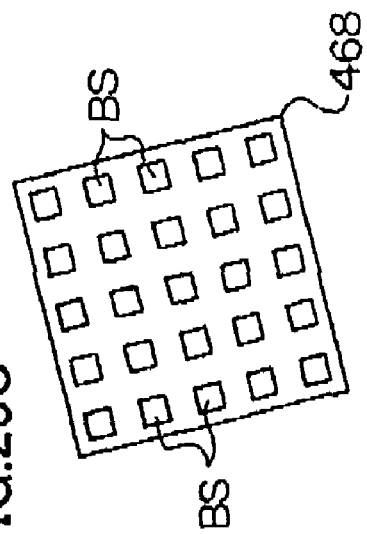
FIG. 28B is a plan view showing a light figure projected on an exposed surface when a micro-lens array or the like is not used, and FIG. 28C a plan view showing the light figure projected on an exposed surface when a micro-lens array or the like is used.
Figure 28B:
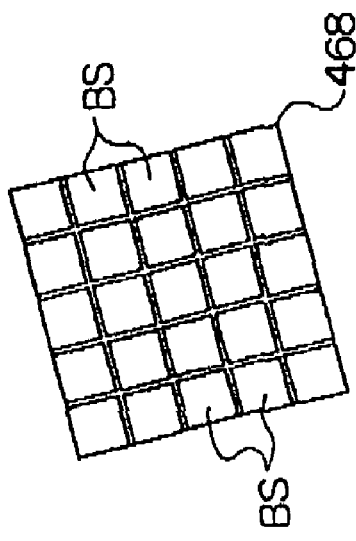

In the focusing optical systems since the laser beam reflected with DMD 50 is magnified to several times with the magnifying lens systems 454 and 458 and projected onto the exposed surface 56, the total image region is increased. At this point, unless the micro-lens array 472 and the aperture array 476 are arranged, as shown in FIG. 28B, one pixel size (spot size) of each beam spot BS projected to the exposed surface 56 becomes large according to the size of an exposure area 468, so that MTF (Modulation Transfer Function) characteristics indicating sharpness of the exposure area 468 are decreased.

On the other hand, when the micro-lens array 472 and the aperture array 476 are arranged, the laser beam reflected with DMD 50 is condensed with each micro-lens of the micro-lens array 472 according to each pixel of DMD 50. Consequently, as shown in FIG. 28C, even if the exposure area is magnified, the spot size of each beam spot BS can be contracted to the desired size (for example, 10 μm×10 μm), the MTF characteristics can be prevented from decreasing to perform the fine exposure. Inclination of the exposure area 468 is because DMD 50 is obliquely arranged in order to eliminate the gap between the pixels.

Even if the beam is fattened by aberration of the micro-lens, the beam can be shaped so that the spot size on the exposed surface 56 is maintained at constant size with the aperture, and crosstalk between the adjacent pixels can be prevented in such a manner that the beam is passed the aperture provided corresponding to each pixel.

Furthermore, like the above-described embodiment, by using the light source having the high brightness for the lighting device 144, the angle of the light flux incident from the lens 458 to each micro-lens of the micro-lens array 472 is decreased, so that a part of the light flux of the adjacent pixel can be prevented from being incident. That is to say, a high extinction ratio can be realized.

As described above, though the exposure head and the exposure apparatus of the invention include the spatial light modulator, the exposure head and the exposure apparatus have the effect that the high speed exposure can be performed by increasing the modulating speed of the spatial light modulator.

[Second Embodiment]

A second embodiment of the invention is the embodiment of the rapid prototyping apparatus in which a photo-curable resin is exposed by the laser beam modulated with the spatial light modulator according to the image data to shape a three-dimensional model.

(Rapid Prototyping Apparatus)

Figure 32:
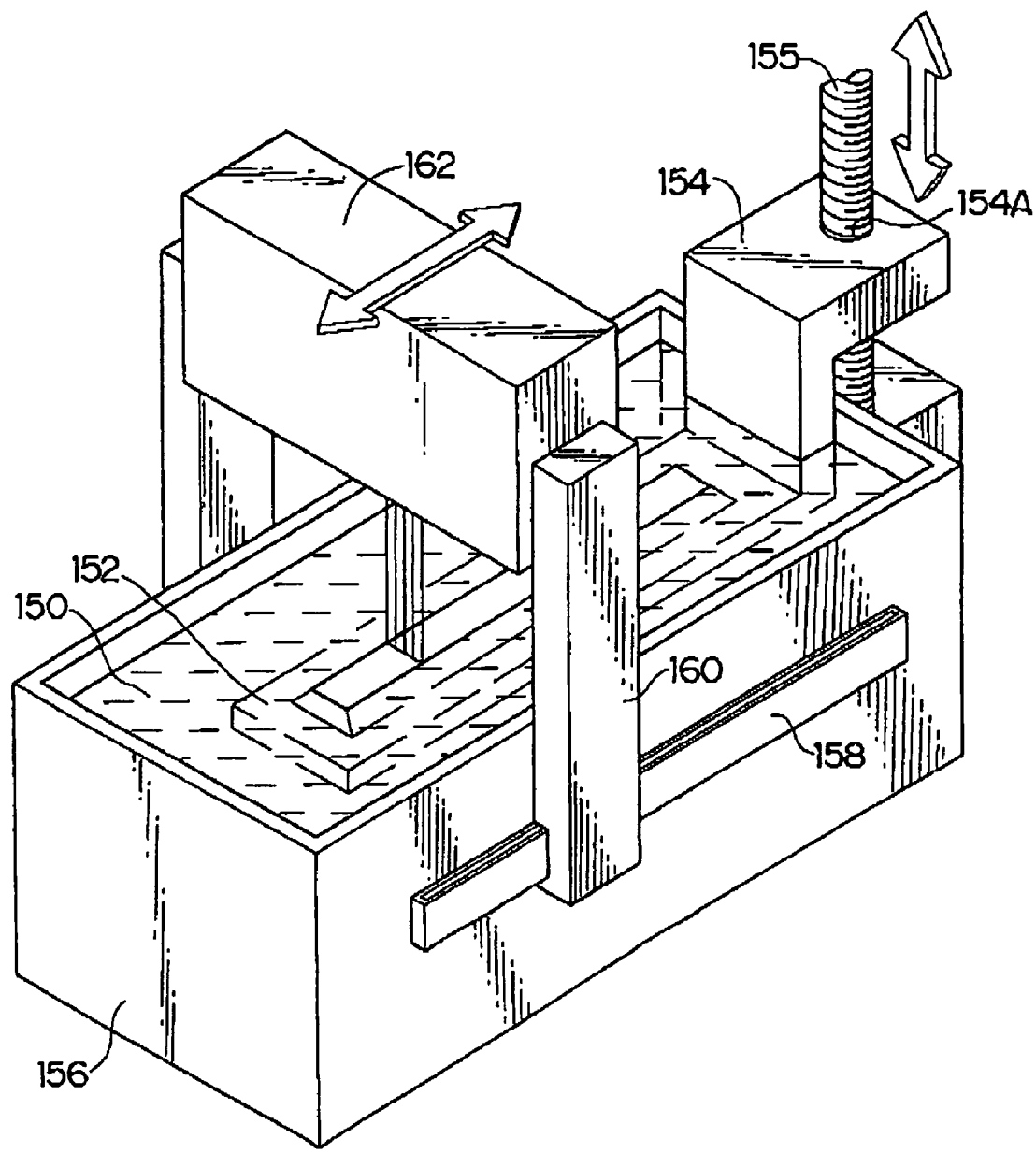
FIG. 32 is a perspective view showing the appearance of the rapid prototyping apparatus according to a second embodiment.

As shown in FIG. 32, the rapid prototyping apparatus according to the embodiment of the invention includes a vessel 156 whose upper surface is opened, a liquid photo-curable resin 150 is stored in the vessel 156. A plate-shaped elevating stage 152 is arranged in the vessel 156, the elevating stage 152 is supported with a supporting portion 154 arranged outside the vessel 156. The supporting portion 154 is provided with an external thread portion 154A, and a lead screw 155 which is rotatable with a driving motor (not shown) is bolted in the external thread portion 154A. The elevating stage 152 is elevated by rotating the lead screw 155.

Above a liquid surface of the photo-curable resin 152 stored in the vessel 156, a box-shaped scanner 162 is arranged while its lengthwise direction faces a short side direction of the vessel 156. A scanner 162 is supported with two support arms 160 attached to both side faces of the short side direction. The scanner 162 is connected to a controller (not shown) which controls the scanner 162.

Each guide 158 is provided on both side faces in the lengthwise direction of the vessel 156 respectively. The guides are equipped with lower end portions of two support arms 160 so that the support arms can be reciprocally moved along the sub-scanning direction. A driving device (not shown) which drives the scanner 162 with the support arms 160 along the guides 158 is provided in the rapid prototyping apparatus.

As shown in FIG. 33, the scanner 162 includes plural (for example, 14 heads) exposure heads 166 arranged in the matrix shape (for example, 3 rows and 5 columns). In the embodiment, considering the width of the short side direction of the vessel 156, four exposure heads 166 are arranged in the third row. When the specific exposure head arranged in mth row and nth column is shown, it is indicated as the exposure head $166_{mn}$.

An exposure area 168 generated with the exposure head 166 is a rectangle whose short side is the sub-scanning direction. Accordingly, when the scanner 162 is moved, a band-shaped region which has been exposed (cured region) 170 is formed in each exposure head 166 on the liquid surface of the photo-curable resin 152. When the exposure area which is generated with the specific exposure head arranged in mth row and nth column is shown, it is indicated as the exposure area $168_{mn}$.

The construction, operation, and modification of each of exposure heads $166_{11}$ to $166_{mn}$ are the same as those of the first embodiment. However, it is more preferable that the wave range of the GaN laser diodes LD1 to LD7 is in the range from 350 to 420 nm. The wavelength of 408 nm is particularly preferable in view of usage of the low-cost GaN laser diode.

Similarly to the first embodiment, 600 sets of the micro-mirror column, in which the 800 pieces of the micro-mirror are arranged in the main scanning direction, are arranged in the sub-scanning direction in DMD 50, however, the control is performed so that only a part of the micro-mirror columns (for example, 800 pieces×100 columns) are driven with the controller.

In the rapid prototyping apparatus, the image data according to the exposure pattern of one layer is inputted to the controller (not shown) which is connected to DMD 50, and temporarily stored in the frame memory in the controller. The image data is the data in which the density of each pixel constituting the image is indicated by the binary value (presence or absence of the recording of the dot).

The scanner 162 is moved at constant velocity from the upstream side to the downstream side along the guide 158 with the driving device which is not shown. When the movement of the scanner 162 is started, the plural lines of the image data, which is stored in the frame memory, is sequentially read, and the control signal is generated in each exposure head 166 on the basis of the image data read with the data processing portion. Each of the micro-mirrors of DMD 50 is on-off controlled in each exposure head 166 on the basis of the generated control signal with the mirror driving control portion.

When the laser beam is irradiated from the fiber array light source 66 to DMD 50, the laser beam reflected in the case that the micro-mirror of DMD 50 is on-state is focused on the liquid surface (exposed surface) 56 of the photo-curable resin 150 with the lens systems 54 and 58. In such way, the laser beam emitted from the fiber array light source 66 is turned on and off in each pixel and the photo-curable resin 150 is exposed in the almost same pixel unit (exposure area 168) as the number of using pixels of DMD 50. The liquid surface of the photo-curable resin 150 is sub-scanned by moving the scanner 162 at constant speed, and the band-shaped exposed region 170 is formed in each exposure head 166.

When the curing of one layer is completed with one time sub-scanning of the scanner 162, the scanner is returned to the home position located on the most upstream side along the guide 158 with the driving device which is not shown. Then, the lead screw 155 is rotated with the driving motor which is not shown to descend the elevating stage 152 by predetermined quantity, the cured portion of the photo-curable resin 150 is sunk below the liquid surface, and the upper portion of the cured portion is filled with the liquid photo-curable resin 150. When the image data of the next layer is inputted to the controller which is connected to DMD 50 and not shown, the sub-scanning of the scanner 162 is performed again. Thus, the three-dimensional model is formed in such a manner that the exposure (curing) performed by the sub-scanning and the descent of the stage are repeated and the cured portion is stacked.

As described above, the rapid prototyping apparatus of the embodiment includes DMD in which 600 sets of the micro-mirror column, in which the 800 pieces of the micromirror are arranged in the main scanning direction, are arranged in the sub-scanning direction, however, since the control is performed so that only a part of the micro-mirror columns are driven with the controller, the modulating speed per one line is increased compared with the case that all the micro-mirror columns are driven. Consequently, the exposure and the shaping can be performed at high speed.

The fiber array light source having the high brightness, in which the outgoing end portions of the optical fiber of the incorporated laser light source are arranged in the shape of the array, is used as the light source irratiating DMD, so that the exposure apparatus having the high output, the deep focal depth, and high light density output can be obtained. Consequently, the fine shaping can be performed at high speed. Furthermore, the number of fiber light sources necessary for obtaining the desired output is decreased by enlarging the output of each fiber light source, so that cost-reduction of the rapid prototyping apparatus can be achieved.

Particularly, in the embodiment, since the clad diameter of the outgoing end of the optical fiber is smaller than that of the incident end, the diameter of the light-emitting portion becomes smaller, so that the high brightness of the fiber array light source is achieved. Consequently, the fine shaping can be realized.

(Laser Driving Method)

Each GaN laser diode including the fiber array light source may be continuously driven or pulse-driven. Thermal diffusion is prevented by the exposure of the pulse-driven laser beam and the high-speed and fine shaping can be performed. It is preferable that the pulse width is shorter, i.e., the pulse width of 1 psec to 100 psec is preferable, and the pulse width of 1 psec to 300 psec is more preferable. Breakage of the light-outgoing end face, which is called as COD (Catastrophic Optical Damage), hardly occurs in the GaN laser diode, the GaN laser diode has high reliability, and it is easy to realize the pulse width of 1 psec to 300 psec in the GaN laser diode.

(Other Exposure Method)

Usually there is a problem that polymerization shrinkage caused by the curing of the resin and shrinkage on curing in which the resin heated to high temperature with polymerization heat generated in curing are generated in the rapid prototyping apparatus shaping the three-dimensional model, a shaped article is deformed by these shrinkages accompanying the curing, and accuracy of the shaping is decreased. In particular, when the regions including the plural pixels are exposed simultaneously (plane exposure) to perform the shaping in shape of the plate, the shaped article is warped in downwardly convex for the stacking direction. In order to prevent the generation of the deformation, which is caused by the shrinkage on curing, it is preferable that the exposure region is divided into the plural regions and the exposure is sequentially performed.

For example, assuming that the same liquid surface of the photo-curable resin is scanned in plural times, after a borderline of the shaped article is exposed and the photo-curable resin is cured in the first time scanning, an inside region of the borderline is exposed and the photo-curable resin is cured in the second time scanning, so that the generation of the deformation is prevented.

Figure 34A:
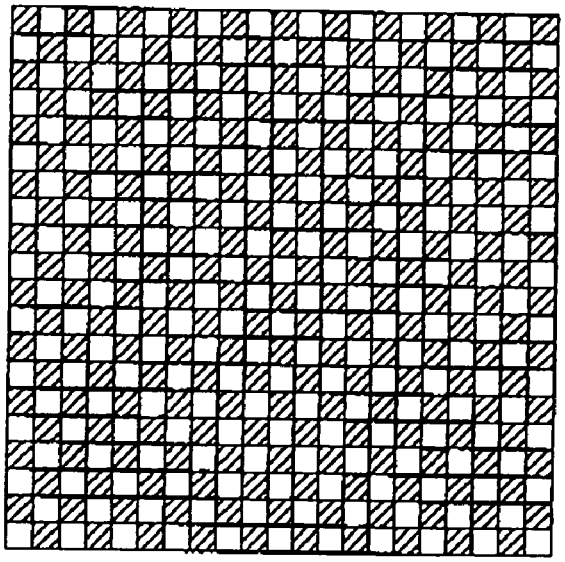
FIG. 34A is a plan view showing an example of an exposure pattern in an exposure region.

As shown in FIG. 34A, the exposure region is divided into the plural pixels, the plural pixels are divided into a first group including pixels 102 which are not adjacent each other and a second group including pixels 104 which are not adjacent each other, and the scanning and the exposure may be performed in each group. The pixels 104 and the pixels 108 are arranged alternately so as to form a diced pattern. FIG. 34A shows a part of the exposure region, for example, when the exposure head including DMD of one million pixels is used, the exposure region can be divided into one million pixels according to the number of pixels of DMD.

Figure 34B:
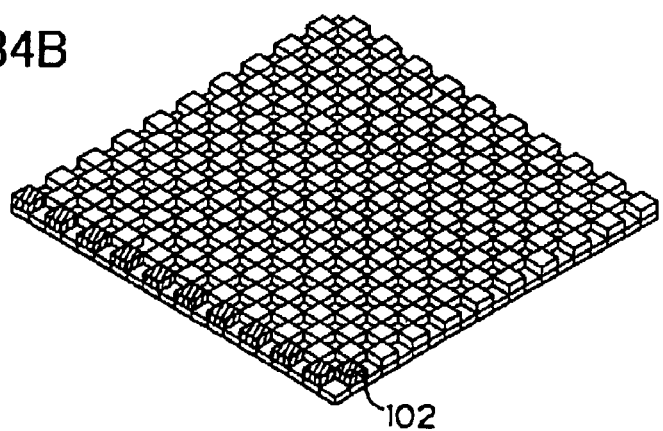
FIG. 34B is a perspective view showing a state after a first group of elements in FIG. 34A is exposed.
Figure 34C:
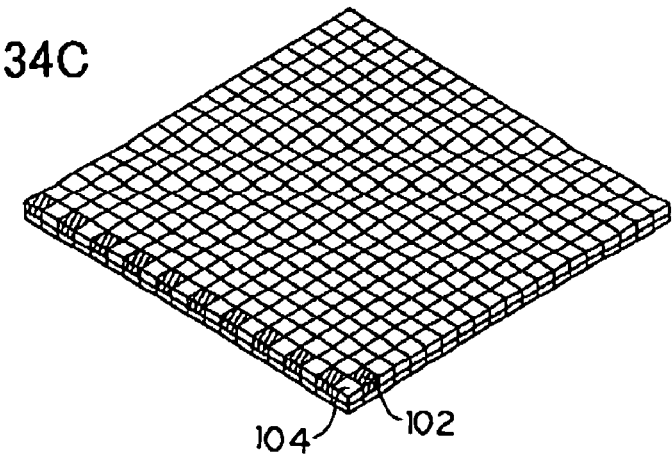
FIG. 34C is a perspective view showing the state after a second group of elements in FIG. 34A is exposed.

As shown in FIG. 34B, the pixels 104 belonging to the first group are exposed in the first time scanning, and, as shown in FIG. 34C, the pixels 108 belonging to the second group are exposed in the second time scanning. Consequently, the gap between the pixels is filled and the entire surface of the exposure region on the liquid surface of the photo-curable resin is exposed.

The pixels of the first group, which are exposed in the first time scanning, are not adjacent each other and the pixels of the second group, which are exposed in the second time scanning are also not adjacent each other. Since the adjacent pixels are not exposed simultaneously, the deformation caused by the shrinkage on curing is not propagated to the adjacent pixel. That is to say, when the entire exposure region is exposed simultaneously, the deformation caused by the shrinkage on curing in increased as the deformation caused by the shrinkage on curing is propagated in the exposure region, and considerable deformation is generated, however, in the embodiment, the shrinkage on curing is generated only within one pixel and the deformation caused by the shrinkage on curing is not propagated to the adjacent pixel. Consequently, the generation of the deformation is remarkably suppressed in the stacking shaped article and the fine shaping can be performed.

In the rapid prototyping apparatus of the embodiment, the liquid surface of the photo-curable resin can be exposed in an arbitrary pattern by the one time scanning of the scanner. Accordingly, the exposure is relatively easily performed in each divided region by the plural scanning.

(Photo-curable Resin)

Usual urethane acrylate resin which is cured by photo-radical polymerization reaction or epoxy resin which is cured by photo-catonic polymerization reaction is used as the liquid photo-curable resin used for the rapid prototyping. Sol-gel transformation type of photo-curable resin, which stays in a gel-state at ordinary temperature and transforms into a sol-state when thermal energy is given by the laser irradiation, can be also used. In the rapid prototyping method using the sol-gel formation type of photo-curable resin, there is an advantage that, since the exposure and the curing are performed in the shaping surface of not the liquid but the gel-state, the shaped article is formed in the resin in the gel-state and it is not necessary to shape a support portion or a joint portion for supporting the shaped article.

When line exposure or area exposure in which a given region is exposed simultaneously is performed, it is preferable that the resin in which thermal-conductive fillers are added to the sol-gel transformation type of photo-curable resin is used. Addition of the thermal-conductive fillers exerts thermal diffusion and the generation of thermal deformation is prevented in the shaped article. Particularly in the sol-gel transformation type of photo-curable resin, since uniform dispersion can be performed without settling the filler unlike normal resin, the thermal diffusion can be maintained.

[Third Embodiment]

A third embodiment is the embodiment of the stacking rapid prototyping apparatus in which powder is sintered to form a sintered layer by using the light beam modulated with the spatial light modulator according to the image data and the sintered layer is stacked to shape the three-dimensional model including powder-sintered material.

(Stacking Rapid Prototyping Apparatus)

Figure 35:
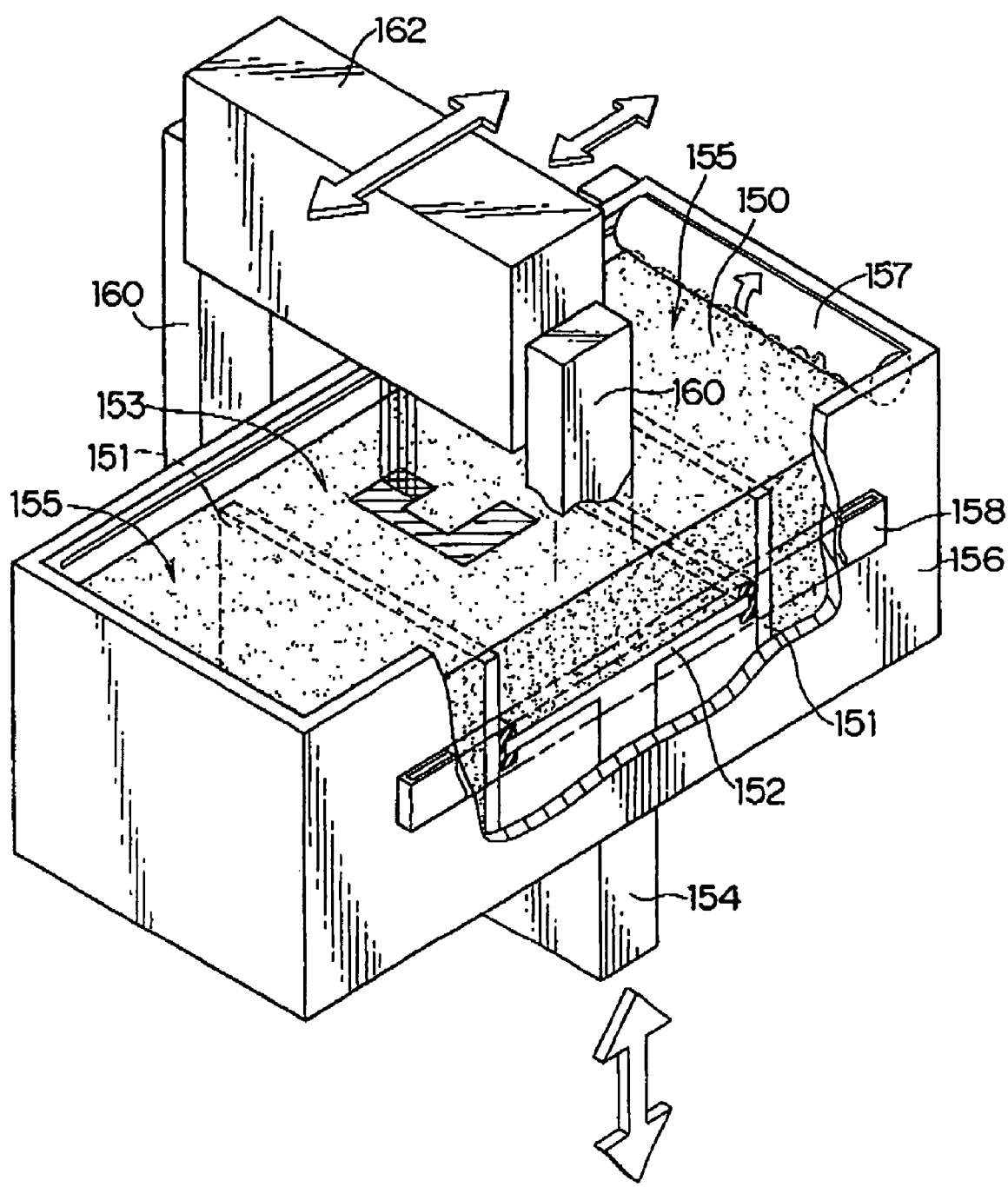
FIG. 35 is a perspective view showing the appearance of a stacking rapid prototyping apparatus according to a third embodiment.

As shown in FIG. 35, the stacking rapid prototyping apparatus according to the embodiment of the invention includes the vessel 156 whose upper surface is opened. The inside of the vessel 156 is divided into three portions in the lengthwise direction with two partitions, a shaping portion 153 for producing the shaped article is arranged in the central portion, and supplying portions 155 which supply powder 150 used for the shaping to the shaping portion 153 are arranged on both sides of the shaping portion 153.

The powder such as engineering plastic, metal, ceramics, sand, and wax can be used as the powder 150. For example, the powder such as a composite of acrylic acid and nylon 11, nylon 11 including beads, synthetic rubber, 316 stainless steel, 420 stainless steel, zircon sand, and silica sand can be used.

The stage 152 constituting the bottom surface of the shaping portion 153 is supported with the supporting portion 154, and the stage 152 is formed to be elevated with an elevating mechanism (not shown) which is attached to the supporting portion 154. A reverse rotating roller 157 which uniforms the surface of the powder 150 in the vessel 156 is attached to the upper portion of the inside of the vessel 156 while the reverse rotating roller is movable in the sub-scanning direction. When the stage 152 in the shaping portion 153 is descended, since the powder 150 in the shaping portion is lacked, the powder 150 is supplied from the suppling portion 155 with the reverse rotating roller 157. By rotating the reverse roller 157 in the direction reverse to the moving direction, the supplied powder 150 is spread on the shaping portion 153 and the surface of the powder 150 is evened.

Above a liquid surface of the photo-curable resin 152 stored in the vessel 156, a box-shaped scanner 162 is arranged while its lengthwise direction faces a short side direction of the vessel 156. A scanner 162 is supported with two support arms 160 attached to both side faces of the short side direction. The scanner 162 is connected to a controller (not shown) which controls the scanner 162.

Each guide 158 is provided on both side faces in the lengthwise direction of the vessel 156 respectively. The guides are equipped with lower end portions of two support arms 160 so that the support arms can be reciprocally moved along the sub-scanning direction. A driving device (not shown) which drives the scanner 162 with the support arms 160 along the guides 158 is provided in the rapid prototyping apparatus.

Figure 36:
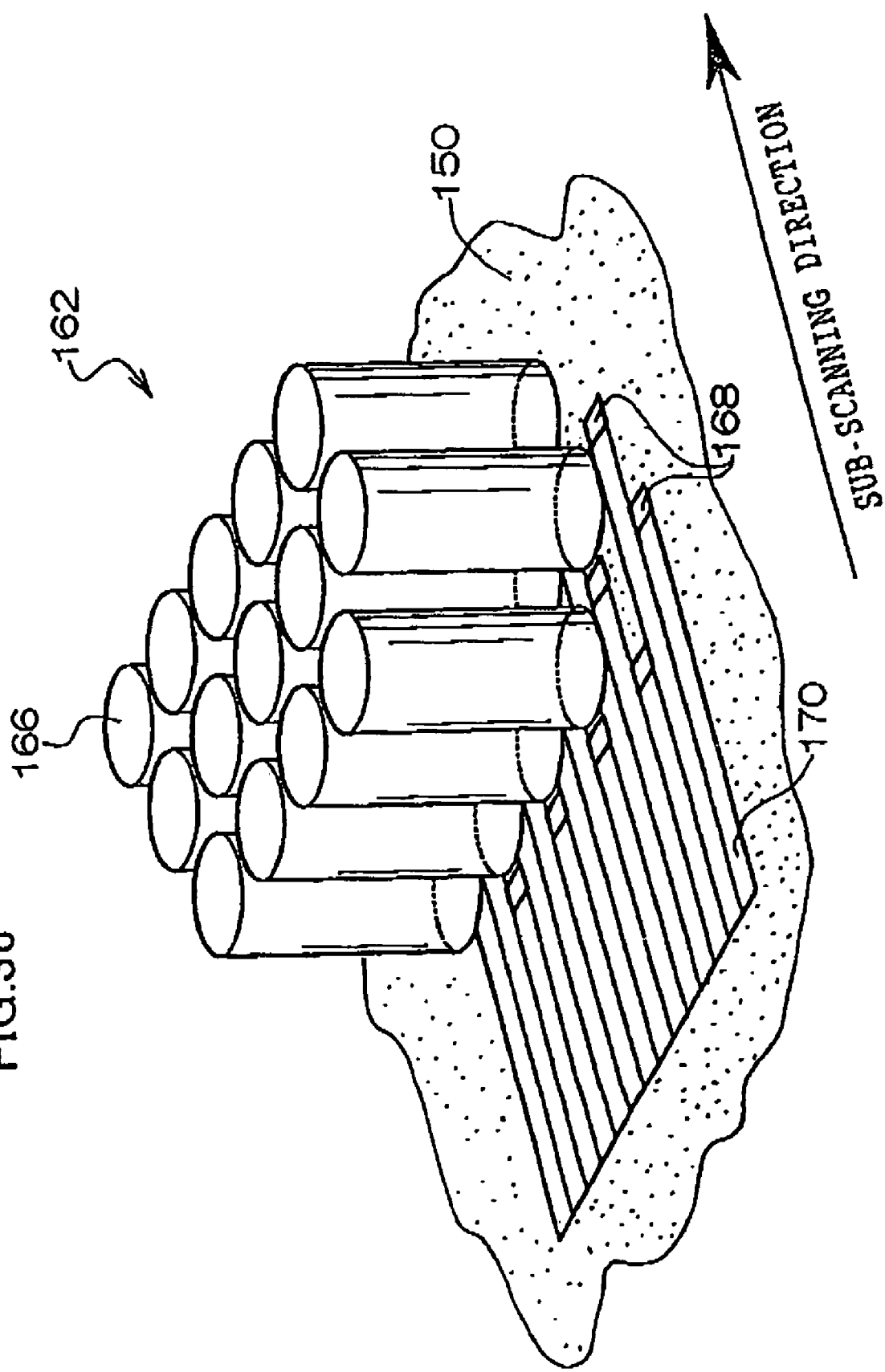
FIG. 36 is a perspective view showing the construction of the scanner in the stacking rapid prototyping apparatus according to the third embodiment.

As shown in FIG. 36, the scanner 162 includes plural (for example, 14 heads) exposure heads 166 arranged in the matrix shape (for example, 3 rows and 5 columns). In the embodiment, considering the width of the short side direction of the vessel 156, four exposure heads 166 are arranged in the third row. When the specific exposure head arranged in mth row and nth column is shown, it is indicated as the exposure head $166_{mn}$.

An exposure area 168 generated with the exposure head 166 is a rectangle whose short side is the sub-scanning direction. Accordingly, when the scanner 162 is moved, a band-shaped region which has been exposed (sintered region) 170 is formed in each exposure head 166 on the surface of a powder 152. When the exposure area which is generated with the specific exposure head arranged in mth row and nth column is shown, it is indicated as the exposure area $168_{mn}$.

The construction, operation, and modification of each of exposure heads $166_{11}$ to $166_{mn}$ are the same as those of the first embodiment. However, the laser having the oscillating wavelength except 405 nm in the wave range from 350 to 450 nm can be also used as the GaN laser diodes LD1 to LD7. The laser beam of the wavelength ranging from 350 to 450 nm has large light absorption efficiency and is easy to be converted into sintering energy, so that the sintering of the powder, i.e., the shaping can be performed at high speed. It is more preferable that the wave range of the laser beam ranges from 350 to 420 nm. The wavelength of 405 nm is particularly preferable in view of usage of the low-cost GaN laser diode.

Similarly to the first embodiment, 600 sets of the micro-mirror column, in which the 800 pieces of the micro-mirror are arranged in the main scanning direction, are arranged in the sub-scanning direction in DMD 50, however, the control is performed so that only a part of the micro-mirror columns (for example, 800 pieces×100 columns) are driven with the controller.

In the rapid prototyping apparatus, the image data according to the exposure pattern of one layer is inputted to the controller (not shown) which is connected to DMD 50, and temporarily stored in the frame memory in the controller. The image data is the data in which the density of each pixel constituting the image is indicated by the binary value (presence or absence of the recording of the dot).

The scanner 162 is moved at constant velocity from the upstream side to the downstream side along the guide 158 with the driving device which is not shown. When the movement of the scanner 162 is started, the plural lines of the image data, which is stored in the frame memory, is sequentially read, and the control signal is generated in each exposure head 166 on the basis of the image data read with the data processing portion. Each of the micro-mirrors of DMD 50 is on-off controlled in each exposure head 166 on the basis of the generated control signal with the mirror driving control portion.

When the laser beam is irradiated from the fiber array light source 66 to DMD 50, the laser beam, which is reflected in the case that the micro-mirror of DMD 50 is on-state, is focused on the surface (exposed surface) 56 of the powder 150 with the lens systems 54 and 58. In such way, the laser beam emitted from the fiber array light source 66 is turned on and off in each pixel and the powder 150 is exposed in the almost same pixel unit (exposure area 168) as the number of using pixels of DMD 50. The surface of the powder 150 is sub-scanned by moving the scanner 162 at constant speed, and the band-shaped exposed region 170 is formed in each exposure head 166.

When the sintering of one layer is completed with one time sub-scanning of the scanner 162, the scanner is returned to the home position located on the most upstreamn side along the guide 158 with the driving device which is not shown. When the stage 152 is descended by the predetermined quantity with the driving mechanism which is not shown, the powder 150 which is lacked is supplied from the supplying portion 155 with the stage 152 and the surface of the powder 150 is evened with the reverse rotating roller 157. When the image data of the next layer is inputted to the controller which is connected to DMD 50 and not shown, the sub-scanning of the scanner 162 is performed again. Thus, the three-dimensional model is formed in such a manner that the exposure (sintering) performed by the sub-scanning and the descent of the stage are repeated and the sintered layer is stacked.

As described above, the stacking rapid prototyping apparatus of the embodiment includes DMD in which 600 sets of the micro-mirror column, in which the 800 pieces of the micro-mirror are arranged in the main scanning direction, are arranged in the scanning direction, however, since the control is performed so that only a part of the micro-mirror columns are driven with the controller, the modulating speed per one line is increased compared with the case that all the micro-mirror columns are driven. Consequently, the exposure and the shaping can be performed at high speed.

The fiber array light source having the high brightness, in which the outgoing end portions of the optic fiber of the incorporated laser light source are arranged in the shape of the array, is used as the light source irradiating DMD, so that the exposure apparatus having the high output, the deep focal depth, and high light density output can be obtained. Consequently, the fine shaping can be performed at high speed. Furthermore, the number of fiber light sources necessary for obtaining the desired output is decreased by enlarging the output of each fiber light source, so that cost-reduction of the stacking rapid prototyping apparatus can be achieved.

Particularly, in the embodiment, since the clad diameter of the outgoing end of the optical fiber is smaller than that of the incident end, the diameter of the light-emitting portion becomes smaller, so that the high brightness of the fiber array light source is achieved. Consequently, the fine shaping can be realized.

Similarly to the second embodiment, the exposure may be performed with the pulse-driven laser beam, and the exposure may be performed while the same sintered layer is divided into plural times.

[Fourth Embodiment]

A fourth embodiment is one which manufactures the microchip for synthetic reaction, in which the micro channel is formed, by using the exposure apparatus according to the first embodiment (Microchip for Synthetic Reaction)

Figure 37:
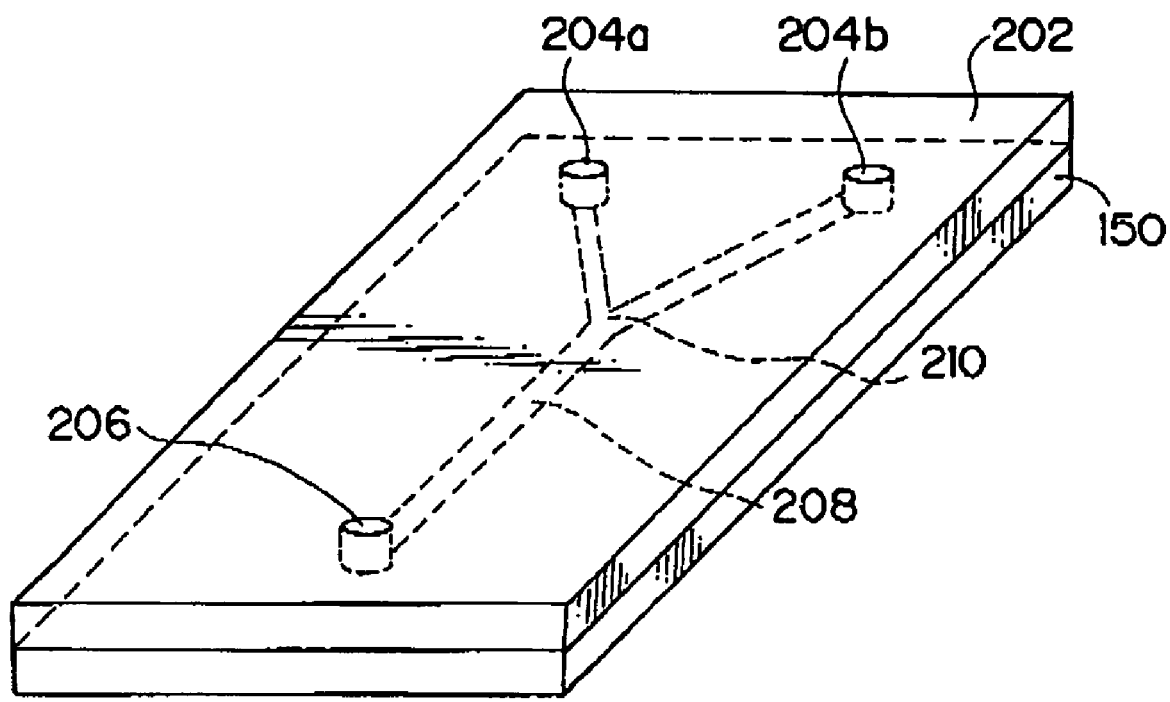
FIG. 37 is a perspective view showing the construction of a microchip for synthetic reaction.

As shown in FIG. 37, the microchip for synthetic reaction is formed in a manner that superimposes a protecting substrate 202 on the plate-shaped substrate 150 made of glass or the like. A thickness of the substrate 150 is usually in the range from about 0.5 mm to about 2.0 mm, the thickness of the protecting substrate 202 is usually in the range from about 0.1 mm to about 2.0 mm. In the protection substrate 202, inlets 204a and 204b for pouring a reagent and an outlet 206 for exhausting a reaction liquid obtained by the reaction of the reagents are provided so as to penetrate through the protecting substrate 202. A micro channel 208 in which the reagent or the reaction liquid flows is provided in the substrate 150. The micro channel 208 is arranged so that the reagents poured from each of the inlets 204a and 204b are merged at a confluence 210 and then exhausted to the outlet 206. A channel width of the micro channel is several tens to several hundreds $\mu$m, and it is particularly preferable that the channel width ranges from 10 $\mu$m to 50 $\mu$m. In the micro channel having the channel width ranging from 10 $\mu$m to 50 $\mu$m, channel resistance is relatively small and good size effect can be obtained.

When the reagents are poured into each of the inlets 204a and 204b of the microchip for synthetic reaction and absorption is performed fom the outlet 206 side, the reagents flow through the micro channel 208, and mix and react to each other at the confluence 210. This enables the desired material to be synthesized. The obtained reaction liquid flows through the micro channel 208, and the reaction liquid is exhausted from the outlet 206. Identification or determination of reaction product can be performed by analysis of the liquid obtained from the outlet 206.

(Manufacturing Method of the Microchip)

A manufacturing method of the microchip for synthetic reaction will be described below referring to FIG. 38. The manufacturing method includes an exposure process for exposing a photoresist film, a patterning process in which the photoresist film is partially removed and patterned, an etching process in which the substrate is etched to form the micro channel, and a bonding process for bonding the substrate in which the micro channel is formed and the protecting substrate. Each process is described below.

Figure 38A:
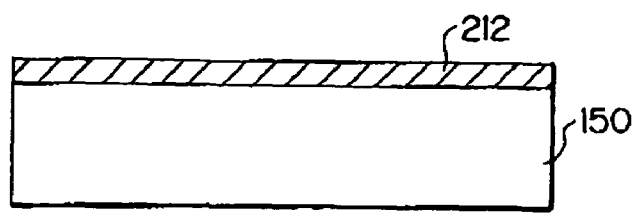
FIGS. 38A to 38G are sectional views showing sequentially a manufacturing process of the microchip for synthetic reaction shown in FIG. 37
Figure 38B:
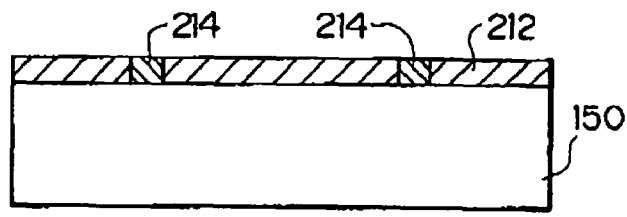
Figure 38C:
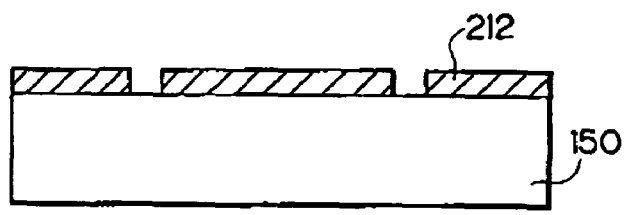

As shown in FIG. 38A, a photoresist film 212 is formed on the substrate 150 with a spin-coating method or the like, as shown in FIG. 38B, the photoresist film 212 is exposed by following the pattern of the micro channel 208, and then, as shown in FIG. 38C, an exposure portion 214 is dissolved in the developer and removed. At this point, the micro channel 208 can be formed in high accuracy by patterning the photoresist film 212 in high accuracy of position. The exposure process of the photoresist film 212 is described later.

Figure 38D:
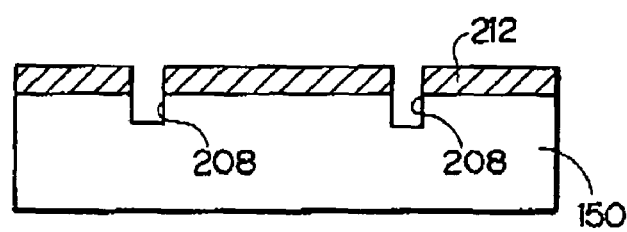
Figure 38E:
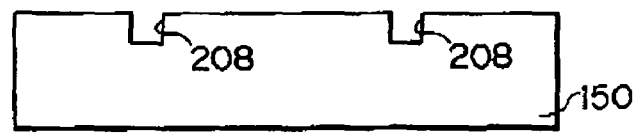

As shown in FIG. 38D, by using the photoresist film 212 which is patterned, the substrate 150 is etched from the surface to form the micro channel 208, as shown in FIG. 38E, the remaining photoresist film 212 is removed. Though the etching of the substrate 150can be performed with either dry etching or wet etching, because of the micromachining, it is preferable to adopt the dry etching such as fast atom beam (FAB) etching.

Figure 38F:
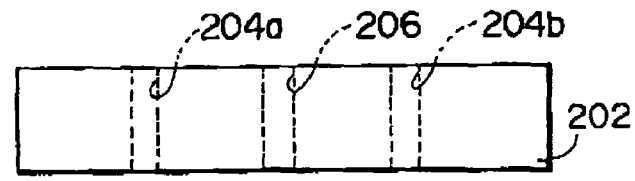
Figure 38G:
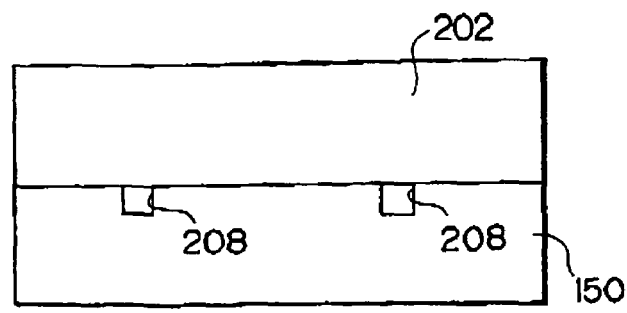

As shown in FIG. 38F, through holes which will be the inlets 204a and 204b and the outlet 206 are formed in the protecting substrate with ultrasonic machining or the like. As shown in FIG. 38G, the protecting substrate 202 and the substrate 150 are superimposed, bonded, and fixed so that the protecting substrate 202 and the surface of the substrate 150, in which the micro channel 208 is formed, are opposed each other. For example, a UV adhesive can be used for the bonding. The UV adhesive is applied to the surface of the protecting substrate 202 with the spin-coating method or the like, the substrate 150 and the protecting substrate 202 are bonded, and then adhesion is performed by irradiating an ultraviolet ray.

When the substrate 150 and the protecting substrate 202 are made of glass, the surfaces of both substrates may be dissolved with hydrofluoric acid and bonded.

(Exposure of the Photoresist Film)

The exposure process of the photoresist film will be described in detail below. In the exposure process, by using the spatial light modulator, the laser beam having the wavelength of 350 nm to 450 nm is modulated according to forming pattern data of the micro channel, and the photoresist film 212 is digitally exposed with the modulated laser beam. In order to perform the exposure in higher accuracy, it is preferable that the exposure is performed with the laser beam having the deep focal depth, which is emitted from the high bright light source.

The dry film resist (DFR) used in the manufacturing process of the printed wiring board (PWB) or an electro-deposition resist can be used as the photoresist film 212. In DFR or the electro-deposition resist, the film can be thickened compared with the resist used in the semiconductor manufacturing process, and the film having the thickness from 10 $\mu$m to 40 $\mu$m can be formed.

Figure 39A:
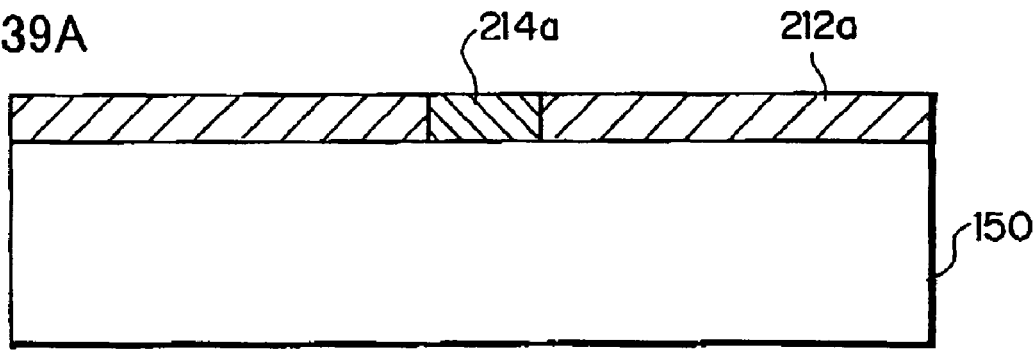
FIGS. 39A to 39C are sectional views showing an example of a thickening film of a resist film.
Figure 39B:
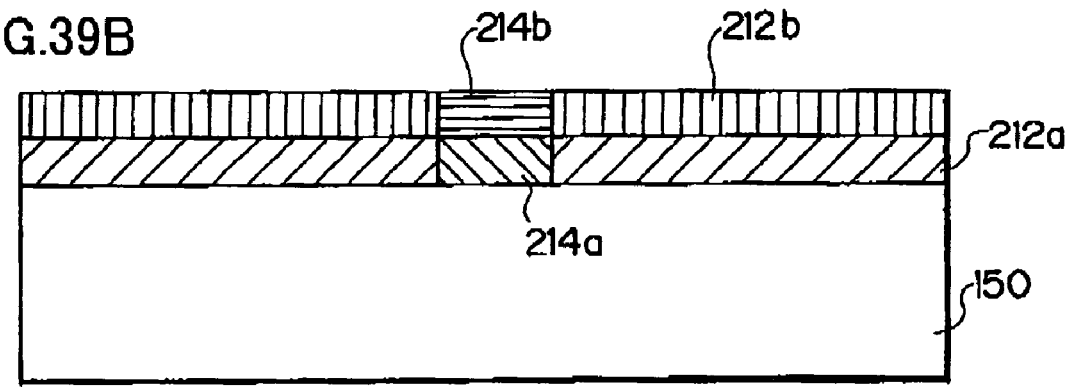
Figure 39C:
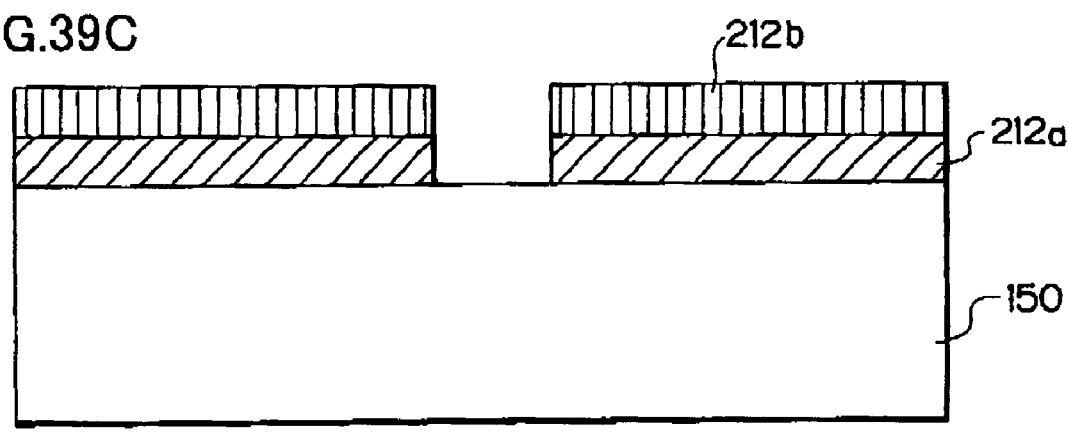

The film thickness can be further thickened by laminating the plural layers of the photoresist film. In this case, as shown in FIG. 39A, a first photoresist film 212a is formed and a predetermined region 214a is exposed, and then, as shown in FIG. 39B, a second photoresist film 212b is formed on the first photoresist film 212a and a region 214b corresponding to the predetermined region 214a is exposed by using a scaling function of the digital exposure. As shown in FIG. 39C, when the exposed regions 214a and 214b are removed, the deep channel generated by the resist is formed. Though the embodiment in which the two resist films are laminated was described, the deeper channel can be formed in such a manner that the resist films of three or four layers are laminated and the same position is exposed with the scaling function of the digital exposure.

Though the description in which the exposure is stacked at least two layers without performing development was made, exposure may be performed after the development such that the first layer is exposed, the development is performed, the elongation of the substrate or the swelling of the resist after the development is corrected with the digital scaling, and then the second layer is exposed. Consequently, a shift in the pattern positioning can be corrected with high accuracy.

Figure 40A:
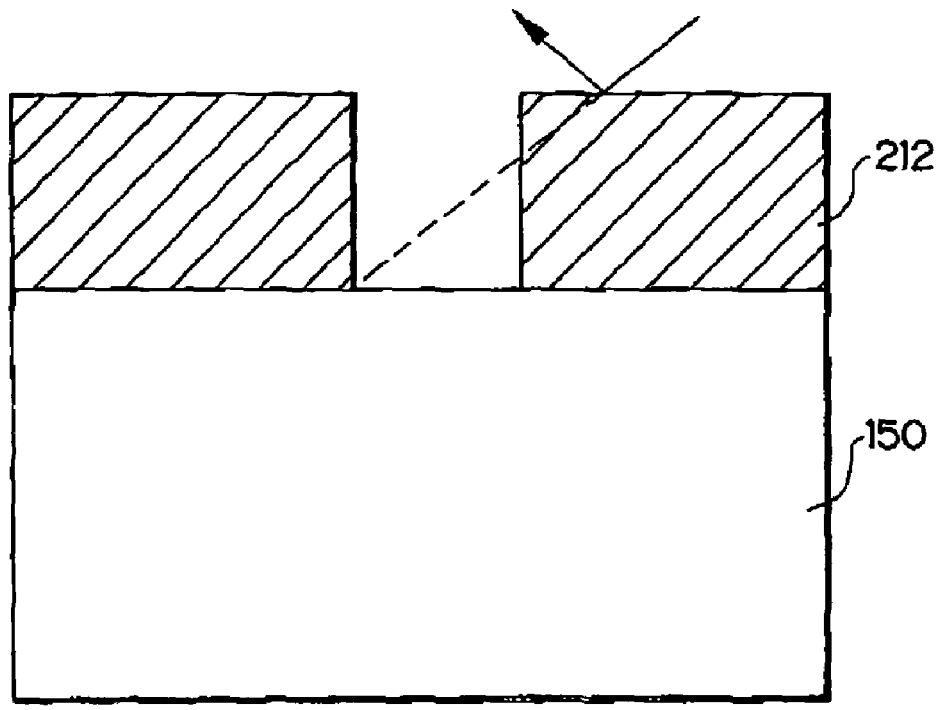
FIGS. 40A and 40B are explanatory views for illustrating that etching accuracy is improved with thickening resist film.
Figure 40B:
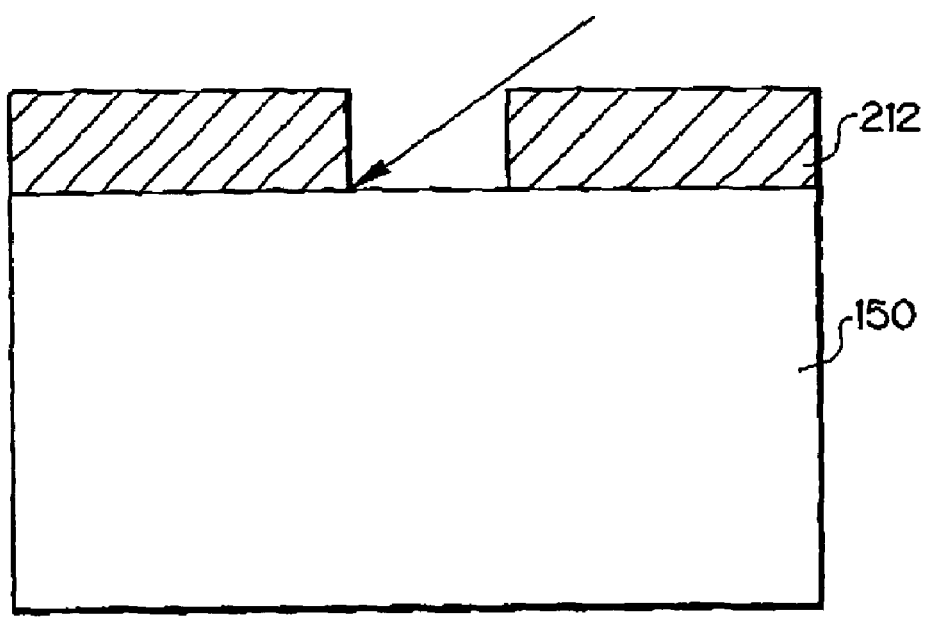

The deep channel generated by the resist can be formed by thickening the photoresist film 212, and the deep channel (micro channel) can be formed in the substrate 202 with good accuracy by etching. For example, as can be seen from FIGS. 40A and 40B, in the case that the micro channel of the same channel width is formed with the FAB etching, when the photoresist film 212 is thin, the substrate 150 is easily side-etched by the obliquely incident light. On the other hand, when the photoresist film 212 is thick, because of vignetting, it is difficult that the oblique light is incident to the substrate 150, and the substrate 150 is hardly side-etched. In order to perform easily the dry-etching, the second and third layer patterns can be corrected digitally by using the position and the pattern width.

When the micro channel of the channel width ranging from 10 μm to 50 μm is formed, it is preferable that the thickness of the photoresist film 212 ranges from 10 μm to 50 μm, and it is more preferable that the thickness ranges from 10 μm to 100 μm.

Figure 41:
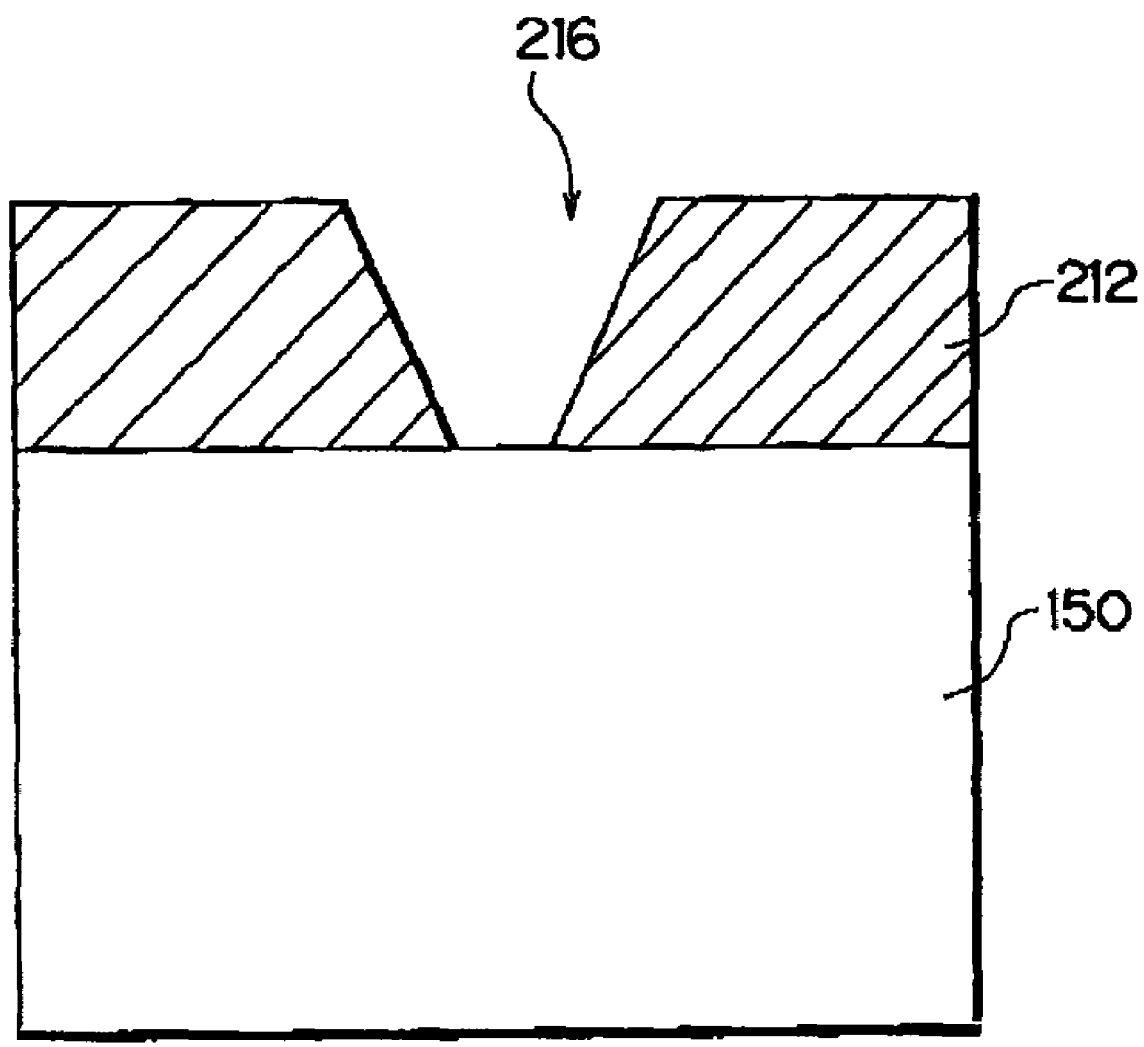
FIG. 41 is a sectional view showing the resist film patterned in the shape of a taper.

When the micro channel is formed with the wet etching using an etching solution, as shown in FIG. 41, the tapered aperture 216 whose sectional shape is extended upward may be patterned in the photoresist film 212. Since the tapered aperture has the upwardly extended shape in section, it is easy to permeate the etching solution.

(Formation of Micro Channel)

The image data according to an exposure pattern is inputted to the controller which is connected to DMD 50 and not shown, and temporarily stored in the frame memory in the controller. The image data is the data density of each pixel constituting the image is indicated by binary value (presence or absence of the recording of the dot).

The stage 152, in which the photosensitive material 150 is absorbed on the surface, is moved at constant speed from the upstream side of the gate 160 to the downstream side along the guide 158 with the driving device which is not shown. When the stage 152 passes below the gate 160, the leading end of the photosensitive material 150 is detected with the detecting sensor 164 attached to the gate 160, the plural lines of image data stored in the frame memory are sequentially read, and the control signal is generated in each exposure head 166 on the basis of the image data read with the data processing portion. Each of the micro-mirrors of DMD 50 is on-off controlled in each exposure head 166 on the basis of the generated control signal with the mirror driving control portion. That is to say, 600 sets of the micro-mirror column, in which the 800 pieces of the micro-mirror are arranged in the main scanning direction, are arranged in the sub-scanning direction in DMD 50, and all the micro-mirror columns are used in the embodiment.

When the laser beam is irradiated from the fiber array light source 66 to DMD 50, the laser beam, which is reflected in the case that the micro-mirror of the DMD 50 is on-state, is focused on the exposed surface 56 of the photoresist film, which is formed on the substrate 150, with the lens systems 54 and 58. In such way, the laser beam emitted from the fiber array light source 66 is turned on and off in each pixel and the photoresist film is exposed in the almost same pixel unit (exposure area 168) as the number of using pixels of DMD 50. The photoresist film formed on the substrate 150 is sub-scanned in the direction reverse to the stage moving direction with the scanner 162 in such a manner that the substrate 150 is moved with the stage 152 at constant speed, and the band-shaped exposed region 170 is formed in each exposure head 166.

When the sub scanning of the substrate 150 with the scanner 162 is finished and the rear end of the photosensitive material 150 is detected with the detecting sensor 164, the stage 152 is returned to a home position located on the upstream side of the gate 160 along the guide 158 with the driving device which is not shown, and then moved again from the upstream side to down stream side of the gate 160 along the guide 158 at constant speed.

As described above, in the embodiment, since the spatial light modulator such as DMD is used in the exposure process of the photoresist film, the laser beam can be modulated in each pixel according to the forming pattern of the micro channel, and the photoresist film can be finely exposed at high speed with the modulated laser beam. Thus, in the exposure process, the photoresist film having an arbitrary pattern can be finely exposed at high speed, so that the micro channel having the arbitrary pattern can be finely formed at high speed through the following patterning process and etching process.

Since the exposure can be performed in the arbitrary pattern, the micro channel having the complicated pattern can be easily formed. Also, since the exposure can be performed at high speed, the micro channel can be formed in short time on the glass substrate having the large area. Further, because of the digital exposure, it is not necessary to use a mask in each pattern and the micro channel can be formed at low cost.

Since DFR or the electro-deposition resist is used as the photoresist film, the film can be thickened compared with the resist used in the semiconductor manufacturing process, and the photoresist film having the thickness from 10 μm to 40 μm can be formed. Accordingly, the micro channel having the deep channel can be formed with good accuracy by the etching in a manner that thickens the photoresist film.

The film thickness can be further thickened by laminating the plural layers of the photoresist film. In this case, the same position of the multilayered photoresist film can be exposed with the scaling function of the digital exposure.

In the embodiment, the fiber array light source is formed with the incorporated laser light source in the exposure apparatus and the clad diameter of the outgoing end of the optical fiber is smaller than that of the incident end, so that the diameter of the light-emitting portion becomes smaller and the high brightness of the fiber array light source is achieved. Consequently, the photoresist film can be exposed more finely with the laser beam having the deeper focal depth. For example, the exposure can be performed in the super-fine resolution such that the beam diameter is not more than 1 μm and the resolution is not more 0.1 μm, it is enough to form the micro channel having the channel width of 10 μm to 50 μm.

(Fast Driving Method)

600 sets of the micro-mirror column, in which the 800 pieces of the micro-mirror are arranged in the main scanning direction, are arranged in the sub-scanning direction in DMD 50, however, the control may be performed so that only a part of the micro-mirror columns (for example, 800 pieces×10 columns) are driven with the controller. There are limitations of the data processing speed of DMD and decision of modulating speed per one line is proportional to the number of the using pixels, so that the modulating speed per one line is increased by using the part of the micro-mirror columns. On the other hand, it is not necessary to use all the pixels in the sub-scanning direction in the case of the exposure method in which the exposure head is continuously moved relative to the exposure source.

(Other Manufacturing Method of the Microchip)

Though the embodiment in which the micro channel is directly formed in the substrate constituting the microchip was described, the microchip including the micro channel can be also manufactured in such a manner that a mold is produced by forming the micro channel in a substrate for producing a mold and stamping or glass molding is performed by using the mold.

(Microchip Including the Micro Channel)

Though the embodiment in which the microchip for synthetic reaction is manufactured was described, the forming method of the micro channel of the invention can be applied to the case in which other kind of microchip including the micro channel is manufactured.

A cancer diagnostics chip, a cell biochemistry chip, an environmental monitoring chip, a chromatographic chip, an electrophoretic chip, a protein chip, an immune analysis chip and the like may be cited as other kind of microchip. Though, in these chips, the forming pattern of the micro channel is different from others corresponding to the function of each chip, according to the forming method of the micro channel of the invention, the etching mask can be formed by the digital exposure according to the forming pattern of the micro channel, so that it is easy to correspond to wide variety of products. Also, it is easy to form the micro channel including the plural functions. In particular, since the patterning of the large area can be performed in the method, the yield is improved and the invention can be the low cost forming method of the micro channel.

The forming method of the micro channel of the invention is not limited to the micro channel of the lob-on chip, however, the forming method of the micro channel of the invention can be widely applied as the method for forming a micro groove on the substrate.

[Fifth Embodiment]

A fifth embodiment is the embodiment of the bleaching apparatus using the high-output and high-bright fiber array light source, like the exposure apparatus according to the first embodiment.

(Construction of the Bleaching Apparatus)

Figure 42:
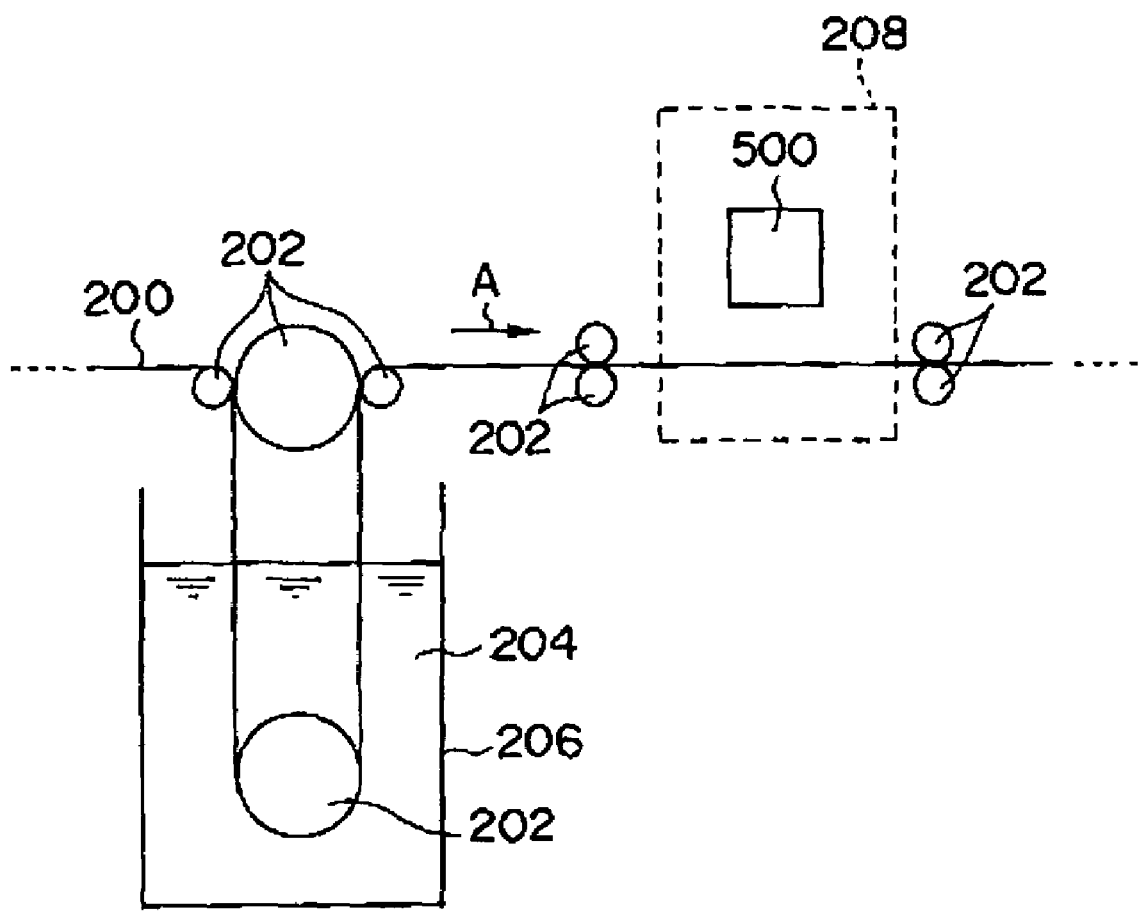
FIG. 42 is a schematic construction of a bleaching apparatus according to a fifth embodiment.
Figure 43:
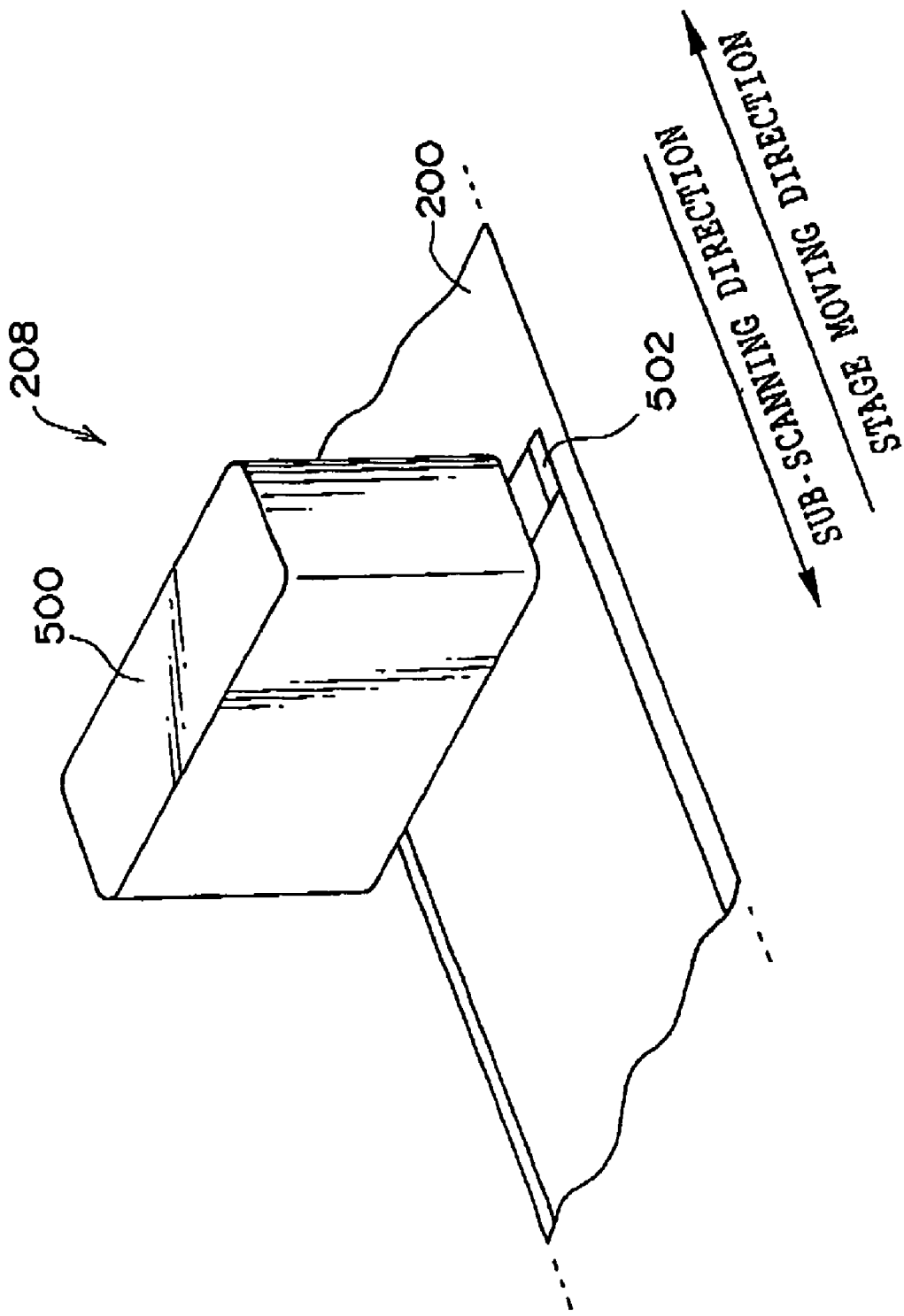
FIG. 43 is a perspective view showing the construction of a laser irradiating portion in the bleaching apparatus.

As shown in FIG. 42, the bleaching apparatus according to the embodiment of the invention includes plural carrying rollers 202 which carry continuous cloth 200 along a given carrying path. The bleaching apparatus also includes a chemical solution tank 206 in which a chemical solution 204 containing an oxidizing agent or a reducing agent is reserved, a laser irradiating portion 208 is provided on the downstream side in the carrying direction of the chemical solution tank 206. In the irradiating portion 208, as shown in FIG. 43, the irradiating head 500 which pulse-irradiates the cloth 200 with the laser beam is arranged above the cloth 200 placed on the carrying path.

Figures 44A, 44B:
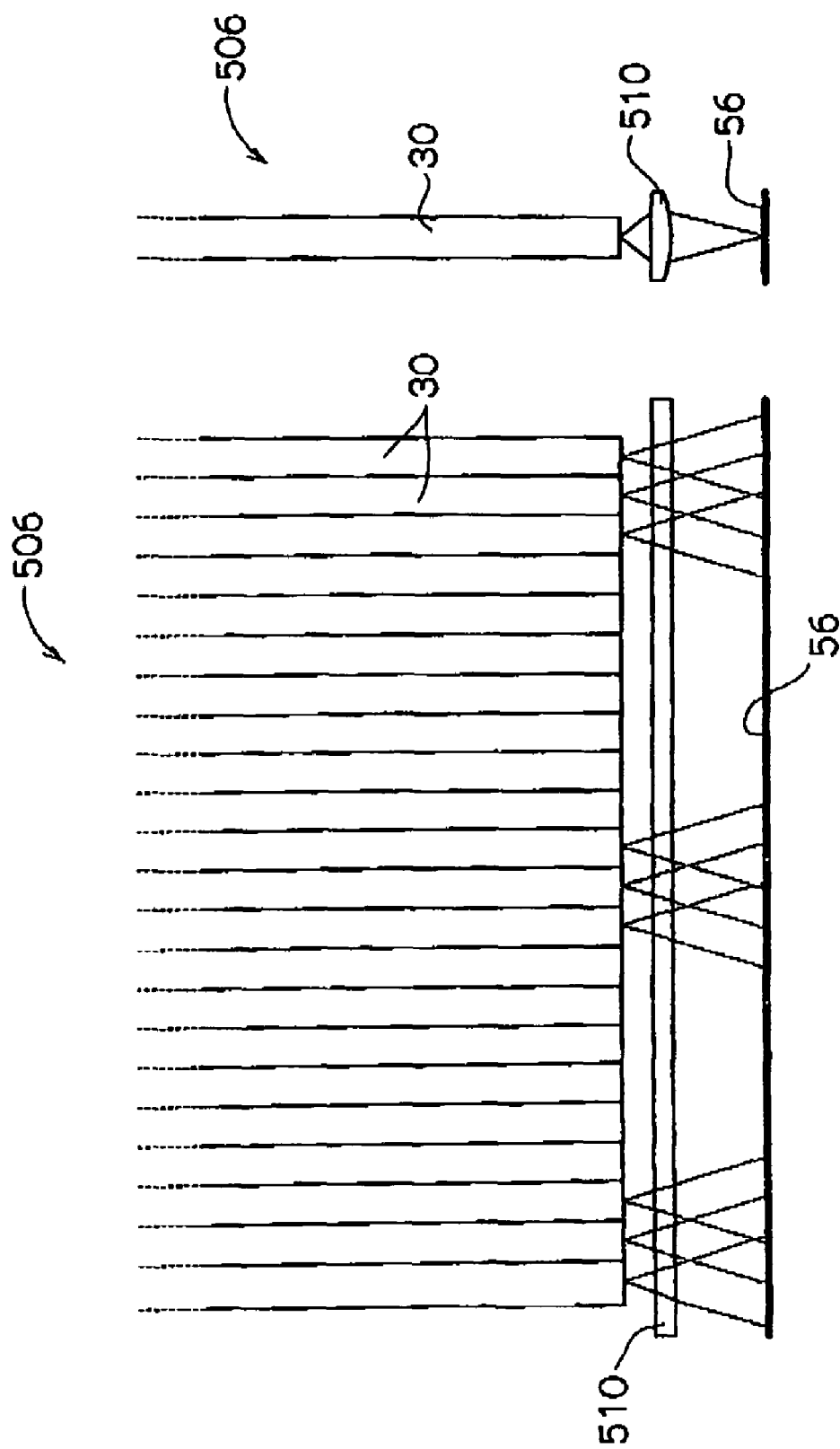
FIG. 44A is a sectional view in a fiber aray direction along the optical axis, which shows the construction of an irradiating head.
FIG. 44B is a sectional view in the sub-scanning direction, which shows the construction of the irradiating head.

As shown in FIGS. 44A and 44B, the irradiating head 500 includes a fiber array light source 506, in which many optical fibers 30 (for example, 1000 fibers) are arranged in one line along the direction crossed at right angles with the sub-scanning direction, and a cylindrical lens 510 which condenses the laser beam emitted from the fiber array light source 506 only in the direction crossed at right angles with the array direction of the outgoing ends of the optical fibers 30 and focuses the laser beam on a surface (scanning surface) 56 of the cloth 200. A module portion of the fiber array light source 506, to which the incident end of the optical fiber 30 is connected, is omitted in FIG. 40.

The cylindrical lens 510 has the curvature in a predetermined direction and long shape in the direction crossed at right angles with the predetermined direction. The cylindrical lens 510 is arranged so that the lengthwise direction (the direction crossed at right angles with the predetermined direction) of the cylindrical lens 510 is parallel to the array direction of the outgoing ends of the optical fibers 30. The irradiating optical system for uniformity using the fry-eye lens system, or the optical system for correcting light intensity distribution including the function, in which the light flux is widened in the portion near the optical axis and the light flux is narrowed in the portion far away from the optical axis for the array direction of the laser outgoing end and the light is only passed through for the direction crossed at right angles with the array direction, may be used with the cylindrical lens 510.

As shown in FIG. 29, the fiber array light source 506 includes many laser modules 64, and one end of the multimode optical fiber 30 is coupled to each laser module 64. The construction, operation, and modification of each laser module 64 are the same as those of the first embodiment. In each laser module 64, the coupling efficiency of the laser beams B1 to B7 to the multimode optical fiber 30 is 0.85, when each output of the GaN Lser diodes LD1 to LD7 is 30 mW, the incorporated laser beam B having the output of 180 mW (=30 mW×0.85×7) can be obtained for each optical fiber 31 arranged in the shape of the array.

In the incorporated laser light beam, the laser beam having the given pulse width can be obtained by pulse-driving each of the GaN laser diodes LD1 to LD7. The pulse irradiation of the laser beam suppresses the heat generation, and the damage of the fiber (damage to the cloth), which is caused by the heat, is prevented.

It is preferable that each of peak power ranges from 300 mW to 3 W. When the peak power is 300 mW, the pulse width ranges from 10 nsec to 10 μsec, it is preferable that the number of pulses ranges from $10^4$ to $10^7$. In this case, duty is about 10%. When the peak power is 3 W, the pulse width ranges from 1 nsec to 1 μsec, it is preferable that the number of pulses ranges from $10^4$ to $10^7$. In this case, duty is about 1.0%.

As described above, the break of the light-outgoing end face, which is called as COD (Catastrophic Optical Damage), hardly occurs in the GaN laser diode, the GaN laser diode has high reliability, and the high peak power can be realized.

(Operation of the Bleaching Apparatus)

The operation of the above-described bleaching apparatus will be described below.

When the cloth 200 which has experienced a refining process removing impurities such as oil content deposited to the fiber and a desizing process removing fabric size is supplied to the bleaching apparatus, the cloth 200 is carried in toward the direction of an arrow A with rotating carrying roller 202, and dipped into the chemical solution 204 in the chemical solution tank 206. It is preferable that dipping time ranges from 0.1 to 1 hour.

The chemical solution 204 contains the oxidizing agent or the reducing agent. Peroxide such as hydrogen peroxide ($H_2O_2$), sodium perborate ($NaBO_3.4H_2O$), and potassium permanganate ($KMnO_4$), or chlorine compound such as a bleaching powder (CaCl.ClO), sodium hypochlorite (NaClO), and sodium chlorite ($Na_2ClO_2$) can be used as the oxidizing agent. Hydrosulfite (Na2S2O4), sodium tetrahydroborate (NaBH4) or the like can be used as the reducing agent. In these chemicals, the tetrahydroborate which has weak oxidation-reduction action is particularly preferable in view of suppression of the damage of the fiber.

Water or lower alcohol such as ethanol and methanol can be used as a solvent. It is preferable that concentration of the oxidizing agent or the reducing agent ranges from 1% to 10%. An activator for activating the oxidizing agent and the reducing agent may be appropriately added to the chemical solution 204.

Then, the cloth 200 taken out from the chemical solution tank 206 is supplied to the laser irradiating portion 208 while the chemical solution 204 is impregnated. In the laser irradiating portion 208, the laser beam emitted from the fiber array light source 506 of the irradiating head 500 is condensed only in the direction crossed at right angles with the array direction of the outgoing ends of the optical fibers 30 with the cylindrical lens 510, and focused on the surface 56 of the cloth 200 in the shape of the line. The cyclindrical lens 510 functions as a magnifying optical system which magnifies the beam diameter, e.g., the magnification of three times in the short axial direction and one time in the long axial direction. The cloth 200 is carried at constant speed, and sub-scanned in the direction reverse to the carrying direction with a line beam 502 from the irradiating head 500.

By irradiating the cloth in which the chemical solution is impregnated with the laser beam, color content deposited to the fiber and the oxidizing agent or the reducing agent in the chemical solution 204 are activated, reactivity between the color content and the agent is increased, and the good bleaching effect can be obtained. In order to prevent the damage of the fiber, which is caused by the heat, and obtain activation effect, the wavelength of the irradiating laser beam ranges from 350 nm to 450 nm, it is more preferable that the wavelength ranges from 400 nm to 415 nm. On the other hand, when the reactivity of the oxidizing agent or the reducing agent is high, it is preferable that the wavelength is not lower than 400 nm. In the wavelength of not lower than 400 nm, load to the optical system is small and it is easy to increase the output of the laser diode.

Light density on the surface of the cloth 200 is calculated. In the incorporated laser light source of the irradiating head, when each output of the GaN laser diodes LD1 to LD7 is 30 mW, the incorporated laser beam B having the output of 180 mW can be obtained for each of the optical fibers 30 which are arranged in the shape of the array. Accordingly, in the case of the fiber array light source in which 1000 multimode optical fibers 30 are arranged in one line, the output is about 180 W in the continuous operation at the laser outgoing portion 68.

In the laser outgoing portion 68 of the fiber array light source 506, high-bright light-emitting points are arranged in one line along the main scanning direction. Since the fiber light source in the related art, in which the laser beam from the single laser diode is coupled to one optical fiber, is low output, the desired output can not be obtained unless many columns of the fiber light source are arranged, however, since the incorporated laser light source used in the embodiment is high output, few columns, e.g., even only one column can obtain the desired output.

When the step index type of optical fiber, in which the clad diameter is 125 $\mu$m, the core diameter is 50 $\mu$m, and NA is 0.2, is used as the multimode optical fiber 30, the beam diameter of the laser outgoing portion is 50 $\mu$m×125 $\mu$m. When the beam diameter is magnified three times in the short axial direction and one time in the long axial direction, the area of the irradiating area 506 becomes 150 $\mu$m×125 $\mu$m.

In the bleaching adopting the laser assist, generally it is necessary that the high light density ranges from 2000 mJ/cm$^2$ to 20000 mJ/cm$^2$, however, in the embodiment, the light density of the range can be easily realized by changing appropriately the number of fibers which are arrayed and the number of incorporated laser beams. Assuming that the light density on the exposure surface, which is required for the bleaching, is 10000 mJ/cm$^2$, when the pulse irradiation is performed on conditions that the peak power of the GaN laser diodes LD1 to LD7 is 3 W, the pulse width is 100 nsec, the pulse number per second is 105, and the duty is 1%, the light density per pulse on the exposure surface is 10 mJ/cm$^2$, the exposure can be performed as fast as 1.4 cm/s.

On the other hand, when the excimer laser is used instead of the incorporated laser light source of the GaN laser diode, since the repeating frequency is decreased, more than about ten times so is required for the exposure of the same area.

As described above, in the bleaching apparatus of the embodiment, by using the fiber array light source in which the incorporated laser light source having the high output and the high brightness are arrayed, the cloth impregnated with the chemical solution is pulse-irradiated with the laser beam, the high energy density can be obtained on the surface of the cloth. Consequently, at least one of the chemical solution and the color content is activated, the bleaching reacion is promoted, and high bleaching effect can be obtained. The duty of the laser pulse is 1%, so that the heat generation can be suppressed and the damage of the fiber can be prevented.

In the bleaching apparatus of the embodiment, since the incorporated laser light source is used for the laser irradiating portion, compared with the bleaching apparatus using the excimer laser, the bleaching apparatus of the embodiment can be pulse-driven in arbitrary repeating frequency and pulse width, the bleaching can be performed as fast as several times by setting the repeating frequency at a high value. Compared with the bleaching apparatus using the excimer laser, the energy efficiency is as high as 10% to 20%, the maintenance is easy, and it is low cost.

In particular, since the GaN laser diode is covalent bond, the breakage of the light-outgoing end face, which is called as COD (Catastrophic Optical Damage), hardly occurs in the GaN laser diode, the GaN laser diode has high reliability, and the high peak power can be realized. For example, the high peak power of 3 W can be realized on conditions that the pulse width is 100 nsec and the duty is 1%. In this case, the average output is 30 mW.

In the bleaching apparatus of the embodiment, the line beam can be easily obtained by arraying the optical fibers of the fiber array light source. Since fiber products are usually formed in the shape of the continuous sheet, it is rational that the laser irradiation is performed with the line beam which is focused in the short axial direction and expanded in the long axial direction. The line beam length can be extended by increasing the number of optical fibers which are arrayed, while energy strength and uniformity are maintained. Further, since the laser beam having the wavelength of 350 to 450 nm is used, it is not necessary to generate the line beam with the optical system using a special material for the ultraviolet ray, and it is low-cost.

(Multi-head)

Though the embodiment which is provided with the laser irradiating portion including the single irradiating head was described, when the length in the long axial direction of the line beam is short, the plural irradiating heads may be arranged in the long axial direction.

(Laser Diode)

Though the embodiment in which the GaN laser diode having the oscillating wavelength of 350 nm to 450 nm, in which the increase in the output is expected in near future, is used as the laser diode was described, the laser diode is not limited to the GaN laser diode. For example, a nitride laser diode containing III-group element such as Al, Ga, and In and nitrogen can be used. The nitride laser diode may include any composition expressed by $Al_xGa_yIn_{1-x-y}N$ (x+y=<1). The laser diode having the oscillating wavelength of 200 nm to 450 nm can be obtained by changing the composition.

(Other Embodiment of the Magnifying Optical System)

As shown in FIGS. 45A and 45B, the irradiating head 500 may include the fiber array light source 506, in which many optical fibers 30 (for example, 1000 fibers) are arranged in one line along the direction crossed at right angles with the sub-scanning direction, a first cylindrical lens 512 which condenses the laser beam emitted from the fiber array light source 506 only in the direction crossed at right angles with the array direction of the outgoing ends of the optical fibers 30, and a second cylindrical lens 514 which condenses the laser beam condensed in the direction crossed at right angles with the array direction of the outgoing ends of the optical fibers 30 only in the array direction and focuses the laser beam on the surface (scanning surface) 56 of the cloth 200.

The first cylindrical lens 512 has the curvature in a predetermined direction and long shape in the direction crossed at right angles with the predetermined direction. The first cylindrical lens 512 is arranged so that the lengthwise direction (the direction crossed at right angles with the predetermined direction) of the first cylindrical lens 512 is parallel to the array direction of the outgoing ends of the optical fibers 30. The second cylindrical lens 514 has the curvature in the predetermined direction and long shape in the predetermined direction. The cylindrical lens 510 is arranged so that the curvature direction (the predetermined direction) of the second cylindrical lens 514 is parallel to the array direction of the outgoing ends of the optical fibers 30.

In the irradiating head, the laser beam emitted from the fiber array light source 506 is condensed in the direction crossed at right angles with the array direction of the outgoing ends of the optical fibers 30 by the first cylindrical lens 512, condensed in the array direction of the outgoing ends of the optical fibers 30, and focused on the scanning surface 56 in the shape of the line.

For example, the cylindrical lenses 512 and 514 function as the magnifying optical system which magnifies the beam diameter three times in the short axial direction and ten times in the log axial direction. In FIG. 42, the cloth 200 is carried at constant speed, and sub-scanned in the direction reverse to the carrying direction with the line beam from the irradiating head 500. Thus, the wide exposure surface can be exposed in such a manner that the beam of the fiber array light source is magnified with the optical system. Also, by magnifying the beam, the deeper focal depth can be obtained and the cloth carried at high speed can be irradiated uniformly.

The light density on the surface is calculated here. When the multimode laser whose peak power is 6 W is used for the incorporated laser light source of the irradiating head, the incorporated laser beam B whose peak power is 36 W can be obtained with the seven laser diodes. Accordingly, in the case of the fiber array light source in which 1000 multimode optical fibers 30 are arranged in one line, the peak power is about 36 kW at the laser outgoing portion 68.

When the step index type of optical fiber, in which the clad diameter is 125 $\mu$m, the core diameter is 50 $\mu$m, and NA is 0.2, is used as the multimode optical fiber 30, the beam diameter of the laser outgoing portion is 50 $\mu$m×125 $\mu$m. When the beam diameter is magnified three times in the short axial direction and ten times in the long axial direction, the area of the irradiating area 506 becomes 150 $\mu$m×1250 $\mu$m. When the pulse irradiation is performed on conditions that the peak power is 6 W, the pulse width is 100 nsec, the duty is 1%, and the pulse number per second is 105, the light density per pulse on the exposure surface is 2 mJ/cm$^2$. Estimating that the loss in the optical system is about 80%, the light density per pulse on the exposure surface is 1.5 mJ/cm$^2$. Accordingly, when the exposure is performed at the light density of 10000 mJ/cm$^2$, the exposure of the cloth having the width of 1.25 m can be performed as fast as 0.2 cm/s.

(Modification of Optical Fiber)

Though the embodiment in which the uniform optical fiber whose clad diameter is 125 $\mu$m is used as the incorporated laser light source was described, the clad diameter of the outgoing end of the optical fiber can be formed to be smaller than that of the incident end, like the first embodiment. The diameter of the light-emitting portion becomes smaller by decreasing the clad diameter of the outgoing end of the optical fiber, so that the high brightness of the fiber array light source is achieved.

(Modification of the Incorporated Laser Light Source)

In the incorporated laser light source utilizing the laser array having the multi-step construction, which is shown in FIGS. 24A and 24B, particularly the high output can be achieved by the multi-step arrangement of the multi-cavity laser and the array of the collimator lenses. Since the brighter fiber array light source or bundle fiber light source can be formed by using the incorporated laser light source, it is particularly preferable for the fiber light source constituting the laser light source of the irradiating head of the embodiment.

In this case, the light density on the surface is calculated. Assuming that the multi transverse mode chip is used as the incorporated laser light source of the irradiating head and peak power per one light-emitting point is 6 W, the incorporated laser beam whose peak power is 103 W can be obtained with the twenty laser diodes. Accordingly, in the case of the fiber array light source in which 1750 multimode optical fibers are arranged in one line, the peak power is about 180 kW at the laser outgoing portion.

When the same optical fiber is used as the multimode optical fiber, the beam diameter of the laser outgoing portion is 50 $\mu$m×220 $\mu$m. When the beam diameter is magnified three times in the short axial direction and ten times in the long axial direction, the area of the irradiating area 506 becomes 150 $\mu$m×2200 $\mu$m. When the pulse irradiation is performed on the surface of the cloth on conditions that the peak power is 6 W, the pulse width is 100 nsec, the duty is 1%, and the pulse number per second is 105, the light density per pulse on the exposure surface is 10 mJ/cm$^2$. Estimating that the loss in the optical system is about 80 W, the light density per pulse on the exposure surface is 8 mJ/cm$^2$. Accordingly, when the exposure is performed at the light density of 10000 mJ/cm$^2$, the exposure of the cloth having the width of 2.2 m can be performed as fast as 1.2 cm/s.

The invention claimed is:

1. A bleaching apparatus comprising:
    chemical solution impregnating means for impregnating fiber prior to dyeing, with a chemical solution containing an oxidizing agent or a reducing agent; and
    laser irradiating means which includes an incorporated laser light source including a plurality of semiconductor lasers, one optical fiber, and a condensing optical system which condenses the laser beams respectively emitted from the plurality of semiconductor lasers and couples the condensed beam at an incident end of the optical fiber, and which laser irradiating means pulse-irradiates cloth impregnated with the chemical solution with the laser beam which has a wavelength of 200 nm to 450 nm.

2. The bleaching apparatus of claim 1, wherein the laser irradiating means irradiates the laser beam which has a wavelength of 350 nm to 450 nm.

3. A bleaching apparatus comprising:
    chemical solution impregnating means for impregnating fiber prior to dyeing, with a chemical solution containing an oxidizing agent or a reducing agent; and
    laser irradiating means which includes an incorporated laser light source including a semiconductor laser having a plurality of light-emitting points, one optical fiber, and a condensing optical system which condenses laser beams respectively emitted from the plurality of light-emitting points of the semiconductor laser having the plurality of light-emitting points and couples the condensed beam at an incident end of the optical fiber, and which laser irradiating means pulse-irradiates cloth impregnated with the chemical solution with the laser beam which has a wavelength of 200 nm to 450 nm.

4. The bleaching apparatus of claim 3, wherein the laser irradiating means irradiates the laser beam which has a wavelength of 350 nm to 450 nm.

* * * * *